United States Patent
Ooishi et al.

[11] Patent Number: 6,166,990
[45] Date of Patent: Dec. 26, 2000

[54] CLOCK REPRODUCTION CIRCUIT THAT CAN REPRODUCE INTERNAL CLOCK SIGNAL CORRECTLY IN SYNCHRONIZATION WITH EXTERNAL CLOCK SIGNAL

[75] Inventors: Tsukasa Ooishi, Hyogo; Satoru Hanzawa, Tokyo; Kiyoshi Nakatsuka, Ibaraki, all of Japan

[73] Assignees: Mitsubishi Denki Kabushiki Kaisha; Hitachi, Ltd., both of Tokyo, Japan; Texas Instruments, Inc., Dallas, Tex.

[21] Appl. No.: 09/332,143

[22] Filed: Jun. 14, 1999

[30] Foreign Application Priority Data

Nov. 26, 1998 [JP] Japan .................. 10-336147

[51] Int. Cl.$^7$ .................................. G11C 8/00
[52] U.S. Cl. .................. 365/233; 365/226; 365/194
[58] Field of Search .................. 365/233, 226, 365/194; 326/93

[56] References Cited

U.S. PATENT DOCUMENTS 5,337,285  8/1994  Ware et al. ............................. 365/227
5,867,446  2/1999  Konishi et al. ......................... 365/233

*Primary Examiner*—Huan Hoang
*Attorney, Agent, or Firm*—Leydig, Voit & Mayer, Ltd.

[57] ABSTRACT

A frequency determination circuit generating a clock signal phase-locking with an external clock signal at a coarse precision and a fine adjust circuit generating an internal synchronizing signal phase-locking with the external clock signal at a fine precision are provided. The fine adjust circuit has a function of adjusting the phase of the frequency determination circuit when phase synchronization is to be carried out exceeding the adjust range thereof. The frequency determination circuit and the fine adjust circuit receive a clock power supply voltage. A clock reproduction circuit is provided which generates an internal clock signal phase-locking with an external clock signal or a reference clock signal stably even when the operating environment changes.

37 Claims, 48 Drawing Sheets

→ INTERNAL CLOCK
GENERATION START

F I G. 2 4
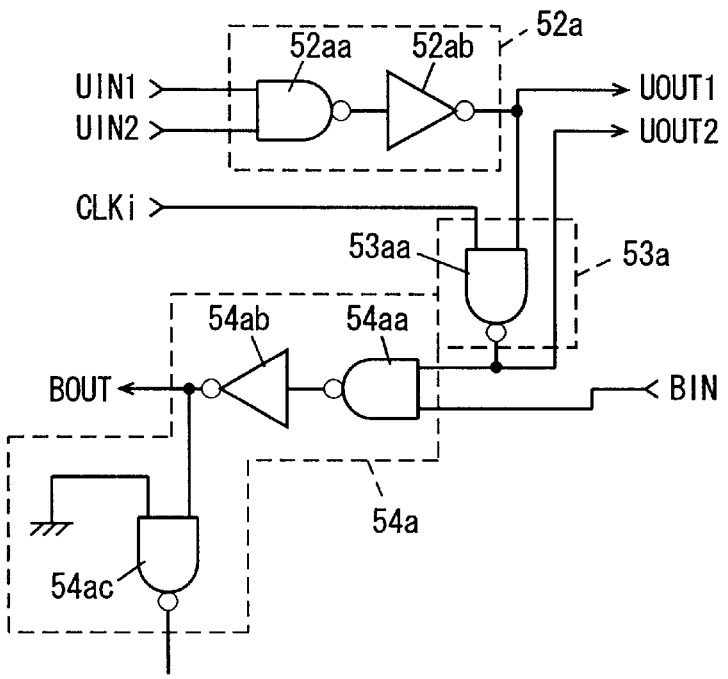
F I G. 2 5
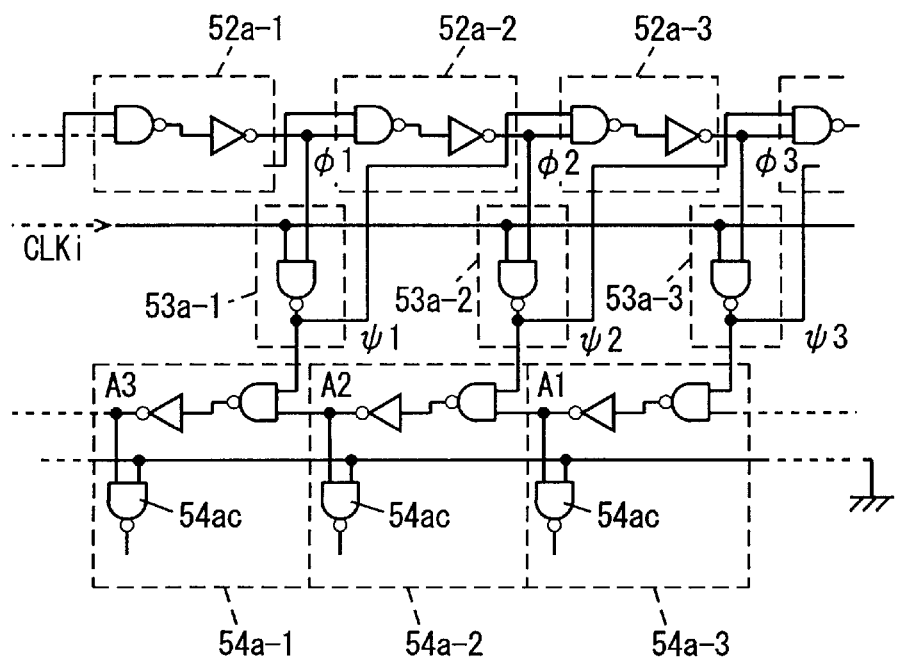

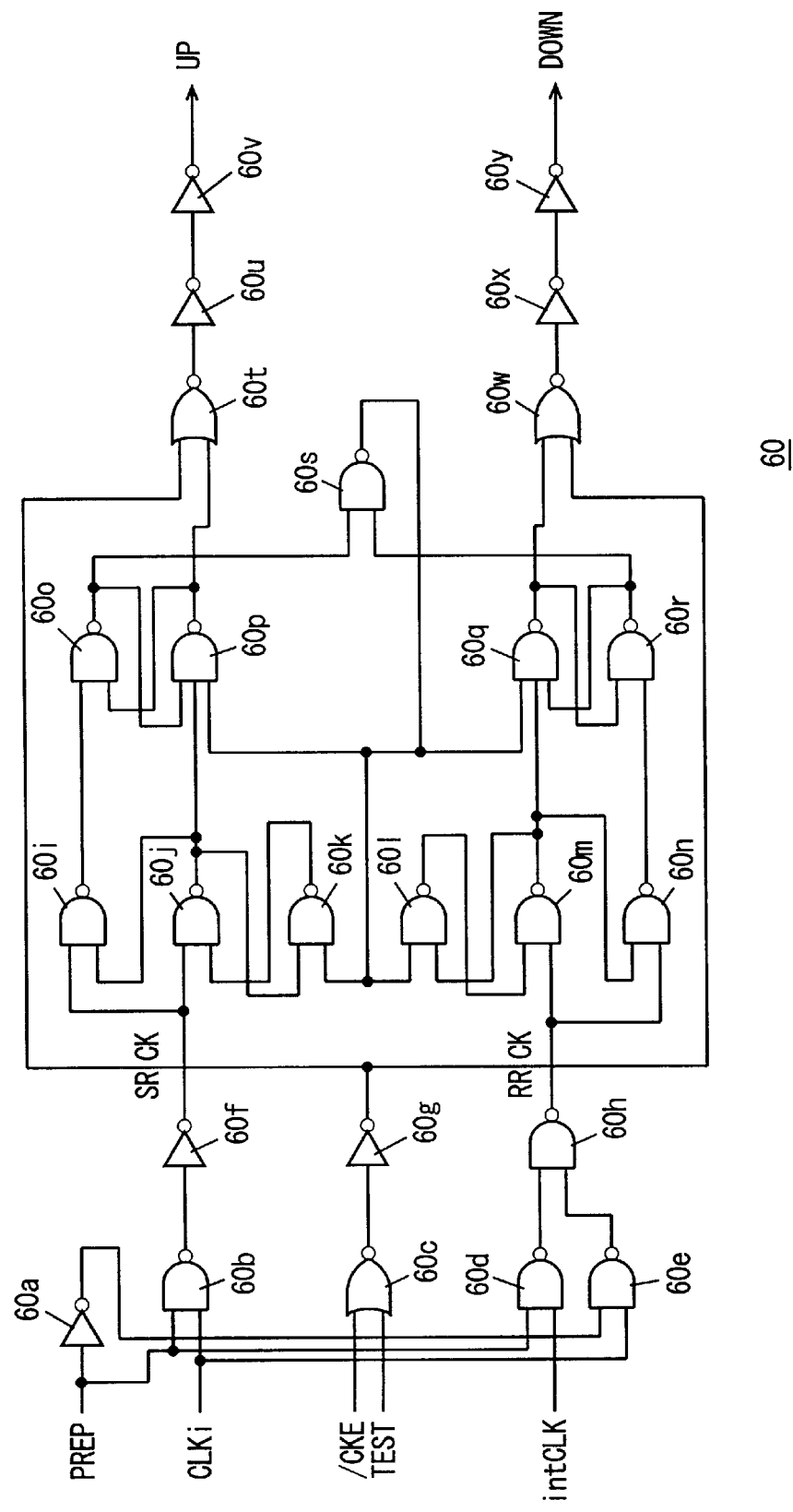
F I G. 2 8

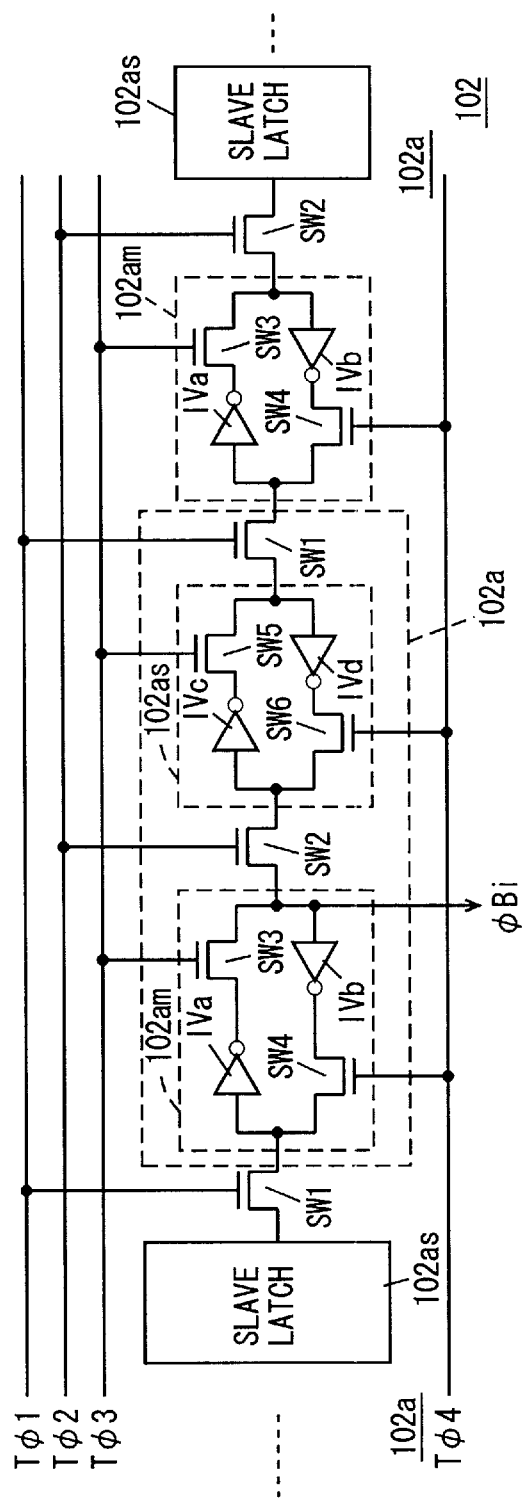
F I G. 4 5 A
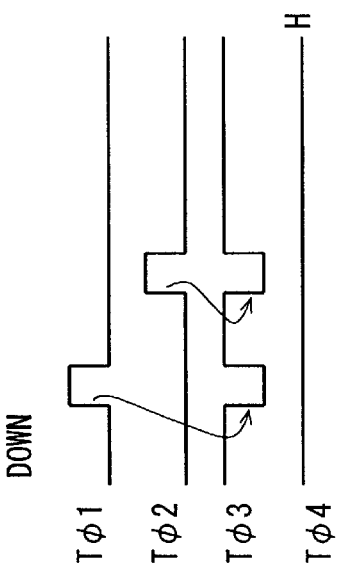
F I G. 4 5 C
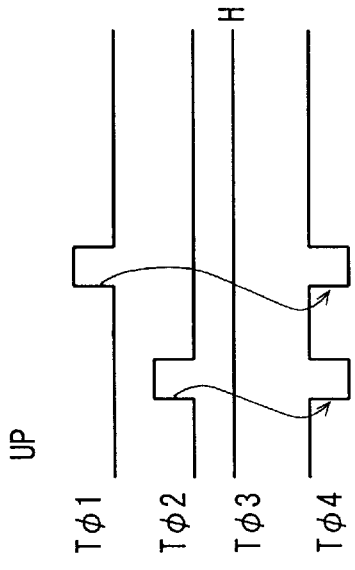
F I G. 4 5 B

130e

130f (EMPLOY STRUCTURE OF FIGS. 45-49 FOR FSR, CSR)

(REFER TO FIG. 59)

(REFER TO FIG. 60)

(REFER TO FIG. 60)

(REFER TO FIG. 60)

(REFER TO FIG. 59)

FIG. 76
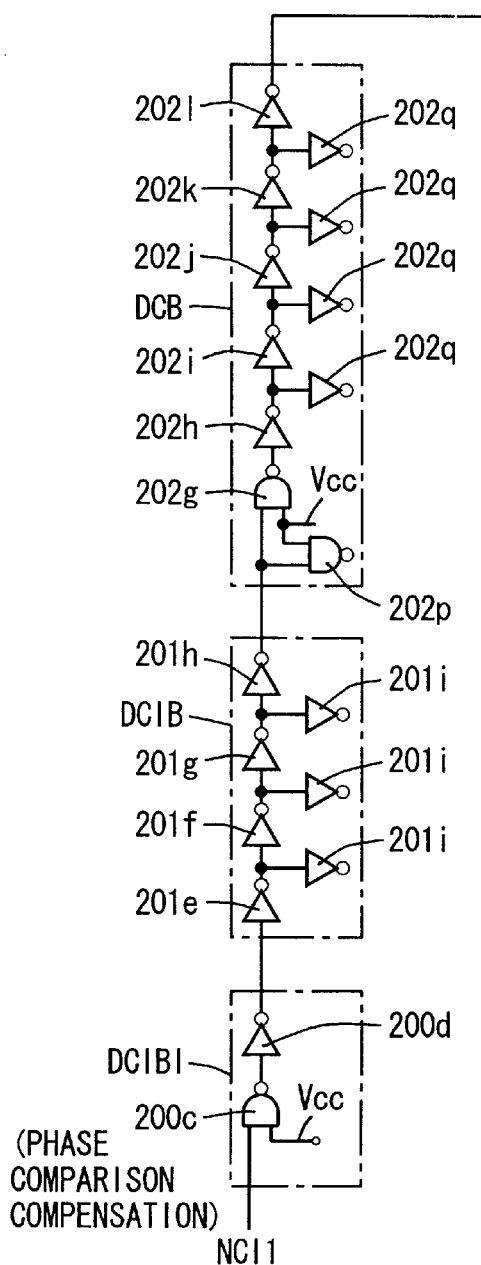
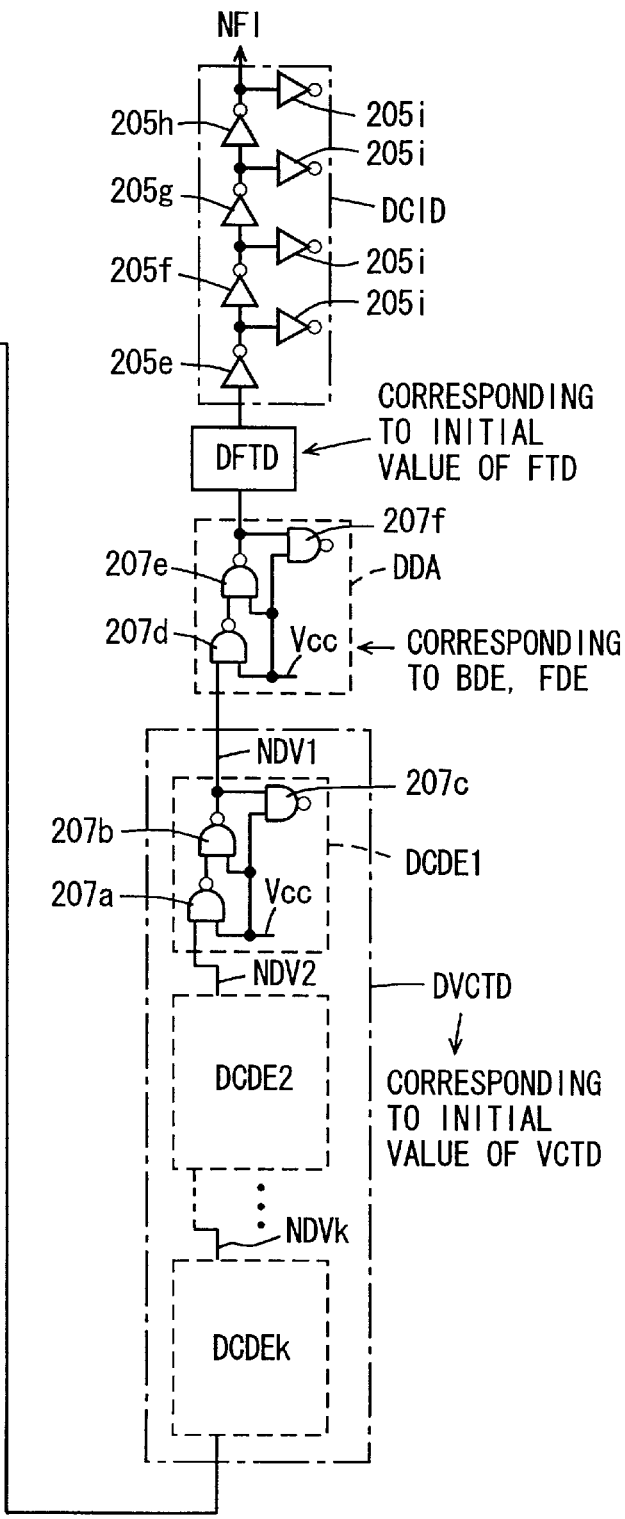

m OF CYCLE AND "m" OF OUTPUT SIGNAL QFm ARE
IRRELEVANT TO EACH OTHER

FIG. 79

| CLOCK CYCLE | NSL | NFA | QF0 | QF1 | ... | QF(m-1) | QFm | QB0 | QB1 | ... | QB(m-1) | QBm |
|---|---|---|---|---|---|---|---|---|---|---|---|---|
| ... | | | | | | | | | | | | |
| m-1 | L | O | L | L | ... | H | H | L | L | ... | H | L |
| m | L | L | L | L | ... | H | H | L | L | ... | L | H |
| m+1 | L | O | H | L | ... | H | H | H | L | ... | L | H |
| m+2 | L | L | H | L | ... | L | L | H | L | ... | L | L |
| m+3 | L | O | L | H | ... | L | L | H | L | ... | L | L |
| m+4 | L | L | L | H | ... | L | L | H | L | ... | L | L |
| m+5 | L | L | L | L | ... | L | L | L | L | ... | L | L |
| ... | | | | | | | | | | | | |
| n-1 | O | L | L | H | ... | L | L | L | L | ... | L | L |
| n | L | L | H | L | ... | L | H | L | L | ... | L | L |
| n+1 | O | L | H | L | ... | L | H | L | L | ... | L | L |
| n+2 | L | L | L | L | ... | L | H | L | L | ... | L | H |
| n+3 | O | L | L | L | ... | L | H | L | L | ... | H | H |
| n+4 | L | L | L | L | ... | L | H | L | L | ... | H | L |
| n+5 | L | L | L | L | ... | L | L | L | L | ... | L | L |
| ... | | | | | | | | | | | | |

O : ACTIVE ; CYCLE "m" AND SIGNAL "m" ARE IRRELEVANT TO EACH OTHER

| CYCLE CLOCK | NDWN | NUP | ... | SC(h-1) | SCh | SC(h+1) | ... |
|---|---|---|---|---|---|---|---|
| ⋮ | | | | | | | |
| m-1 | L | L | ... | L | H | L | ... |
| m | L | L | ... | L | H | L | ... |
| m+1 | L | ○ | ... | L | H | L | ... |
| m+2 | L | L | ... | L | L | H | ... |
| m+3 | L | L | ... | L | L | H | ... |
| m+4 | L | L | ... | L | L | H | ... |
| m+5 | L | L | ... | L | L | H | ... |
| ⋮ | | | | | | | |
| n-1 | L | L | ... | L | H | L | ... |
| n | L | L | ... | L | H | L | ... |
| n+1 | ○ | L | ... | L | H | L | ... |
| n+2 | L | L | ... | H | L | L | ... |
| n+3 | L | L | ... | H | L | L | ... |
| n+4 | L | L | ... | H | L | L | ... |
| n+5 | L | L | ... | H | L | L | ... |
| ⋮ | | | | | | | |

○ : ACTIVE

CLOCK REPRODUCTION CIRCUIT THAT CAN REPRODUCE INTERNAL CLOCK SIGNAL CORRECTLY IN SYNCHRONIZATION WITH EXTERNAL CLOCK SIGNAL

BACKGROUND OF THE INVENTION

1. Field of the Invention

The present invention relates to a synchronous semiconductor integrated circuit device that operates in synchronization with a clock signal, and particularly to the structure of a clock reproduction circuit that receives an external clock signal and generates an internal clock signal in synchronization with the external clock signal. More specifically, the present invention relates to the structure of generating speedily an internal clock signal in synchronization with an external clock signal even when the operating environment of the semiconductor integrated circuit device is varied.

Further specifically, the present invention relates to the structure of clock generation circuitry generating an internal clock signal speedily in synchronization with an external clock signal when the power is turned on or when a power down mode is released.

2. Description of the Background Art

In recent years, a clock synchronous semiconductor memory device that receives an external signal and data input/output in synchronization with a clock signal, such as a system clock, has been widely used. It is not necessary to take into account the skew between a control signal and an address signal since an externally applied clock signal is used as the timing reference. It is also not necessary to take the timing margin into account since the internal signal is generated in synchronization with the clock signal. Accordingly, the timing of initiating an internal operation can be advanced to allow high speed access.

The externally applied clock signal determines the data transfer rate since data input/output is carried out in synchronization with this external clock signal. Therefore, data transfer between an external processing device such as a microprocessor and a synchronous semiconductor memory device can be effected at high speed. The problem of degradation in the system performance due to increase in the waiting time of the microprocessor caused by the difference in the operating speed between the microprocessor and the main memory, such as a standard DRAM (Dynamic Random Access Memory), can be eliminated.

FIG. 82 is a schematic diagram of an entire structure of a conventional synchronous semiconductor memory device. In FIG. 82, the structure of a synchronous DRAM (Dynamic Random Access Memory) that operates in synchronization with an externally applied clock signal CLKex is presented as a synchronous semiconductor memory device.

Referring to FIG. 82, the synchronous semiconductor memory device includes an internal clock generation circuit 5000 receiving an external clock signal CLKex to generate an internal clock signal CLKin in synchronization with external clock signal CLKex, a memory circuit 5002 including a plurality of memory cells and a memory cell select circuit, an input buffer 5004 receiving an externally applied command CMD and a clock enable signal CKE in synchronization with internal clock signal CLKin, a command decode circuit 5006 identifying an operation mode specified according to an internal signal from input buffer 5004 to generate a signal designating the specified operation mode, a control circuit 5008 generating a control signal required for the specified operation according to the operation mode designating signal from command decode circuit 5006, and an address input circuit 5010 receiving an externally applied address signal ADD in synchronization with internal clock signal CLKin and latching the input address signal according to a control signal from control circuit 5008 to generate an internal address signal.

Command CMD applied to input buffer 5004 includes a plurality of control signals, i.e., a chip select signal /CS, a row address strobe signal /RAS, a column address strobe signal /CAS, and a write enable signal /WE. A combination of the states of these control signals at the rising edge of internal clock signal CLKin provides a command. Under control of control circuit 5008, address input circuit 5010 latches a row address signal specifying a memory cell row in memory circuit 5002 and a column address signal specifying a memory cell column in memory circuit 5002 to generate internal row and column address signals. The generated internal row and column address signals are applied to memory circuit 5002.

Memory circuit 5002 includes an array with a plurality of memory cells arranged in rows and columns and, memory cell array peripheral circuitry including a row decode circuit decoding a row address signal to select the addressed row, a column decode circuit decoding a column address signal to select the addressed column, and a sense amplifier to sense, amplify and latch the data of the memory cell connected to the selected row.

The synchronous semiconductor memory device further includes a write/read circuit 5012 to carry out data writing/reading with respect to a selected memory cell in memory circuit 5002 under control of control circuit 5008, an input/output circuit 5014 operating under control of control circuit 5008 to transfer data between write/read circuit 5012 and an external device, and an internal power supply voltage generation circuit 5016 generating internal power supply voltages Vccp and Vcca from an external power supply voltage Vex.

Control circuit 5008 generates various control signals in synchronization with internal clock signal CLKin according to the operation mode designating signal from command decode circuit 5006. Write/read circuit 5012 includes a preamplifier to amplify data read out from a selected memory cell, a write drive circuit to write data into a selected memory cell, and a transfer circuit to transfer the data in synchronization with internal clock signal CLKin. Input/output circuit 5014 includes an input circuit generating internal write data from externally applied data DQ in a data write operation, and an output circuit buffering the data read out from write/read circuit 5012 to generate external read data in a data read out operation.

Internal power supply voltage generation circuit 5016 down-converts external power supply voltage Vex to generate internal power supply voltages Vccp and Vcca. Power supply voltage Vccp is applied to internal clock generation circuit 5000, input buffer 5004, command decode circuit 5006, control circuit 5008, address input circuit 5010, write/read circuit 5012, input/output circuit 5014, and the peripheral circuitry included in memory circuit 5002. More specifically, internal power supply voltage Vccp from internal power supply voltage generation circuit 5016 is applied as an operating power supply voltage in common to the peripheral circuits. Internal power supply voltage Vcca is applied to the memory cell array in memory circuit 5002 (specifically, employed as a sense amplifier drive power supply voltage).

An external power supply voltage VDDQ dedicated for data output is applied to the final stage output buffer circuit in input/output circuit 5014. By applying the output-dedicated power supply voltage VDDQ to input/output circuit 5014, internal power supply voltages Vccp and Vcca maintain their voltage levels even in the case where an output terminal is driven by a great drivability to result in great current consumption during data output. The internal circuitry can be operated stably without the influence of variation in the power supply voltage during data output.

By generating independently an internal power supply voltage Vcca for the array and internal power supply voltage Vccp for the peripheral circuitry, power supply voltage Vccp directed to the peripheral circuitry can be maintained stably at the required voltage level even when a relatively large current is consumed during a sense amplifier operation in memory circuit 5002. The power supply voltage applied to the memory cell of the memory array is set at the optimum value. The breakdown voltage of an insulated gate type field type effect transistor (MOS transistor) which is a component of a memory cell can be ensured.

Clock enable signal CKE controls generation of internal clock signal CLKin. When clock enable signal CKE attains an inactive state of an L level (logical low), generation of internal clock signal CLKin is stopped at the next clock cycle. In a power down mode, a power down mode designating signal PD from control circuit 5008 is applied to internal clock generation circuit 5000, whereby generation of internal clock signal CLKin in internal clock generation circuit 5000 is stopped. In the synchronous semiconductor memory device, the internal circuit operates in synchronization with internal clock signal CLKin. Inhibition of generation of internal clock signal CLKin causes the operation of the internal circuit to be halted. The charging/discharging operation of signal lines is halted, so that current consumption is reduced. This operation mode of reducing current consumption by inhibiting generation of the internal clock signal to stop operation of internal circuitry is referred to as a "power down mode".

When clock enable signal CKE attains an L level or when the power down mode is specified by a particular command, input buffer 5004 and the buffer circuits of address input circuit 5010 have their operation stopped. Therefore, the output signals of the buffer circuits are maintained at the low voltage level.

Internal clock generation circuit 5000 is generally formed of a PLL (phase locked loop) circuit or a DLL (delayed locked loop) circuit to generate an internal clock signal CLKin phase-locking with external clock signal CLKex. When a general buffer circuit is employed as internal clock generation circuit 5000, the gate delay in the buffer circuit becomes too great for a high speed clock signal. Therefore, internal circuitry cannot be operated at high speed. By generating an internal clock signal using such a phase synchronization circuit, it is intended to implement proper input of an external signal and proper data input/output even with a high speed clock signal through generation of an internal clock signal phase-locking with an external clock signal.

FIG. 83 schematically shows a structure of the portion for generating a periphery power supply voltage Vccp included in internal power supply voltage generation circuit 5016 of FIG. 82. Referring to FIG. 83, internal power supply voltage generation circuit 5016 includes an active voltage-down converter rendered active in response to an internal circuit activation signal φACT to generate a periphery power supply voltage Vccp from external power supply voltage Vex, and a standby voltage-down converter 5016s constantly operating to generate periphery power supply voltage Vccp from external power supply voltage Vex. When peripheral circuitry is inactive, standby voltage-down converter 5016s prevents the voltage level of periphery power supply voltage Vccp from being reduced by a leakage current and the like. Active voltage-down converter 5016a is rendered active in response to activation of internal circuit activation signal φACT for compensating for current consumption during operation of peripheral circuitry with a great drivability to maintain periphery power supply voltage Vccp at a constant level.

Standby voltage-down converter 5016s includes a comparator 5016sa comparing a reference voltage Vref and periphery power supply voltage Vccp, and a current drive transistor 5016sb supplying current from an external power supply node to an internal power supply line according to the signal output from comparator 5016sa. The current drivability of current drive transistor 5016sb is set at a low level.

Active voltage-down converter 5016a includes a comparison circuit 5016aa rendered active in response to activation of internal circuit activation signal φACT to compare periphery power supply voltage Vccp with reference voltage Vref, and a current drive transistor 5016ab supplying current from an external power supply node to an internal power supply line according to the signal output from comparison circuit 5016aa. The current drivability of current drive transistor 5016ab is set to a relatively great level. Comparison circuit 5016aa includes a comparator CMP comparing reference voltage Vref with periphery power supply voltage Vccp, and a current source transistor ATr rendered conductive in response to internal circuit activation signal φACT to form an operating current path for comparator CMP to activate comparator CMP.

According to the structure of internal power supply voltage generation circuit 5016a of FIG. 83, comparator 5016sa outputs a signal of an H level (logical high) when periphery power supply voltage Vccp is higher than reference voltage Vref, to maintain current drive transistor 5016sp at a non-conducting state. When reference voltage Vref is higher than periphery power supply voltage Vccp, comparator 5016sa provides a low level signal according to the difference. The conductance of current drive transistor 5016sb is increased, whereby current is supplied from the external power supply node to the internal power supply line. Active voltage-down converter 5016a operates in a manner similar to that of standby voltage-down converter 5016s when internal circuit activation signal φACT is active. Therefore, periphery power supply voltage Vccp is maintained at a level substantially equal to that of reference voltage Vref.

The reason why periphery power supply voltage Vccp and array power supply voltage Vcca are generated independently is set forth in the following. Due to difference in voltage level between array power supply voltage Vcca and periphery power supply voltage Vccp, peripheral circuitry is operated at high speed while the breakdown voltage of the memory cell in the array is ensured. The sense amplifier circuit that consumes array power supply voltage Vcca consumes a relatively large current during operation thereof. However, high speed response is not required for the circuit that generates the power supply voltage for the sense amplifier circuit. In contrast, high speed response is required for the circuit that generates periphery power supply voltage Vccp in order to transmit the control signals and data speedily. Thus, array power supply voltage Vcca and periphery power supply voltage Vccp are generated individually from different voltage-down converters to satisfy respective requirements.

When the circuit scale of the semiconductor integrated circuit becomes larger and the number of bits of data transmitted internally increases, the number of circuit portions that operate simultaneously becomes greater to result in greater power consumption. Variation in periphery power supply voltage Vccp causes variation in the operating speed of internal clock generation circuit 5000 since this periphery power supply voltage Vccp is also consumed by internal clock generation circuit 5000. Internal clock generation circuit 5000 generally includes a train of inverters. The phases of external clock signal CLKex and internal clock signal CLKin are synchronized by adjusting the operating current of the train of inverters. However, variation in periphery power supply voltage Vccp causes variation in the operating characteristic of the inverters in internal clock generation circuit 5000. This is because the voltage level applied to the gate of the MOS transistor is varied. Therefore, internal clock signal CLKin from internal clock generation circuit 5000 is desynchronized from external clock signal CLKex when periphery power supply voltage Vccp is varied, and it is no longer possible to operate internal circuitry properly in synchronization with the external clock signal. Data cannot be input or output at the desired timing, resulting in a problem that data cannot be transferred accurately.

The synchronous semiconductor memory device with a power down mode has clock enable signal CKE set to an inactive state of an L level in the power down mode. Here, internal clock generation circuit 5000 is inhibited of a clock generation operation. Internal clock generation circuit 5000 that has to operate speedily to generate a high speed clock signal includes a MOS (insulated gate type) transistor of a low threshold value voltage as the component. In this case, the sub threshold leakage current of the MOS transistor of the low threshold value increases in internal clock generation circuit 5000. Peripheral circuitry does not operate in the power down mode. Therefore, the leakage current with respect to periphery power supply voltage Vccp increases, so that current consumption in a power down mode cannot be reduced.

Generation of internal clock signal CLKin is inhibited in the power down mode. Internal clock signal CLKin must be speedily set to be in synchronization with the phase of external clock signal CLKex when exiting from the power down mode. When the number of stages of the train of inverters is increased and the unit delay time is reduced for the purpose of improving the accuracy of phase synchronization between external clock signal CLKex and internal clock signal CLKin, establishment of phase synchronization is time-consuming, and synchronization cannot be established speedily. Thus, there is a problem that the operation start timing cannot be advanced.

The problem of establishing phase synchronization is also encountered at the time of power on. When the power is turned on, internal clock signal CLKin is generated from internal clock generation circuit 5000 after initialization of internal circuitry. Phase synchronization between external clock signal CLKex and internal clock signal CLKin must be established speedily following stabilization of the power supply voltage. However, establishment of phase synchronization is time-consuming when the degree of accuracy of phase synchronization is set higher, similar to exiting from the power down mode. There is a problem that the synchronous semiconductor memory device cannot be operated at a fast timing after power-on.

In the conventional synchronous semiconductor memory device, there was a problem that an internal clock signal phase-locking with an external clock signal could not be generated stably and at high precision when the operating environment changes as at the stage of raising the power supply voltage after power-on or releasing the power down mode, and upon starting of operation of peripheral circuitry.

SUMMARY OF THE INVENTION

An object of the present invention is to provide a synchronous semiconductor integrated circuit device that can generate an internal clock signal phase-locking with an external clock signal stably at high speed even when an operating environment changes.

Another object of the present invention is to provide a synchronous semiconductor integrated circuit device that can generate an internal clock signal phase-locking with an external clock signal stably without increase in current consumption.

A further object of the present invention is to provide a synchronous semiconductor integrated circuit that can generate an internal clock signal phase-locking with an external clock signal stably even when the operating environment is changed, as upon starting of operation of peripheral circuitry without being effected therefrom.

A synchronous semiconductor integrated circuit device according to an aspect of the present invention has the operating power supply voltage supply path for peripheral circuitry from the one for internal circuitry by supplying a power supply voltage to circuitry that generates an internal clock signal from an internal power supply circuit provided independent of the power supply circuit provided for peripheral circuitry.

When phase-synchronization of an internal clock signal is adjusted, fine adjustment is carried out after coarse adjustment of the phase is carried out. When phase adjustment is required exceeding the fine adjustment range in the operation of the phase fine adjustment, the phase of the internal clock signal is modified at the accuracy of coarse adjustment, and then fine adjustment is carried out.

By providing a power supply circuit dedicated for the clock generation circuit, the clock generation circuit can carry out an internal clock generation operation stably without being influenced by variation, if any, of the power supply voltage during internal circuitry operation. Therefore, an internal clock signal phase-locking with an external clock signal can be supplied stably to internal circuitry.

By providing the clock generation circuits individually for the coarse adjustment and fine adjustment and by shifting the amount of coarse adjustment by an unit amount to carry out fine adjustment when the fine adjustment operation range is exceeded, the number of stages of the delay circuits to generate an internal clock signal can be reduced. As a result, an internal clock signal can be made to synchronize in phase with an external clock signal speedily.

By arranging the fine adjustment circuit intermediate the internal circuitry and the coarse adjustment circuit, phase synchronization between an internal clock signal and an external clock signal can be established easily and accurately. This is because the signal propagation delay is identical.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 24 shows a structure of one stage of the SMD of FIG. 22.

FIG. 25 shows a more specific structure of the SMD of FIG. 22.

FIG. 28 shows an example of a structure of the phase comparator of FIG. 27.

FIG. 45A shows a structure of a bi-directional shift register of FIG. 43.

FIGS. 45B and 45C are signal waveform diagrams representing the operation of the bi-directional shift register of FIG. 45A.

FIG. 76 shows a structure of a delay monitor circuit of FIG. 60.

FIG. 79 shows an example of the sequence of a shift operation of the fine adjustment bi-directional shift register of FIG. 69.

DESCRIPTION OF THE PREFERRED EMBODIMENTS

FIRST EMBODIMENT

Figure 1:
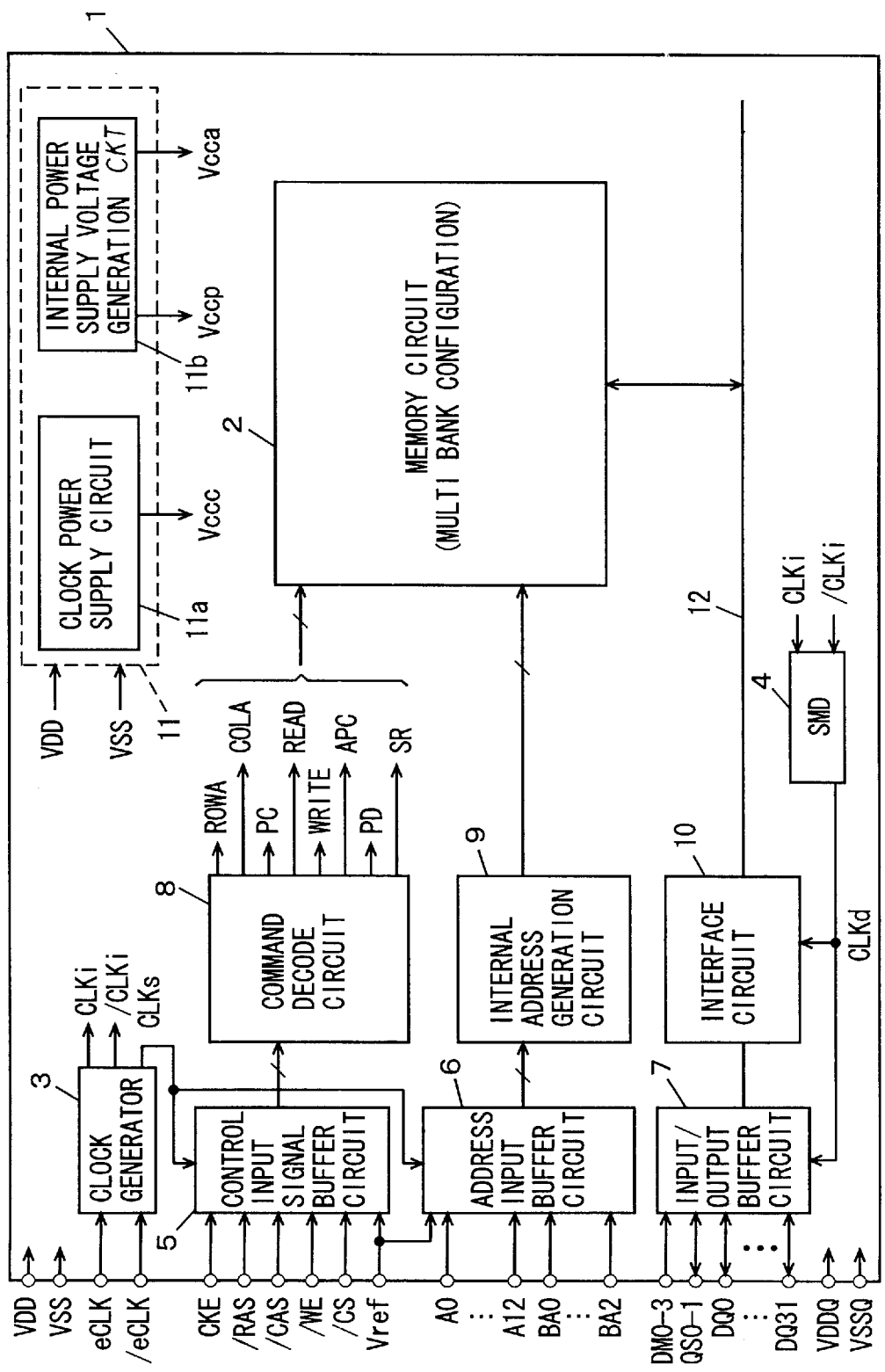
FIG. 1 schematically shows an entire structure of a semiconductor integrated circuit device according to the present invention.

FIG. 1 schematically shows an entire structure of a synchronous semiconductor memory device according to a first embodiment of the present invention. The entire structure of a 1 giga-bit SDRAM (synchronous dynamic random access memory) is shown as an example in FIG. 1.

Referring to FIG. 1, a synchronous semiconductor memory device 1 includes a memory circuit 2 with a plurality of banks, a clock generator 3 receiving externally applied complementary clock signals eCLK and /eCLK to generate complementary internal clock signals CLKi and /CLKi and a strobe internal clock signal CLKs, a synchronizing clock generation circuit (SMD: synchronous mirror delay) 4 receiving internal clock signals CLKi and /CLKi from clock generator 3 to generate an internal clock signal CLKd, a control signal input buffer circuit 5 receiving an externally applied control signal, i.e., a clock enable signal CKE, a row address strobe signal /RAS, a column address strobe signal /CAS, a write enable signal /WE and a chip select signal /CS in synchronization with strobe internal clock signal CLKs from clock generator 3 to generate an internal control signal, an address input buffer circuit 6 receiving externally applied address signal bits A0–A12 and bank address signal bits BA0–BA2 in synchronization with strobe internal clock signal CLKs to generate an internal address signal, an input/output buffer circuit 7 performing data input/output in synchronization with internal clock signal CLKd from synchronizing signal generation circuit (SMD) 4, a command decode circuit 8 decoding an internal control signal from control signal input buffer circuit 5 to generate an internal operation mode designating signal that designates a specified operation mode, an internal address generation circuit 9 receiving an internal address signal from address input buffer circuit 6 to generate an internal row/column address signal according to the control signal from command decode circuit 8, and an interface circuit 10 coupled to memory circuit 2 via a global data bus 12 to transfer data between input/output buffer circuit 7 and memory circuit 2 according to internal clock signal CLKd.

Control signal input buffer circuit 5 and address input buffer circuit 6 compare a low/high comparison reference voltage Vrf with each signal to generate an internal signal of a high/low level according to the comparison result when active. Accordingly, transmission of a signal of a small amplitude is possible.

Command decode circuit 8 generates an operation mode designating signal according to an applied command. In FIG. 1, these operation mode designating signals include a row access activation signal ROWA that is rendered active when a row access designation command (active command) designating row selection, a column access activation signal COLA to render a column access operation (column select operation) active when column access (read/write operation) is specified, a precharge designating signal PC to set a corresponding memory array (bank) to a precharge state when a precharge operation is specified, a read operation activation signal READ to render a data read operation active, a write operation activation signal WRITE to render a data write operation active when data writing is designated, an auto precharge operation activation signal APC that is rendered active when an auto precharge operation is specified to drive a selected memory array (bank) to a precharge state automatically at completion of data writing/reading, a power down mode designating signal PD to specify a power down mode internally when clock enable signal CKE is inactive or when a power down mode is specified, and a self refresh operation designating signal SR that is rendered active when a self refresh operation is specified. Memory circuit 2 receives an operation mode designating signal from command decode circuit 8 and an address signal (including bank address signal) from internal address generation circuit 9 to execute the specified operation only for the addressed bank.

The synchronous semiconductor memory device further includes an internal power supply circuit 11 receiving externally applied power supply voltage VDD and ground voltage VSS to down-convert external power supply voltage VDD to generate internal power supply voltages Vccc, Vccp and Vcca. Internal power supply circuit 11 includes a clock power supply circuit 11a down-converting external power supply voltage VDD to generate an operating power supply voltage Vccc applied to clock generator 3 and synchronizing clock generation circuit 4, and an internal power supply voltage generation circuit 11b down-converting external power supply voltage VDD to generate power supply voltage Vccp for peripheral circuitry and power supply voltage Vcca for the array.

By generating operating power supply voltage Vccc for clock generator 3 and synchronizing clock generator 4 and power supply voltages Vccp and Vcca for peripheral circuitry and the array circuit from different power supply circuits (clock generation circuit 11a and internal power supply voltage generation circuit 11b), internal power supply voltage Vccc generated by clock power supply circuit 11a can be maintained at a constant level stably without being influenced by variation in power supply voltages Vccp and Vcca from internal power supply voltage generation circuit 11b. Accordingly, clock generator 3 and synchronizing clock generation circuit 4 can operate stably without variation in operating power supply voltage Vccc even when memory circuit 2 is operated to generate internal clock signals CLKs and CLKd phase-locking with the external clock signals eCLK and /eCLK.

Figure 2A:
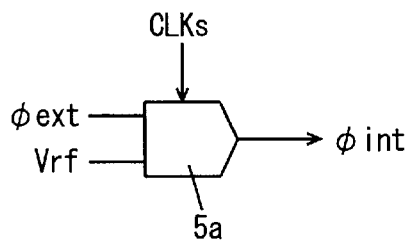
FIGS. 2A and 2B show a schematic structure and a specific structure, respectively, of a control signal input buffer of FIG. 1.

FIG. 2A shows a structure of a buffer included in control signal input buffer circuit 5 of FIG. 1. A buffer circuit 5a shown in FIG. 2A is provided corresponding to each of the signals /RAS, /CAS, /WE and /CS. Clock enable signal CKE is not compared with reference voltage Vrf. This is because clock enable signal CKE is mainly employed in specifying a power down mode or clock masking and changes in a full swing. Referring to FIG. 2A, buffer 5a is rendered active in response to strobe clock signal CLKs to compare external signal φext with a low/high compare reference voltage Vrf to generate an internal signal φint according to the comparison result.

Figure 2B:
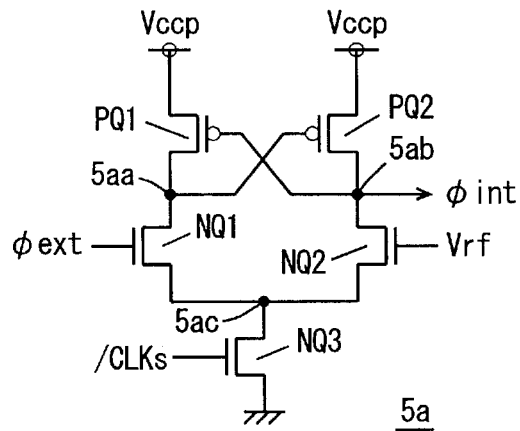
Figure 2C:
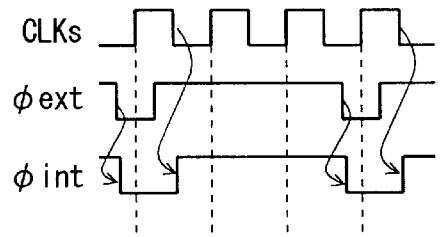
FIG. 2C is a waveform diagram representing the operation of the control signal input buffer of FIG. 1.

FIG. 2B shows an example of the structure of buffer 5a of FIG. 2A. Referring to FIG. 2B, buffer 5a includes a p channel MOS transistor PQ1 connected between a power supply node and a node 5aa and having a gate connected to a node 5ab, a p channel MOS transistor PQ2 connected between the power supply node and node 5ab and having a gate connected to node 5aa, an n channel MOS transistor NQ1 connected between nodes 5aa and 5ac and receiving an external signal φext at its gate, an n channel MOS transistor NQ2 connected between nodes 5ab and 5ac and receiving reference voltage Vrf at its gate, and an n channel MOS transistor NQ3 connected between node 5ac and the ground node and receiving a complementary strobe clock signal /CLKs. Periphery power supply voltage Vccp from internal power supply voltage generation circuit 11b of FIG. 1 is supplied to the power supply node. Alternatively, an external power supply voltage VDD may be applied to buffer 5a as an operating power supply voltage. The operation of buffer 5a of FIG. 2B will be described with reference to the timing chart of FIG. 2C.

When strobe internal clock signal CLKs is at an L level, complementary internal clock signal /CLKs is at an H level. MOS transistor NQ3 conducts, so that buffer 5 operates. When external signal φext has a voltage level lower than the level of reference voltage Vrf, the current flowing through MOS transistor NQ2 becomes greater than the current flowing through MOS transistor NQ1, whereby the voltage level of node 5ab decreases. According to this drop of the voltage at node 5ab, p channel MOS transistor PQ1 conducts to increase the voltage level of node 5aa. This change in voltage level at nodes 5aa and 5ab is latched by the latch circuit formed of MOS transistors PQ1 and PQ2. Therefore, internal signal φint output from node 5ab attains an L level.

At the rise of clock signal CLKs to an H level, complementary internal clock signal /CLKs attains an L level. MOS transistor NQ3 attains an nonconductive state to cut off the current flowing path for MOS transistors NQ1 and NQ2, so that the voltage levels of nodes 5aa and 5ab are latched by MOS transistors PQ1 and PQ2. Therefore, buffer 5a takes in and latches external signal φext at the rising edge of clock signal CLKs. When clock signal CLKs is driven to an L level, buffer 5a is released from the latching state to compare external signal φext with reference voltage Vref. This comparison result is latched by MOS transistors PQ1 and PQ2. An internal signal φint of an amplitude of internal power supply voltage Vccp can be generated from external signal φext of a small amplitude.

A buffer of a structure similar to that of buffer 5a shown in FIGS. 2A and 2B is also provided for each address signal bit in address input buffer circuit 6 of FIG. 1.

Figure 3:
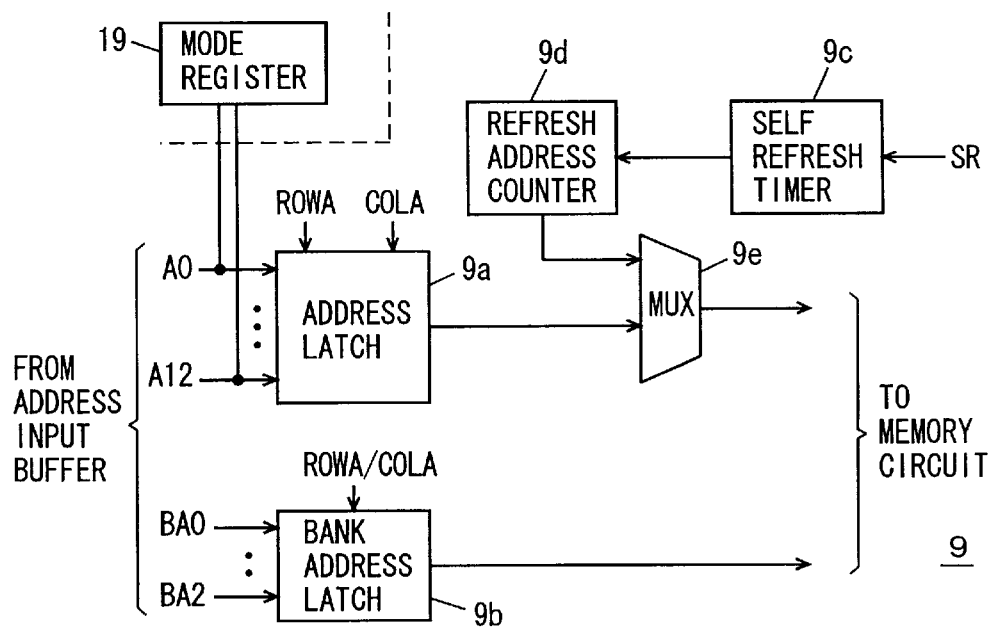
FIG. 3 schematically shows a structure of an internal address generation circuit of FIG. 1.

FIG. 3 schematically shows a structure of internal address generation circuit 9 of FIG. 1. Referring to FIG. 3, internal address generation circuit 9 includes an address latch 9a latching internal address signal bits A0–A12 from address input buffer circuit 6 according to operation mode designating signals ROWA and COLA, a bank address latch 9b latching bank address signal bits BA0–BA2 from address input buffer 6 according to operation mode designating signals ROWA and COLA, a self refresh timer 9c rendered active, when a self refresh mode designating signal SR from command decode circuit 8 of FIG. 1 is active, to output a refresh designating signal at a constant time interval, a refresh address counter 9 carrying out a count operation in response to a refresh request from self refresh timer 9c to generate a refresh address, and a multiplexer (MUX) 9e for selecting one of address signals from refresh address counter 9d and address latch 9a according to self refresh operation designating signal SR.

Address latch 9a latches the applied address signal bit as a row address signal bit when row access activation signal ROWA is active. Address latch 9a also latches the applied address signal bit as a column address signal bit when column access activation signal COLA is active. Therefore, address latch 9a includes a row address latch to latch a row address signal bit and a column address latch to latch a column address signal bit. Bank address latch 9b latches applied bank address signal bits BA0–BA2 when row access activation signal ROWA or column access activation signal COLA is active.

A particular address signal bit out of internal address signal bits A0–A12 from address input buffer 6 is applied also to a mode register 19. Mode register 19 latches the particular address signal bit when a register set command is applied. Information indicating an operating parameter such as the burst length and the CAS latency is stored in mode register 19.

Power supply voltage Vccp from the internal power supply circuit of FIG. 1 is applied to internal address generation circuit 9 of FIG. 3 as the operating power supply voltage.

Figure 4:
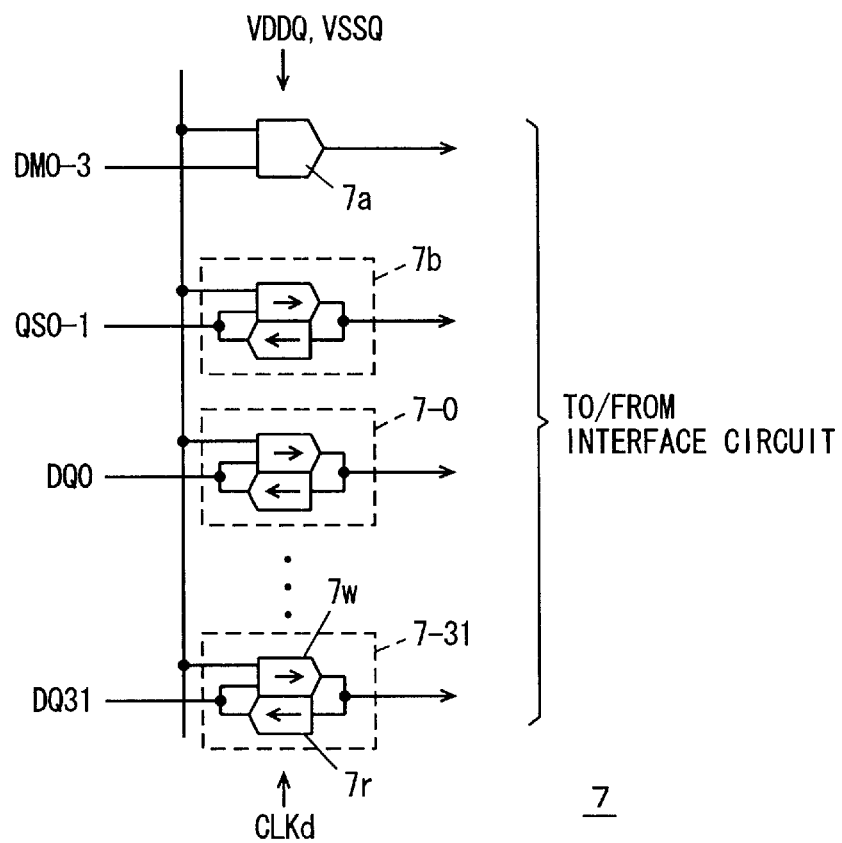
FIG. 4 schematically shows a structure of an input/output buffer circuit of FIG. 1.

FIG. 4 schematically shows a structure of input/output buffer circuit 7 of FIG. 1. Referring to FIG. 4, input/output buffer circuit 7 includes an input buffer 7a to receive externally applied mask data signals DM0–DM3 (DM0–3)

according to clock signal CLKd, an input/output buffer 7b to input/output 2-bit data select signals QS0–QS1 in synchronization with clock signal CLKd, and data input/output buffers 7-0~7-31 provided corresponding to data bits DQ0–DQ31 respectively to input/output data in synchronization with clock signal CLKd. Each of input/output buffers 7b and 7-0~7-31 includes an input buffer 7w to input a data signal in synchronization with clock signal CLKd, and an output buffer 7r to output data in synchronization with clock signal CLKd. The structure of each of these input buffers is similar to that shown in FIG. 2B. The output buffer has a clocked buffer structure.

Each of data mask signals DM0–DM3 specifies whether a mask is to be applied on the write data. Data mask signals DM0–DM3 each determine whether to apply a mask on data of one byte. Therefore, a mask can be applied on the basis of the byte (8 bits) for data DQ0–DQ31 of 32 bits.

Data select signals QS0 and QS1 indicate whether the valid data bits out of the 32 bit data are 32 bits or 16 bits. More specifically, whether a word of most significant 16 bits and a word of least significant 16 bits each are valid or not is designated.

Dedicated power supply voltages VDDQ and VSSQ are applied to input/output buffer circuit 7 to prevent the effect of these operating power supply voltages to other circuitry even when these input/output buffer circuits operate upon input/output of data of multi bits.

Figure 5:
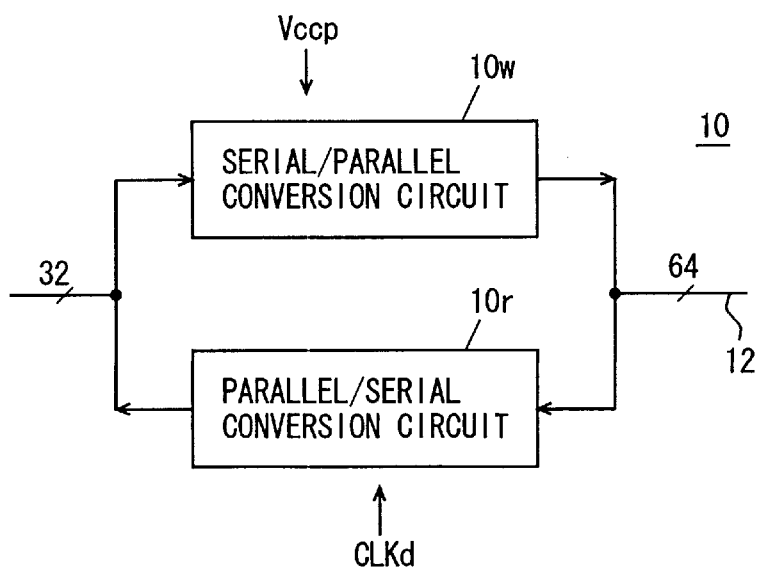
FIG. 5 schematically shows a structure of an interface circuit of FIG. 1.

FIG. 5 schematically shows a structure of an interface circuit 10 of FIG. 1. Referring to FIG. 5, interface circuit 10 includes a serial/parallel conversion circuit 10w sequentially receiving data of 32 bits from input/output buffer circuit 7 of FIG. 1 for conversion into data of 64 bits and transmitting the same on global data bus 12, and a parallel/serial conversion circuit 10r to receive the data of 64 bits via global data bus 12 to convert the same into data of 32 bits for sequential output in synchronization with clock signal CLKd. The usage of serial/parallel converter circuit 10w and parallel/serial conversion circuit 10r allows data to be transferred in synchronization with the rising edge and falling edge of the external clock signal (data input/output at double data rate). Power supply voltage Vccp from the internal power supply circuit shown in FIG. 1 is applied to serial/parallel conversion circuit 10w and parallel/serial conversion circuit 10r as the operating power supply voltage.

Figure 6:
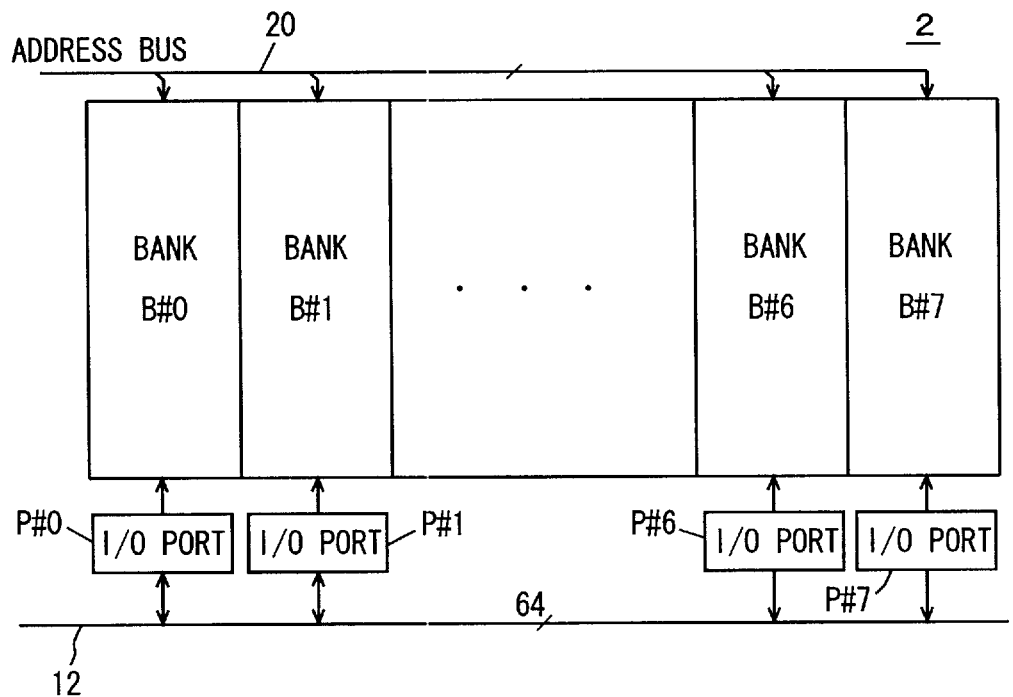
FIG. 6 schematically shows a structure of a memory circuit of FIG. 1.

FIG. 6 schematically shows a structure of memory circuit 2 of FIG. 1. Referring to FIG. 6, memory circuit 2 includes eight banks B#0–B#7, and I/O ports P#0–P#7 provided corresponding to banks B#0–B#7, respectively. The address signal from the address generation circuit is applied to banks B#0–B#7 via an address bus 20. A specified operation is carried out only in a specified bank of B#0–B#7. Each of I/O ports P#0–P#7 can input/output 64 bit data and includes a preamplifier and a write driver provided corresponding to each data bit. I/O ports P#0–P#7 are coupled in common to global data bus 12.

Figure 7:
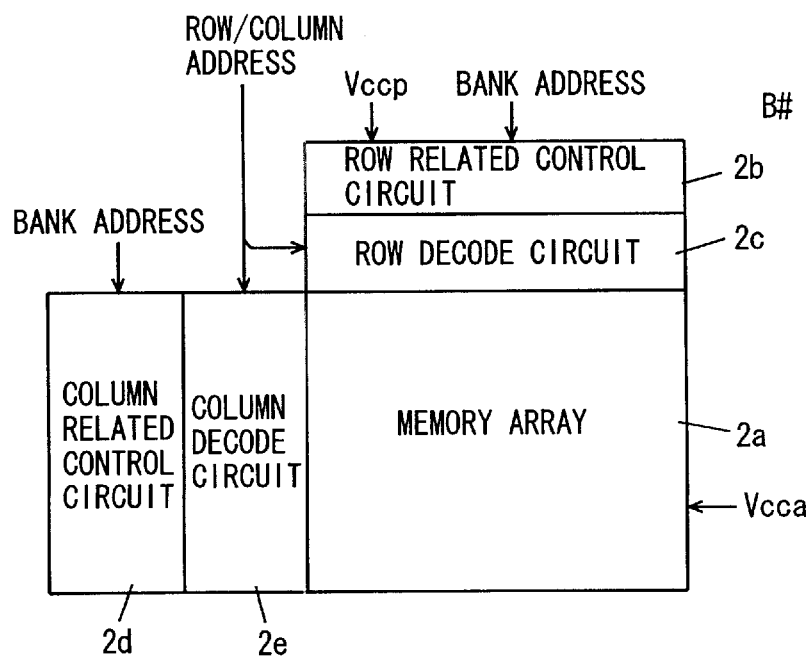
FIG. 7 schematically shows a structure of a bank in FIG. 6.

FIG. 7 schematically shows a structure of a bank in memory circuit 2 of FIG. 6. Since banks B#0–B#7 have the same structure, one bank B# is representatively shown in FIG. 7. Referring to FIG. 7, bank B# includes a memory array 2e having a plurality of memory cells arranged in rows and columns, a row related control circuit 2b rendered active, when the bank address specifies a corresponding bank, to control the operation related to the row select operation according to the operation mode designating signal from the command decode circuit of FIG. 1, a row decode circuit 2c operating, under control of row related control circuit 2b, to drive an addressed row in memory array 2a to a selected state, a column related control circuit 2d rendered active when specified by the bank address signal to carry out an operation related to the specified column selection according to the operation mode designating signal from the command decode circuit of FIG. 1, and a column decode circuit 2e to decode an address signal to select an addressed column.

Row related control circuit 2d performs control of activation/inactivation of row decode circuit 2c and a sense amplifier in memory array 2a, and the precharge operation of a bit line. Column related control circuit 2d performs control of activation/inactivation of column decode circuit 2e and the precharge operation of an internal data bus (not shown). Row related control circuit 2b and column related control circuit 2d operate only in the bank specified by the bank address signal to execute a specified operation.

For banks B#0–B#7, periphery power supply voltage Vccp is applied to row related control circuit 2b, row decode circuit 2c, column related control circuit 2d and column decode circuit 2e. Array power supply voltage Vcca is applied to the sense amplifier in memory array 2a.

Row related and column related control circuits 2b and 2a operate according to internal clock signals CLKi and /CLKi.

Figure 8A:
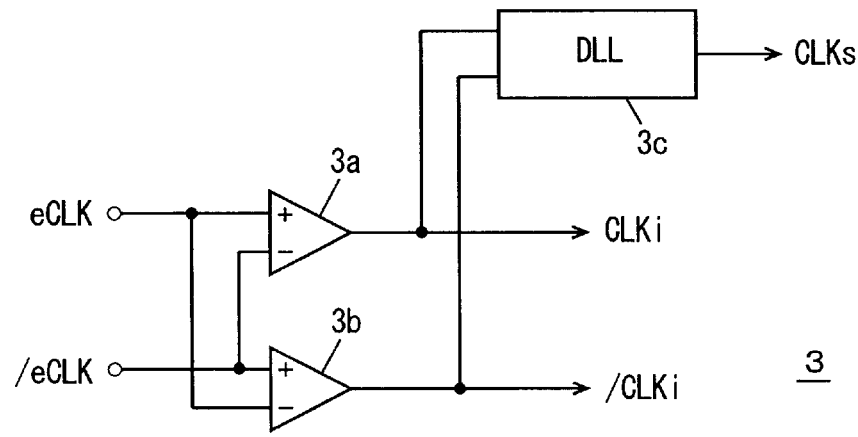
FIG. 8A schematically shows a structure of a clock generator of FIG. 1.

FIG. 8A schematically shows a structure of clock generator 3 of FIG. 1. Referring to FIG. 8A, clock generator 3 includes a comparator 3a comparing external clock signals eCLK and /eCLK to generate internal clock signal CLKi, a comparator 3b comparing external clock signals eCLK and /eCLK to generate internal clock signal /CLKi, and a DLL (delayed locked loop) 3c generating strobe internal clock signal CLKs from internal clock signals CLKi and /CLKi. Comparators 3a and 3b each are formed of a differential amplifier to generate internal clock signals CLKi and /CLKi complementary to each other (data transfer being realized at double data rate). DLL 3c that will be described in detail afterwards delays internal clock signal CLKi to synchronize the phase of the delayed clock signal with external clock signal eCLK.

Figure 8B:
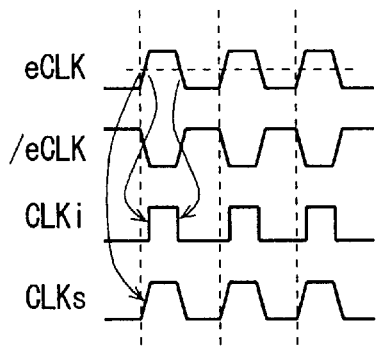
FIG. 8B is a waveform diagram representing the operation of the clock generator of FIG. 1.

FIG. 8B schematically shows an operation of clock generator 3 of FIG. 8A. External clock signals eCLK and /eCLK are clock signals complementary to each other. These clock signals eCLK and /eCLK are transmitted via a relatively long external line to have the waveform thereof rounded. Comparators 3a and 3b detect the crossing of external clock signals eCLK and /eCLK to alter internal clock signals CLKi and /CLKi. Internal clock signals CLKi and /CLKi are triggered at the crossing of external clock signals eCLK and /eCLK to have their states altered. Accordingly, internal clock signals CLKi and /CLKi that have the waveform shaped can be generated. Internal clock signals CLKi and /CLKi lag in phase behind external clock signal eCLK, since they are triggered by the crossing of clock signals eCLK and /eCLK. By using DLL 3c, a strobe clock signal CLKs phase-locking with external clock signal eCLK can be generated. An external control signal and an external address signal can be input at the correct timing. Power supply voltage Vccc from a clock power supply circuit provided separately is supplied to clock generator 3 as an operating power supply voltage.

Figure 9:
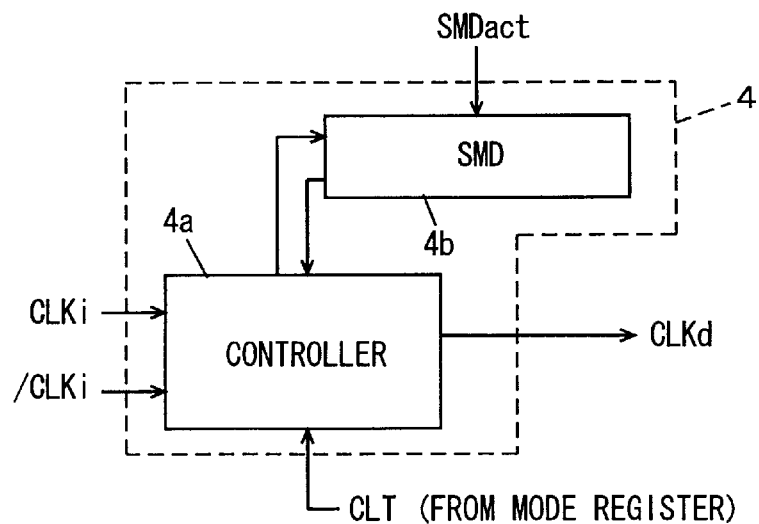
FIG. 9 schematically shows a structure of a synchronizing clock generation circuit (SMD) of FIG. 1.

FIG. 9 schematically shows structure of synchronizing clock generation circuit 4 of FIG. 1. Referring to FIG. 9, synchronizing clock generation circuit 4 includes a synchronous mirror delay (SMD) 4b rendered active, when an activation signal SMDact is active, to carry out a synchronizing operation, and a controller 4a generating a clock signal triggered at the edge of internal clock signals CLKi and /CLKi to output clock signal CLKd from SMD 4b. CAS latency data CLT is applied from the mode register to controller 4a. Controller 4a provides control of the data reading/writing operation of the interface circuit of FIG. 1 and the operation of the data input/output buffer circuit. The operation of synchronizing clock signal generation circuit 4 of FIG. 9 in a data read out operation will be described with reference to the timing chart of FIG. 10.

Figure 10:
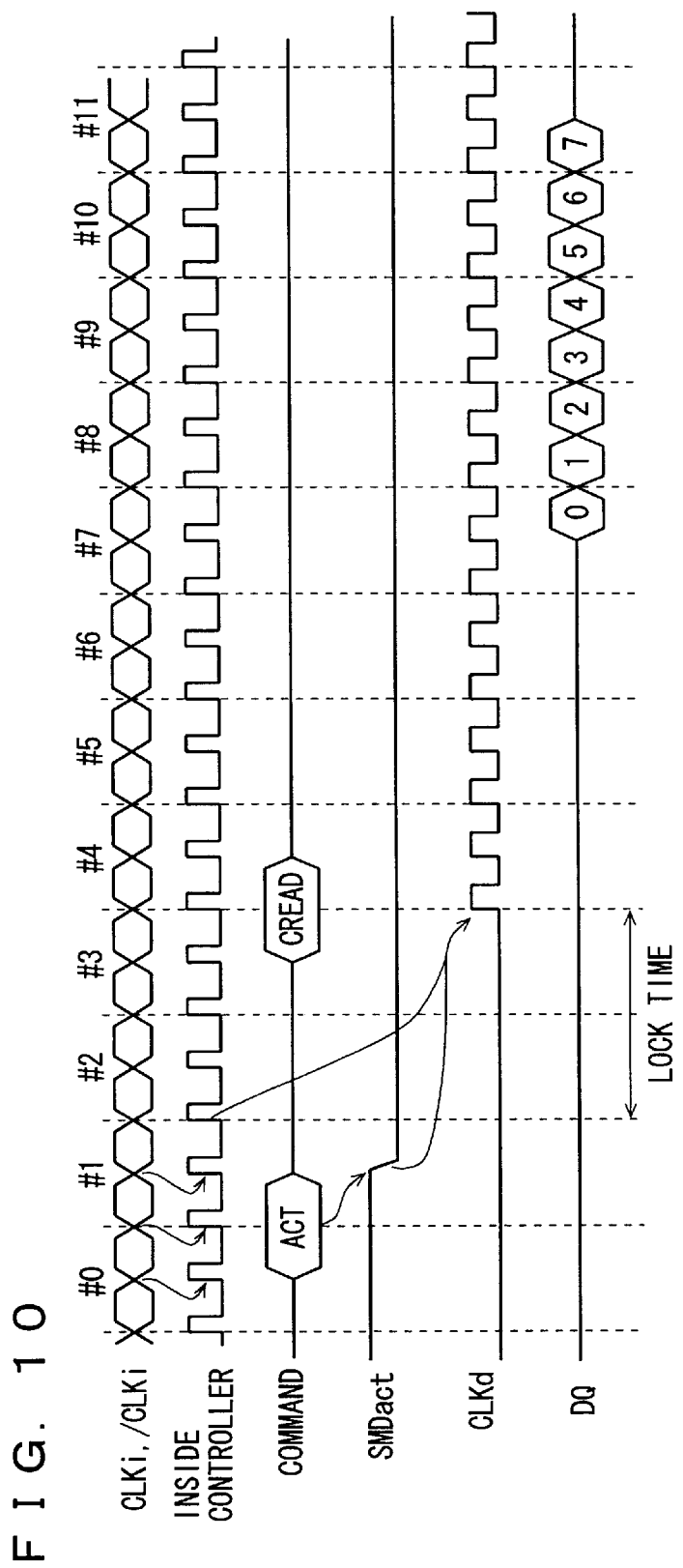
FIG. 10 is a timing chart representing the operation of a synchronizing clock signal generation circuit (SMD) of FIG. 9.

At clock cycle #1, an active command ACT is applied, a bank is selected, and the memory cell array in the selected bank is driven to an active state. In response to application of active command ACT, data access is made to the selected bank. A SMD activation signal SMDact that was at an inactive state is driven to an active state of an L level from the H level in response to application of active command ACT to prepare for data access. In response to activation of SMD activation signal SMDact, SMD 4b initiates a synchronizing operation. Controller 4a responds to active command ACT to apply a signal in synchronization with the edge of internal clock signal CLKi or /CLKi to SMD 4b. Some time is required in SMD 4b before a clock signal CLKd of a double frequency phase-locking with internal clock signal CLKi or /CLKi is generated. This period is called a lock period. In FIG. 10, a period of two clock cycles of internal clock signal CLKi is shown as an example.

At the elapse of this lock time period, a read command CREAD designating data read out is applied at clock cycle #4. A data reading operation is carried out in the selected bank when read command CREAD is applied. Controller 4a responds to read command CREAD to output a clock signal from SMD 4b to the interface circuit and the output buffer circuit. Controller 4a effects activation of the interface circuit and the output buffer circuit according to CAS latency data CLT. When the CAS latency is 4, data is read out starting at the elapse of 4 clock cycles from the application of read command CREAD. Therefore, data is read out in response to the fall of clock signal CLKi at clock cycle #7.

The interface circuit receives data of 64 bits in parallel at clock cycle #7 to sequentially output data of 32 bits according to clock signal CLKd. Clock signal CLKd is generated with the edge of internal clock signals CLKi and /CLKi as the trigger. By providing data output according to clock signal CLKd, data is output in synchronization with the rising and falling edges of internal clock signal CLKi, i.e., external clock signal eCLK. The burst length is 8. Therefore, 8 data are read out sequentially according to clock signal CLKd. When the read out of data of the burst length is completed, the output buffer is driven to an output high impedance state under control of controller 4a even when clock signal CLKd is output continuously at clock cycle #11.

By using SMD 4b (details of the structure will be described afterwards), an internal clock signal is generated in synchronization with the rise and fall of an external clock signal for data output.

Synchronizing clock generation circuit 4 operates with power supply voltage Vccc from the clock power supply circuit of FIG. 1 being the operating power supply voltage. Therefore, power supply voltage Vccc is maintained stably without being affected by the operation of the output buffer and the interface circuit. Thus, a clock signal CLKd phase-locking with internal clock signal CLKi can be generated correctly.

Although an operation timing chart for data reading is shown in FIG. 10, signal SMDact is rendered active to generate clock signal CLKd also for data writing. Write data is input in synchronization with clock signal CLKd from the clock cycle where write command CWRITE is applied.

Power Supply Arrangement 1

Figure 11:
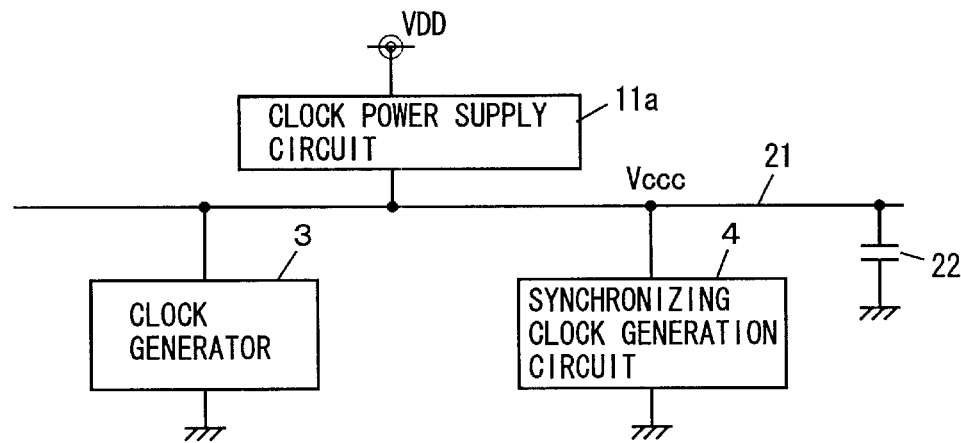
FIG. 11 schematically shows a structure of a main part of a semiconductor integrated circuit device according to a first embodiment of the present invention.

FIG. 11 schematically shows a structure of the power supply arrangement in the synchronous semiconductor memory device according to the first embodiment of the present invention. Referring to FIG. 11, a clock power supply circuit 11a supplies operating power supply voltage Vccc via a clock power supply line 21 common to clock generator 3 and synchronizing clock generation circuit 4. A stabilization capacitor 22 is coupled to clock power supply line 21. According to the power supply arrangement of FIG. 11, operating power supply voltage Vccc is applied common to clock generator 3 and synchronizing clock generation circuit 4. Power supply voltages Vccp and Vcca from internal power supply voltage generation circuit 11b of FIG. 1 are supplied to the other peripheral circuits. Therefore, operating power supply voltage Vccc can be supplied stably to clock generator 3 and synchronizing clock generation circuit 4 without being affected by the operation of other peripheral circuitry and array circuit (sense amplifier circuit) even when clock power supply circuit 11a is provided common to clock generator 3 and synchronizing clock generation circuit 4.

Power Supply Arrangement 2

Figure 12:
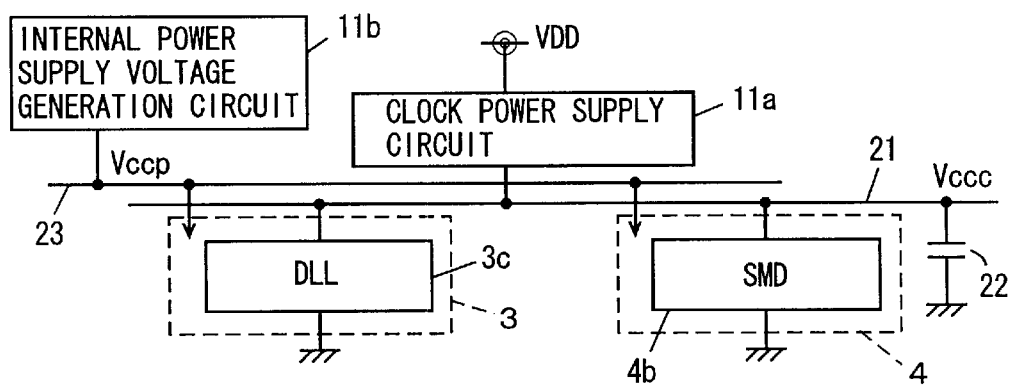
FIGS. 12 and 13 schematically show modifications of the first embodiment of the present invention.

FIG. 12 shows another structure of the power supply arrangement of the synchronous semiconductor memory device of the first embodiment. In the power supply arrangement of FIG. 12, power supply voltage Vccc from clock power supply circuit 11a is supplied to DLL 3c in clock generator 3 and SMD 4b in synchronizing clock generation circuit 4 via power supply line 21. Periphery power supply voltage Vccp from internal power supply voltage generation circuit 11b is supplied via a power supply line 23 to the other circuits (buffer circuit and control circuit) included in clock generator 3 and synchronizing clock generation circuit 4. By supplying power supply voltage Vccc from clock power supply circuit 11a as an operating power supply voltage for only DLL 3c and SMD 4b related to the synchronizing operation as shown in FIG. 12, the circuit portion associated with the synchronizing operation in clock generator 3 and synchronizing clock generation circuit 4 can be operated stably.

Power Supply Arrangement 3

Figure 13:
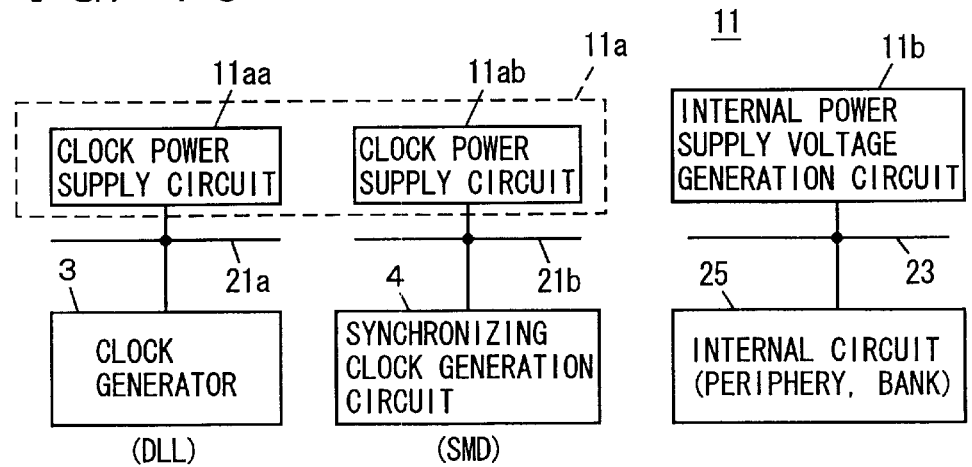

FIG. 13 shows a further power supply arrangement of the synchronous semiconductor memory device of the first embodiment. In FIG. 13, clock power supply circuit 11a includes a clock power supply circuit 11aa provided for clock generator 3 and a clock power supply circuit 11ab provided for synchronizing clock generation circuit 4. Clock power supply circuit 11aa supplies an operating power supply voltage to clock generator 3 via a power supply line 21a whereas clock power supply circuit 11ab supplies power supply voltage to synchronizing clock generation circuit 4 via a power supply Line 21b. Internal power supply voltage generation circuit 11b is provided in addition to clock power supply circuit 11a, to supply power supply voltage to an internal circuit 25 via power supply line 23. The internal circuit includes a peripheral circuit such as a command decode circuit, a row/column select circuit, an array circuit (sense amplifier circuit) and the like in each bank.

Referring to FIG. 13, separate clock power supply circuits 11aa and 11ab are provided for clock generator 3 and synchronizing clock generation circuit 4, respectively. Therefore, clock power supply circuits 11aa and 11ab can be arranged in the proximity of clock generator 3 and synchronizing clock generation circuit 4, respectively, to supply an operating power supply voltage of a desired voltage level to clock generator 3 and synchronizing clock generation circuit 4 without the effect of voltage drop caused by line resistance in power supply lines 21a and 21b. The arrangement of clock power supply circuits 11aa and 11ab in the respective proximities of clock generator 3 and synchronizing clock generation circuit 4 allows the length of power supply lines 21a and 21b to be set to the minimum. A power supply line extended all over the chip is not necessary. Therefore, layout of the power supply lines is facilitated. Also, influence of the operation of clock generator 3 and synchronizing clock generation circuit 4 on the operating power supply voltage of other circuits can be prevented.

In the power supply arrangement of FIG. 13, the structure can be implemented that clock power supply circuit 1aa supplies power supply voltage to the DLL in clock generator 3 and clock power supply circuit 11ab supplies operating power supply voltage to the SMD in synchronizing clock generation circuit 4, and the power supply voltage of internal power supply voltage generation circuit 11b is supplied to the control unit or buffer circuit in clock generator 3 and synchronizing clock generation circuit 4 (refer to FIG. 12). In the following description, any of the power supply arrangements shown in FIGS. 11–13 can be used. In other words, the operating power supply voltage can be supplied common to or individually to clock generator 3 and synchronizing clock generation circuit 4. In the following, clock generator 3 and synchronizing clock generation circuit 4 are generically referred to as a clock reproduction circuit. This clock reproduction circuit may include one or both of clock generator 3 and synchronizing clock generation circuit 4.

According to the first embodiment of the present invention, operating power supply voltage is applied to the clock reproduction circuit generating an internal clock signal in synchronization with an external clock signal from a clock power supply circuit provided in addition to the power supply circuit that supplies power supply voltage to internal circuitry. Therefore, the clock power supply voltage can be maintained at a constant level immune to the effect of variation in the internal power supply voltage caused by operation of the internal circuitry. An internal clock signal in synchronization with an external clock signal can be generated stably. Thus, an internal clock signal phase-locking with an external clock signal can be generated stably even when the operating environment of the clock reproduction circuit changes, as upon change in the operating power supply voltage or during internal circuitry operation.

SECOND EMBODIMENT

Figure 14:
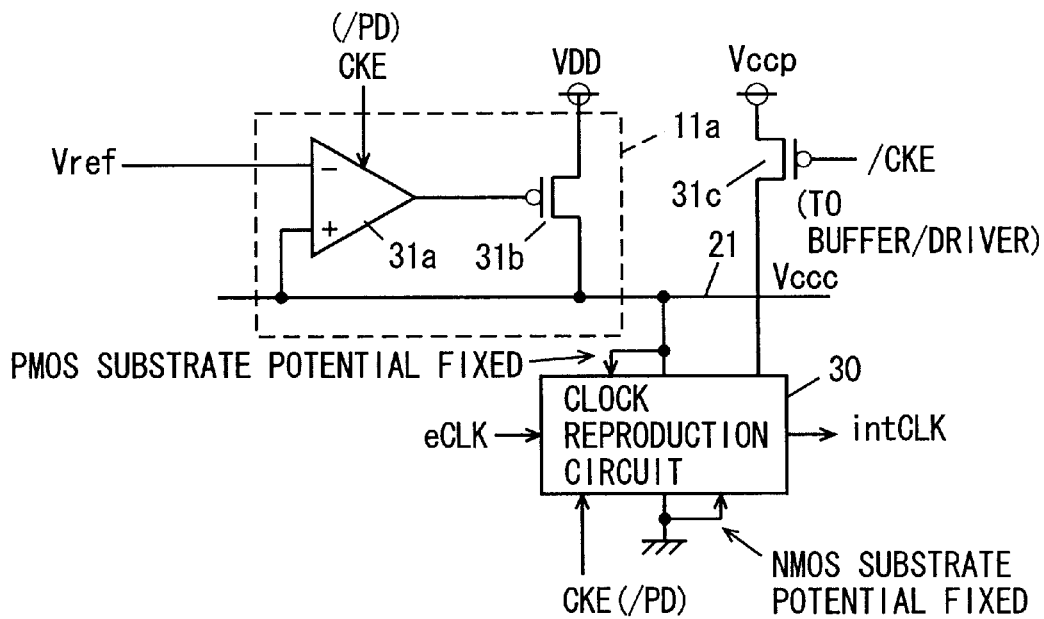
FIG. 14 schematically shows a structure of a main part of a semiconductor integrated circuit device according to a second embodiment of the present invention.

FIG. 14 schematically shows a structure of a main part of a synchronous semiconductor memory device according to a second embodiment of the present invention. In FIG. 14, the structure of clock power supply circuit 11a is shown. Power supply voltage Vccc from clock power supply circuit 11a is applied as an operating power supply voltage to clock reproduction circuit 30 via power supply line 21, particularly to the portion related to adjusting the phase of the clock signal. Clock power supply circuit 11a and clock reproduction circuit 30 may take any of the structures of FIGS. 11–13, as described before.

Figure 15:
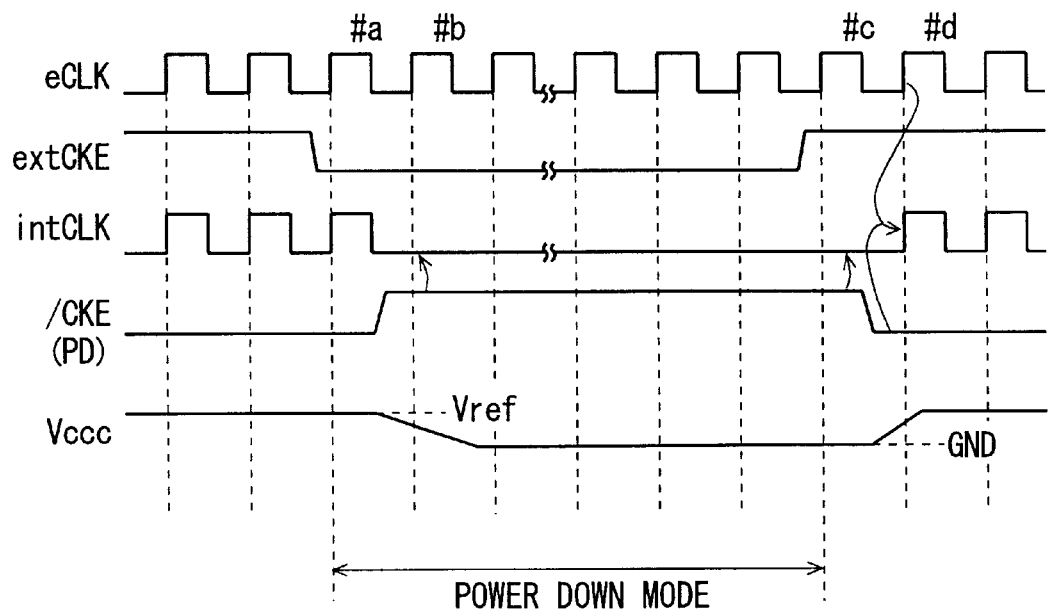
FIG. 15 is a timing chart representing the operation of the circuitry of FIG. 14.

Clock power supply circuit 11a includes a comparator 31a rendered active, when clock enable signal CKE is active, to compare power supply voltage Vccc on power supply line 21 with reference voltage Vref, and a current drive transistor 31b supplying the current from the external power supply node to power supply line 21 according to an output signal of comparator 31a. Clock power supply circuit 11a is rendered active to operate, when clock enable signal CKE is active, to maintain power supply voltage Vccc at the voltage level of reference voltage Vref. When clock activation signal CKE is active, clock reproduction circuit 30 is rendered active to generate an internal clock signal intCLK from external clock signal eCLK. Here, internal clock signal intCLK may be any of signals CLKi, /CLKi, CLKs and CLKd described in the previous first embodiment. Clock power supply circuit 11a is rendered active to generate power supply voltage Vccc only during operation of clock reproduction circuit 30. A p channel MOS transistor 31c responsive to a complementary clock enable signal /CKE to supply periphery power supply voltage Vccp to clock reproduction circuit 30 is provided. Periphery power supply voltage Vccp is applied to the buffer in clock reproduction circuit 30 and the driver that outputs a clock signal. The operation of the circuitry shown in FIG. 14 will be now described with reference to the timing chart of FIG. 15.

At clock cycle #a of external clock signal eCLK, external clock enable signal extCKE is at an inactive state of an L level. External clock enable signal extCKE of an L level stops generation of an internal clock signal from the next clock cycle. Therefore, internal clock signal intCLK (refer to FIG. 8A) is inhibited of generation from the next clock cycle #b and fixed to a constant voltage level (L level in FIG. 15). When external clock enable signal extCKE is set at an L level, power down mode designating signal PD attains an H level, whereby operation of internal circuitry is stopped at clock cycle #a. When this power down mode is specified, comparator circuit 31a of clock power supply circuit 11a shown in FIG. 14 is rendered inactive, and its output signal is fixed at an H level (external power supply voltage VDD level). In response, current drive transistor 31b is rendered non-conductive, whereby power supply line 21 is disconnected from the power supply node. Power supply voltage Vccc on power supply line 21 of a floating state is discharged to the level of ground voltage. Therefore, the problem of leakage current does not occur even if clock reproduction circuit 30 is formed of a MOS transistor of a low threshold voltage. Current consumption of clock reproduction circuit 30 can be set to zero. MOS transistor 31c is rendered non-conductive, so that supply of the operating power supply voltage to the internal clock buffer and driver is inhibited. Therefore, the buffer and the driver will not operate. Accordingly, periphery power supply voltage Vccp is not consumed.

At the completion of the power down mode, clock enable signal extCKE is set to an H level at clock cycle #c. In the cycle prior to clock cycle #c, external clock enable signal extCKE is at an L level. Therefore, generation of internal clock signal intCLK is inhibited at clock cycle #c. Internal clock signal intCLK is generated from the next clock cycle #d. When external clock enable signal extCKE is driven to an H level, clock reproduction circuit 30 is rendered active, whereby an internal clock signal intCLK is generated. Since voltage Vccp is supplied to the clock buffer and the driver from MOS transistor 31c rendered conductive, internal clock signal intCLK can be generated correctly without an adverse affect of the operation of the buffer/driver on power supply voltage Vccc. In response to the exit from the power down mode, clock power supply circuit 11a is rendered active. Power supply voltage Vccc on power supply line 21 is driven from the level of ground voltage to the level of reference voltage Vref.

In the structure of FIG. 14, internal clock enable signal CKE is applied to clock power supply circuit 11a and clock reproduction circuit 30. Alternatively, a structure can be implemented in which a power down mode designating signal /PD is applied to clock power supply circuit 11a and clock reproduction circuit 30. Power down mode designating signal PD is indicated to be rendered active at substantially the same timing with internal clock enable signal /CKE. However, a structure can be employed in which power down mode designating signal PD is driven to an active state when external clock enable signal extCKE is maintained at an inactive state of an L level over a predetermined number of clock cycles. In a power down mode, a self refresh operation is executed internally. Therefore, internal power supply voltage generation circuit 11b (refer to FIGS. 11–13) has the portion of the standby voltage-down converter operating during the power down mode to maintain the power supply voltage at a constant reference voltage level. Activation/inactivation of clock power supply circuit 11a and clock reproduction circuit 30 is controlled according to clock enable signal CKE or power down mode designating signal PD. The operation controlled by internal clock enable signal CKE will be described hereinbelow.

Internal clock enable signal CKE is generated by a simple buffering of an external clock enable signal extCKE (internal clock enable signal CKE is delayed by a predetermined time with respect to external clock enable signal extCKE). Power down mode designating signal PD is generated according to the state of external clock enable signal extCKE at the rising edge of external clock signal eCLK.

In clock reproduction circuit 30, clock power supply voltage Vccc is applied to the circuit that is susceptible to the effect of noise and a stable output cannot be maintained continuously by the noise, such as the phase comparator, dummy delay, clock delay element portion, and the voltage/current generation unit determining the amount of delay of the clock signal. Since the clock buffer, the driver and the like drive the output load with a relatively great drivability, the operation per se becomes the source of noise. Therefore, periphery power supply voltage Vccp is applied to these buffer/driver to prevent noise from being propagated to clock power supply voltage Vccc.

According to the second embodiment of the present invention, a clock power supply circuit dedicated for the clock reproduction circuit is rendered active only during operation of the clock reproduction circuit, to reduce power consumption when the clock reproduction circuit does not operate. The sub threshold leakage current will not increase during standby (during the power down mode where the clock reproduction circuit takes a standby state) even when a MOS transistor of a low threshold voltage is employed in clock generation circuit 30. Power consumption during the power down mode can be reduced significantly.

The above description is provided for the power supply voltage. However, a similar separate structure is implemented for the ground voltage. In this case, control of the connection between the ground line and the ground node can be implemented by clock enable signal CKE. Also, the substrate potentials of the PMOS and NMOS transistors that are the components can be set as voltage Vccc of power supply line 21 and ground voltage, whereby these substrate potentials are set differently from other circuits.

THIRD EMBODIMENT

Figure 16:
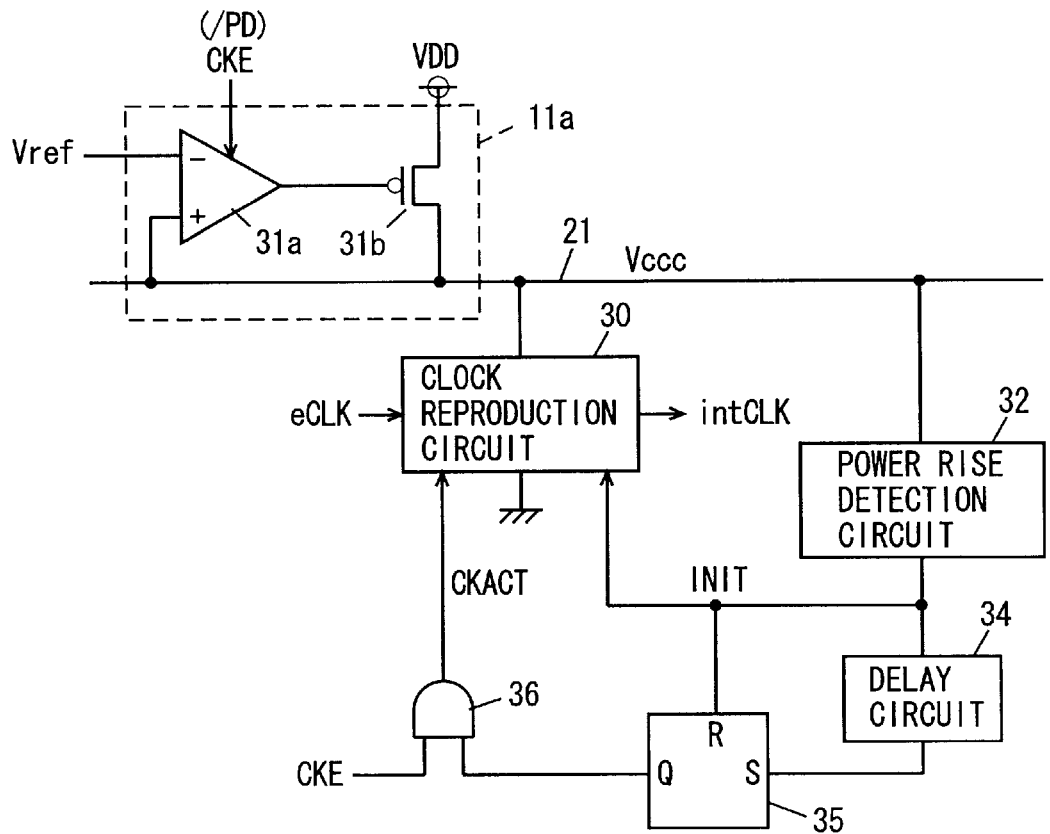
FIG. 16 schematically shows a structure of a main part of a semiconductor integrated circuit device according to a third embodiment of the present invention.

FIG. 16 schematically shows the structure of a main part of a synchronous semiconductor memory device according to a third embodiment of the present invention. Referring to FIG. 16, a power rise detection circuit 32 detecting whether power supply voltage Vccc on power supply line 21 has risen to a predetermined voltage level or not, a delay circuit 34 delaying a rise detection signal INIT from power rise detection circuit 32 for a predetermined time, a set/reset flip flop 35 set in response to a rise of the output signal of delay circuit 34 and reset in response to a rise of rise detection signal INIT from power supply rise detection circuit 32, and a gate circuit 36 receiving the output signal of set/reset flip flop 35 and clock enable signal CKE are provided with respect to clock reproduction circuit 30.

Power rise detection circuit 32 outputs a one shot pulse signal as an initialization signal INIT when power supply voltage Vccc on power supply line 21 arrives at the predetermined voltage level. Clock reproduction circuit 30 has its internal nodes set to the initial state according to initialization signal INIT. As the initialized internal node of clock reproduction circuit 30, a tap stage that selects the output of a delay stage described afterwards is reset to the initial state. A required internal node is initialized according to the structure of clock reproduction circuit 30.

Figure 17:
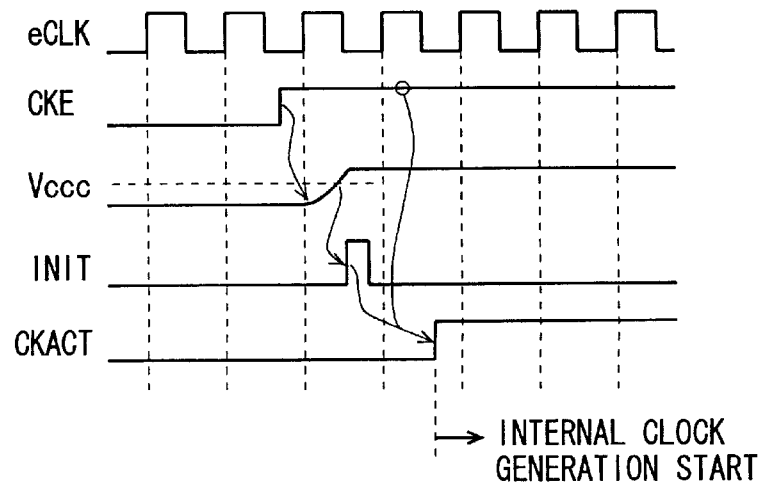
FIG. 17 is a timing chart representing the operation of the circuitry of FIG. 16.

Gate circuit 36 is formed of an AND circuit to output a signal CKACT of an H level to render clock reproduction circuit 30 active when the output signal of set/reset flip flop 35 is at an H level and clock enable signal CKE is at an H level. When output signal CKACT of gate circuit 61 attains an active state of an H level, clock reproduction circuit 30 generates an internal clock signal intCLK according to external clock signal eCLK. Clock power supply circuit 11a has a structure identical to that shown in FIG. 14. Corresponding components have the same reference characters allotted. The operation of the structure shown in FIG. 16 will be described with reference to the timing chart of FIG. 17.

In a power down mode, clock enable signal CKE is at an L level. Clock power supply circuit 11a is at an non operable state. Power supply voltage Vccc is discharged to the level of ground voltage. Clock reproduction circuit 30 is inactive so that the internal clock signal generation operation is stopped.

When the power down mode is released and clock enable signal CKE (internal clock enable signal) is pulled up to an H level, clock power supply circuit 11a is rendered active, whereby power supply voltage Vccc on power supply line 21 is compared with reference voltage Vref. The voltage level of power supply voltage Vccc is raised according to the comparison result. Here, external power supply voltage VDD is supplied continuously even during the power down mode. When power supply voltage Vccc arrives at a predetermined voltage level, power rise detection circuit 32 outputs initialization signal INIT in the form of a one shot pulse signal. The internal node (the node of the delay tap stage) of clock reproduction circuit 30 and set/reset flip flop 35 are reset according to initialization signal INIT. Then, at an elapse of a predetermined time, the output signal of delay circuit 34 is driven to an H level. Set/reset flip flop 35 is set to output a signal of an H level. Since clock enable signal CKE is at an H level, gate circuit 36 responds to the rise of the output signal from set/reset flip flop 35 to drive clock activation signal CKACT to an H level. In response, clock reproduction circuit 30 is rendered active. Thus, clock reproduction circuit 30 can operate when power supply voltage Vccc on power supply line 21 exceeds the predetermined voltage level. Thus, an internal clock signal intCLK in synchronization with external clock signal eCLK can be generated stably and speedily.

According to the structure shown in FIG. 16, gate circuit 36, set/reset flip flop 35 and delay circuit 34 operate using power supply voltage Vccc or Vccp as one operating power supply voltage. A structure can be employed in which set/reset flip flop 35 is reset in response to the rise of clock enable signal CKE instead of initialization signal INIT.

Figure 18:
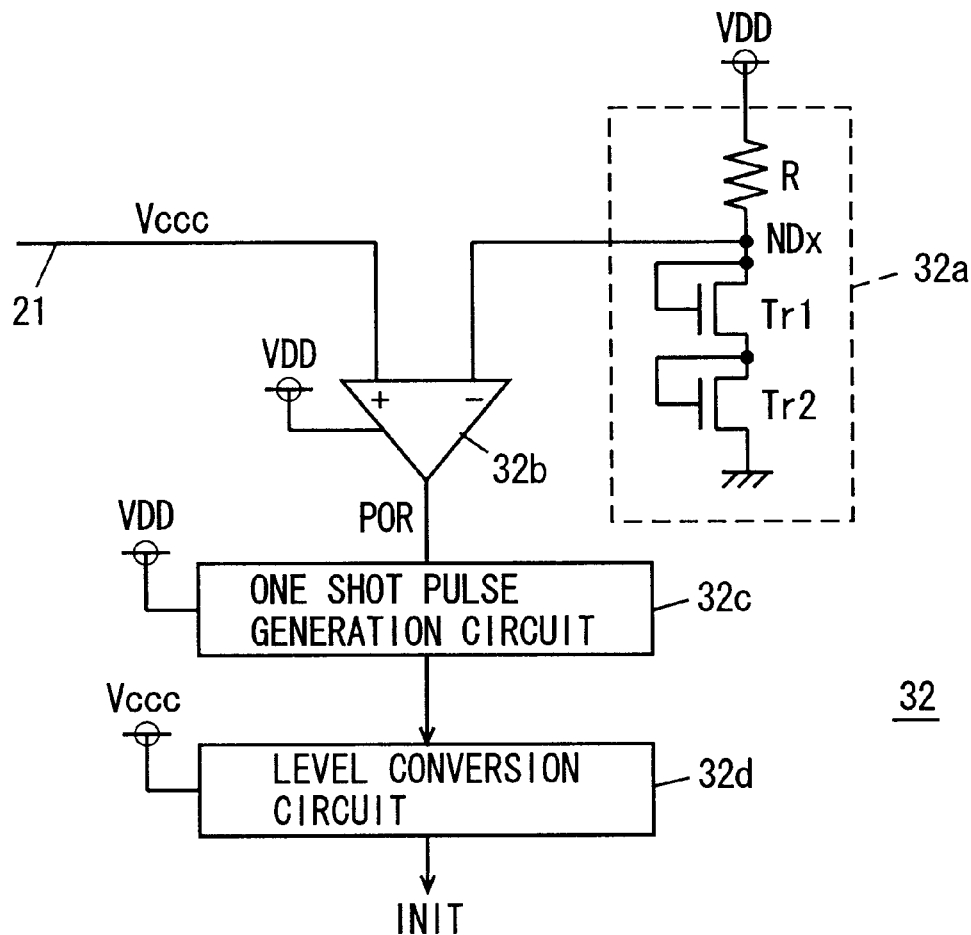
FIG. 18 schematically shows a structure of a power supply rise detection circuit of FIG. 16.

FIG. 18 shows an example of the structure of power rise detection circuit 32 of FIG. 16. Referring to FIG. 18, power rise detection circuit 32 includes a reference voltage generation circuit 32a generating a reference voltage, a comparator 32b comparing power supply voltage Vccc on power supply line 21 with the reference voltage generated by reference voltage generation circuit 32a, a one shot pulse generation circuit 32c responsive to the rise of output signal POR from comparator 32b to generate a one shot pulse signal, and a level converter 32d converting the level of the output signal of one shot pulse generation circuit 32c into the level of power supply voltage Vccc. Comparator 32b and one shot pulse generation circuit 32c operate with external power supply voltage VDD as one operating power supply voltage.

Figure 19:
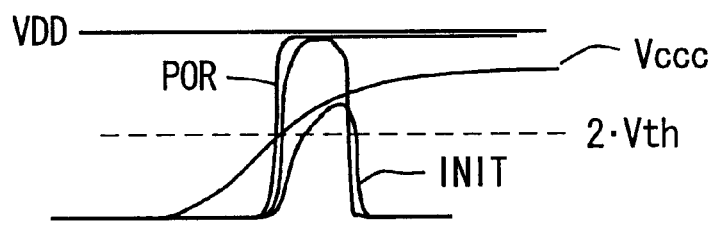
FIG. 19 is a signal waveform diagram representing the operation of the circuit of FIG. 18.

Reference voltage generation circuit 32a includes a resistor R of high resistance connected between the power supply node and a node NDx, and diode-connected n channel MOS transistors Tr1 and Tr2 connected in series between node NDx and ground. The resistance value of resistor R is set to a value sufficiently greater than the channel resistance of MOS transistors Tr1 and Tr2. MOS transistors Tr1 and Tr2 operate in a diode mode. Voltage of 2·Vth is generated at node NDx. Here, Vth is the threshold voltage of MOS transistors Tr1 and Tr2. The operation of power supply rise detection circuit 32 of FIG. 18 will be described with reference to the waveform diagram of FIG. 19.

Reference voltage generation circuit 32a generates a voltage of 2·Vth since external power supply voltage VDD is applied (external power supply voltage is applied even during power down mode). Power supply voltage Vccc is at the level of the ground voltage and the output signal of comparator 32b is at an L level of the ground voltage level in the power down mode. When the power down mode is released, the level of power supply voltage Vccc increases in response to the rise of clock enable signal CKE.

When power supply voltage Vccc exceeds the level of the voltage (2·Vth) from reference voltage generation circuit 32a, signal POR output from comparator 32b is driven to an H level from an L level. In response to the rise of signal POR, one shot pulse generation circuit 32c generates a one shot pulse signal. One shot pulse generation circuit 32c receives external power supply voltage VDD as one operating power supply voltage, and the voltage level of the one shot pulse signal corresponds to the level of external power supply voltage VDD. Level conversion circuit 32d converts the signal of the level of external power supply voltage VDD from one shot pulse generation circuit 32c into a signal of the level of power supply voltage Vccc. Initialization signal INIT of the level of down-converted power supply voltage Vccc is applied to clock reproduction circuit 30.

By employing a MOS transistor of a high threshold voltage as the components of comparator 32b, one shot pulse generation circuit 32c and level conversion circuit 32d, the sub threshold leakage current during the power down mode can be reduced sufficiently to a level that can be neglected. In comparator 32b, a path of current flow from the external power supply node to the ground is present according to the voltage from reference voltage generation circuit 32a. However, power consumption of comparator 32b can be set small enough since high speed response is not required for comparator 32b. Alternatively, a structure in which comparator 32b is maintained at an inactive state during the inactive period of clock enable signal CKE can be employed. A structure of applying clock enable signal CKE (or /CKE) to the gate of the current source transistor of comparator 32b can be employed.

Modification

Figure 20:
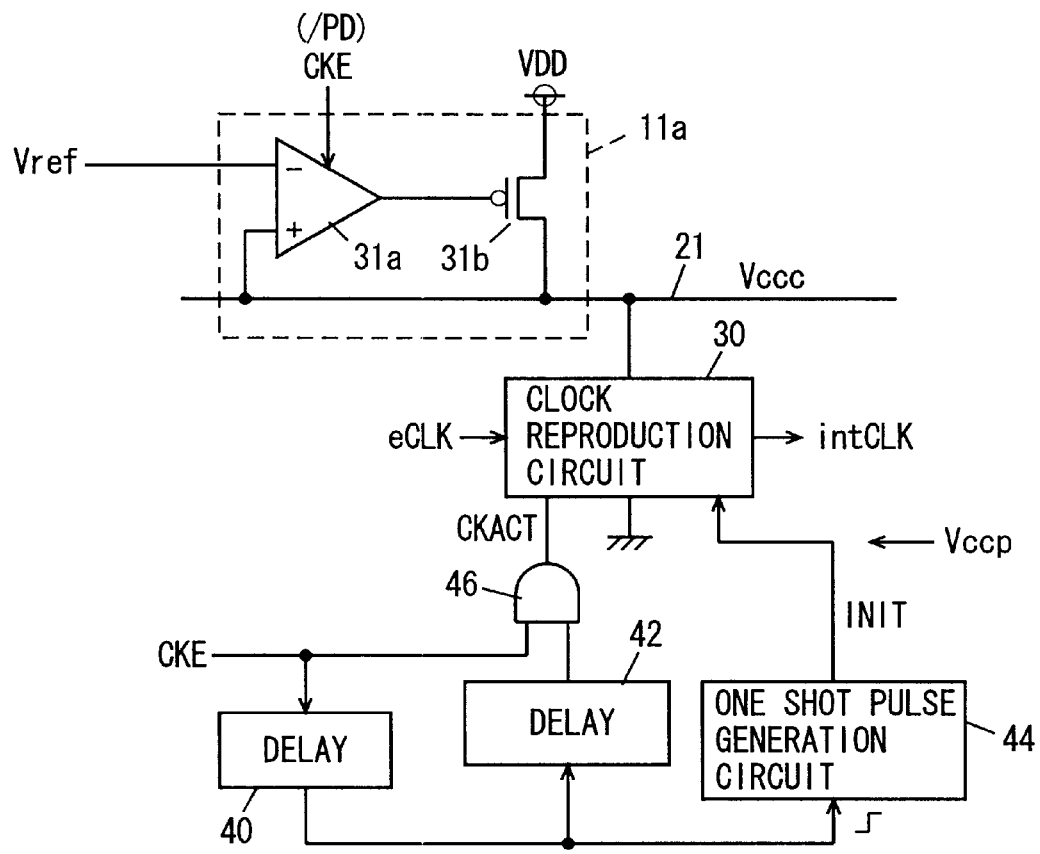
FIG. 20 schematically shows a first modification of the third embodiment.

FIG. 20 shows a modification of the synchronous semiconductor memory device of the third embodiment. In FIG. 20, the structure of the control portion for clock reproduction circuit 30 when the power down mode is released differs from the structure shown in FIG. 16.

Referring to FIG. 20, a delay circuit 40 delaying clock enable signal CKE by a predetermined time, a one shot pulse generation circuit 44 responsive to the rise of the output signal of delay circuit 40 to generate an initialization signal INIT in the form of a one shot pulse, a delay circuit 42 further delaying output signal of delay circuit 40, and a gate circuit 46 receiving clock enable signal CKE and the output signal of delay circuit 42 to generate and apply to clock reproduction circuit 30 a clock activation signal CKACT are provided with respect to clock reproduction circuit 30. One shot pulse generation circuit 44 resets a predetermined node (for example, a tap select circuit of the delay stage) in clock reproduction circuit to the initial state.

Figure 21:
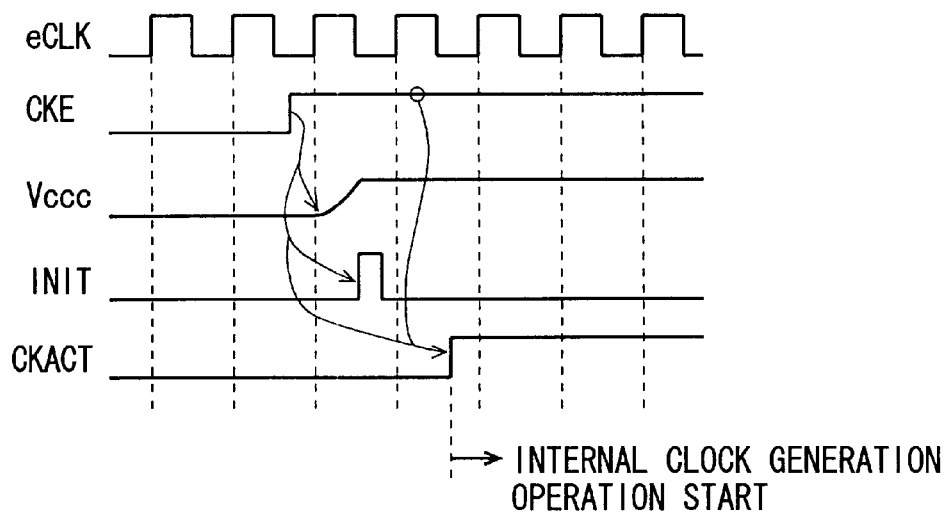
FIG. 21 is a timing chart representing the operation of circuitry of FIG. 20.

Similar to the previously described structure of FIG. 16, clock reproduction circuit 30 is rendered active, when clock activation signal CKACT is active to generate an internal clock signal intCLK phase-locking with external clock signal eCLK. The operation of circuitry of FIG. 20 will be described with reference to the signal waveform diagram of FIG. 21.

In the power down mode, clock enable signal CKE is at an L level. Power supply voltage Vccc is discharged to the level of ground voltage.

When the power down mode is released, clock enable signal CKE is pulled up to an H level. Clock generation circuit 11e is rendered active, and the level of power supply voltage Vccc increases. At an elapse of the delay time of delay circuit 40, one shot pulse generation circuit 44 renders initialization signal INIT active in the form of a one shot pulse to set a predetermined internal node of clock reproduction circuit 30 to the initial state.

When the output signal of delay circuit 42 is pulled up to an H level, clock activation signal CKACT from gate circuit 46 is driven to an H level. Clock reproduction circuit 30 is rendered active, whereby a clock generation operation is initiated.

By selecting an appropriate value of the delay time for delay circuit 40, initialization signal INIT can be driven to an H level when the level of power supply voltage Vccc exceeds a predetermined voltage level, following activation of clock enable signal CKE.

In the structure of FIG. 20, clock enable signal CKE must be delayed. There is a possibility that a desired delay time cannot be provided when power supply voltage Vccc is employed as the operating power supply voltage of delay circuits 40 and 42. Therefore, periphery power supply voltage Vccp is supplied as the operating power supply voltage to delay circuits 40 and 42. Accordingly, delay circuits 40 and 42 operate stably even when the level of power supply voltage Vccc is unstable, and respective output signals can be driven to an H level with the desired delay time.

According to the structure shown in FIG. 20, the level of power supply voltage Vccc is not detected. Initialization and activation of clock reproduction circuit 30 are effected at the elapse of a predetermined time in response to the rise of clock enable signal CKE. Therefore, initialization of the clock reproduction circuit and the start of the clock generation operation can be carried out at the proper timing (since this is identical to the structure of determining the operation timing using a timer).

According to the third embodiment of the present invention, initialization and activation of the clock reproduction circuit are effected sequentially following activation of an internal clock power supply circuit according to a clock enable signal. Therefore, the synchronizing operation of the clock reproduction circuit can be effected when the power supply voltage is rendered stable. An internal clock signal can be generated speedily and stably when the power down mode is released.

The structures shown in FIGS. 16–20 are not limited to the case when the power down mode is released, and are applicable to the case where the power is turned on. A structure of turning the power on with clock enable signal CKE at an H level or of driving clock enable signal CKE to an H level at a predetermined timing after power-on can be employed. An internal clock signal phase-locking with the external clock signal can be generated at high speed, subsequent to power-on. Since reference voltage Vref is generated from an external power supply voltage, external power supply voltage VDD arrives at a constant voltage level prior to the arrival of power supply voltage Vccc to the stable level. Therefore, an operation similar to that when the power down mode is released can be carried out when the power is turned on.

The referenced delay herein can be a delay by a logic gate of transistors, an RC delay by a parasitic resistor R and parasitic capacitor C, or a delay generated according to the count value of a counter that counts the number of input clocks.

By a combination with the level detection circuit shown in FIG. 18, the logical product (AND) result of the signal output from the level detection circuit of FIG. 18 and clock enable signal CKE can be applied to delay circuit 40. In this case, a signal corresponding to signal POR, not one shot signal INIT, is used as the output signal of the level detection circuit.

FOURTH EMBODIMENT

Structure 1 of Clock Reproduction Circuit

Figure 22:
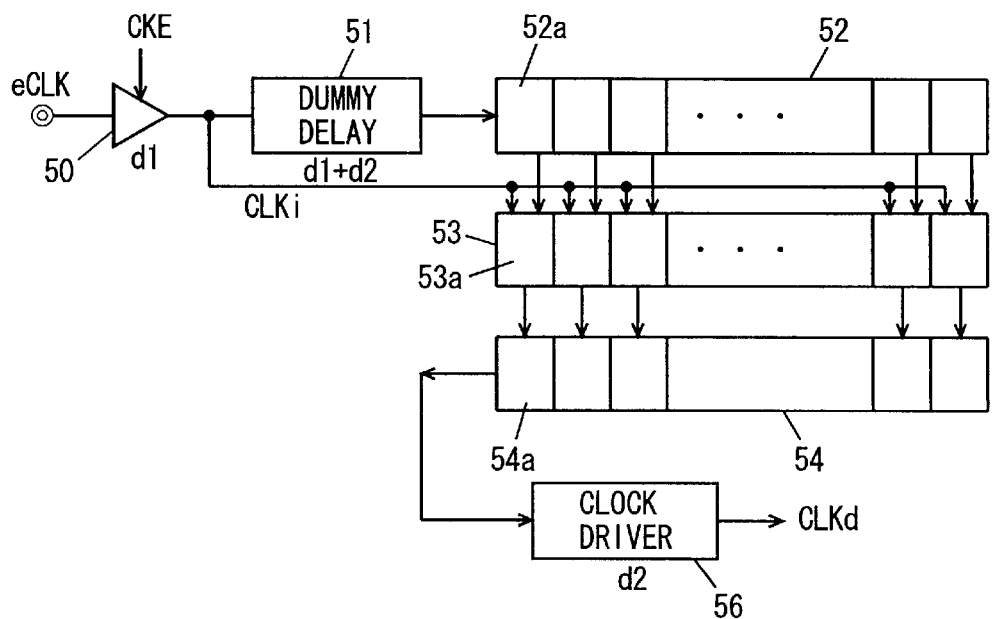
FIG. 22 schematically shows a structure of the SMD of FIG. 9.

FIG. 22 shows an example of a clock reproduction circuit. In FIG. 22, the structure of a synchronous mirror delay 4b in synchronizing clock generation circuit 4 is shown. Referring to 22, SMD 4b includes a dummy delay circuit 51 delaying internal clock signal CLKi from clock input buffer 50 by a predetermined time of d1+d2, a forward delay array 52 having a plurality of delay stages 52a and delaying the output signal of dummy delay circuit 51, a mirror control circuit 53 comparing internal clock signal CLKi with the output of each delay stage of forward delay array 52 to transmit a matching output signal, a backward delay array 54 delaying an output signal selected by mirror control circuit 53, and a clock driver 56 buffering the output signal of backward delay array 54 to generate a synchronizing internal clock signal CLKd.

Clock input buffer 50 is shown corresponding to comparators 3a and 3b of FIG. 8A. However, clock input buffer 50 may be a circuit that generates a control signal of a doubled frequency with the edge of internal clock signals CLKa and /CLKi as the trigger in controller 4a shown in FIG. 9. Clock input buffer 50 is rendered active, when internal clock enable signal CKE is active, to generate an internal clock signal according to external clock signal eCLK (or internal clock signals CLKi, /CLKi). Clock input buffer 50 has a delay time d1. Dummy delay circuit 51 has a delay time d1+d2. Delay time d2 is equal to the delay time of clock driver 56.

Forward delay array 52 includes a plurality of cascaded delay stages 52a each to delay the clock signal applied from dummy delay circuit 51 and transmit the delayed signal to the delay circuit of the next stage and to mirror control circuit 53. Mirror control circuit 53 includes select gates 53a provided corresponding to respective plurality of delay stages 52a in forward delay array 52. Select gate 53a determines whether the phase of clock signal CLKi from clock input buffer 50 matches the phase of the output signal of a corresponding delay stage 52a in forward delay array 52 to select and transmit to backward delay array 54 the clock signal having a matching phase.

Backward delay array 54 includes delay stages 54a provided corresponding to respective select gates 53a in mirror control circuit 53. The delay time of delay stage 54a of backward delay array 54 is equal to the delay time of delay stage 52a in forward delay array 52. Backward delay array 54 receives and transmits the clock signal selected by mirror control circuit 53.

Figure 23:
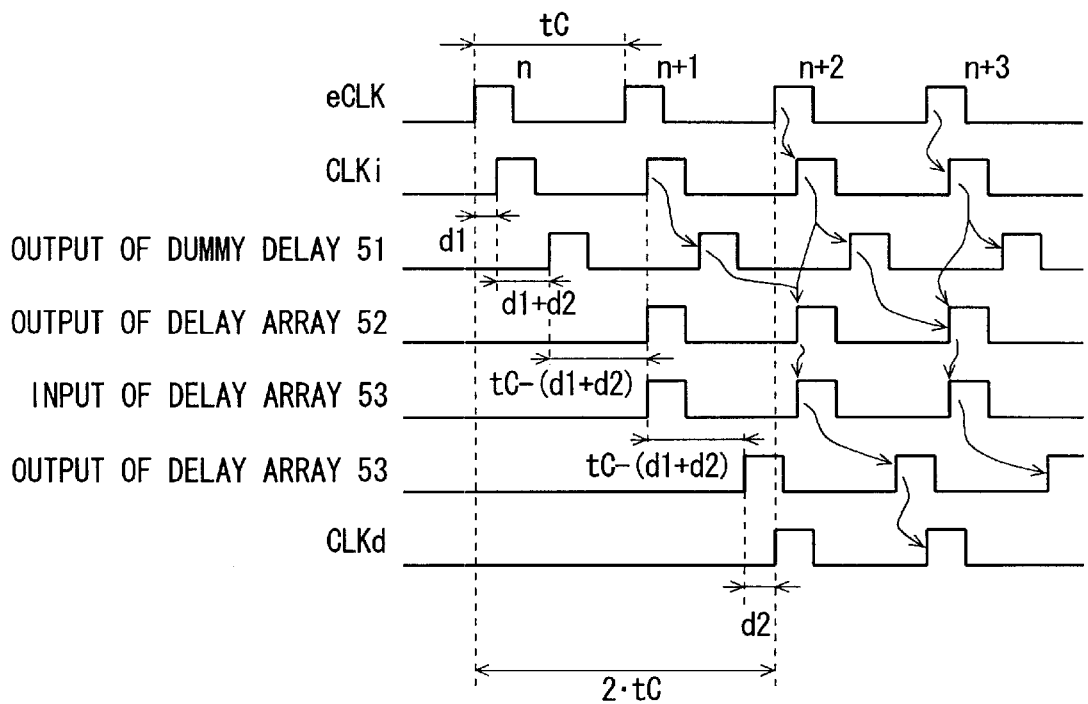
FIG. 23 is a timing chart representing the operation of the SMD of FIG. 22.
Figure 26:
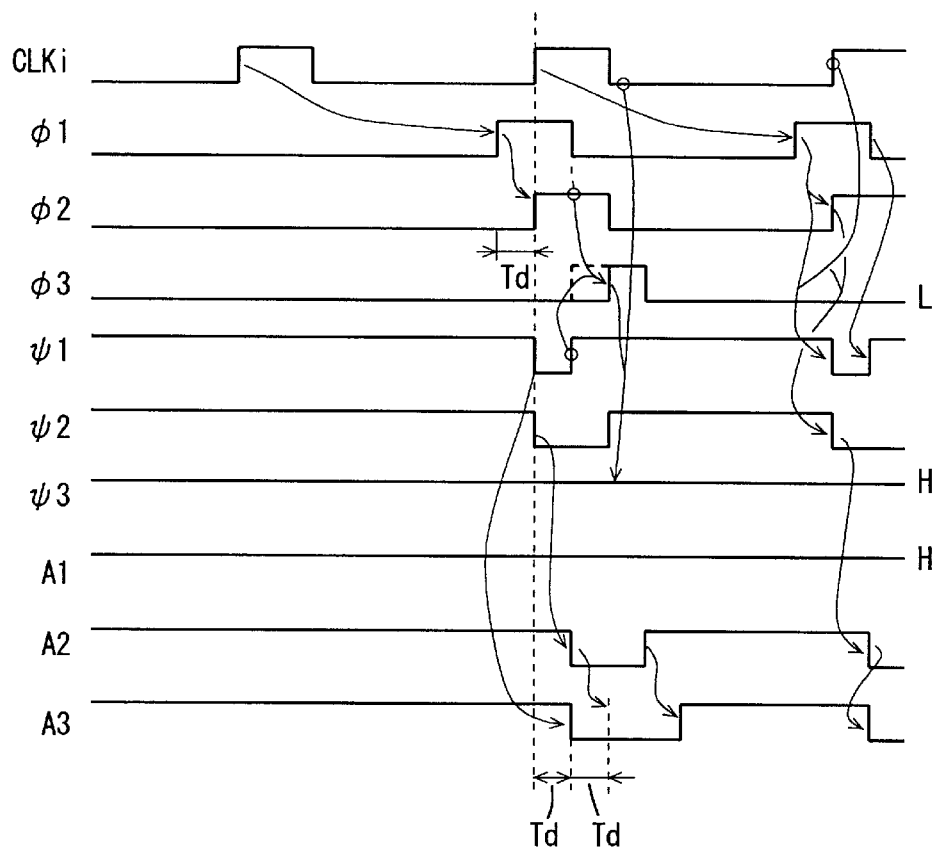
FIG. 26 is a timing chart representing the operation of circuitry of FIG. 25.

The operation of SMD 4b of FIG. 22 will be described with reference to the timing chart of FIG. 23. The clock signal applied to SMD 4b is external clock signal eCLK (as shown in FIG. 10, the signal applied to SMD 4b may be a clock signal of a doubled frequency of internal clock signal CLKi). The period of external clock signal eCLK is tC. Clock enable signal CKE is assumed to be at an active state of an H level. An internal clock signal CLKi delayed for delay time d1 is generated from clock input buffer 50 with respect to external clock signal eCLK. Internal clock signal CLKi is applied to mirror control circuit 53, and also applied to forward delay array 52 via dummy delay circuit 51. Dummy delay circuit 51 has a delay time of d1+d2. Forward delay array 52 delays the signal applied from dummy delay circuit 51 on a basis of the delay time of unit delay stage 52a to sequentially transmit the delayed signal. Mirror control circuit 53 compares internal clock signal CLKi with the output signal of each delay stage in forward delay array 52 to select the clock signal with the matching phase. Since a clock signal is not output from forward delay array 52 for the first (n-th) clock signal, the signal output from mirror control circuit 53 is also at an L level.

When the (n+1)th clock signal eCLK is applied, a signal delayed by delay time d1 is output from clock input buffer 50. Mirror control circuit 53 compares the phase of the clock signal output from forward delay array 52 with the phase of this (n+1)th clock signal eCLK. A signal phase-locking with this (n+1)th clock signal CLKi is selected by mirror control circuit 53 to be transferred to backward delay array 54. Delay stage 54a of backward delay array 54 has a delay time identical to the delay time of delay stage 52a of forward delay array 52. When the phases match, the signal output from forward delay array 52 is phase-locking with the (n+1)th internal clock signal CLKi. Therefore, the output signal of forward delay array 52 has a delay time of tC−(d1+d2) with respect to the output signal from dummy delay circuit 51. The output signal of forward delay array 52 is selected by mirror control circuit 53 to be transmitted to backward delay array 54. Backward delay array 54 delays the signal by a delay time identical to that of forward delay array 52 to provide the output clock signal to clock driver 56. Clock driver 56 has a delay time of d2. Therefore, clock signal CLKd output from clock driver 56 has a delay time T represented by the following equation with respect to the n-th clock signal eCLK.

$$T=d1+(d1+d2)+2\cdot\{tC-(d1+d2)\}+d2=2\cdot tC$$

Therefore, clock signal CLKd from clock driver 56 is delayed by 2 clock cycles with respect to the n-th clock signal eCLK. Therefore, the output clock signal CLKd is phase-locking with the (n+2)th clock signal eCLK. The operation is repeated thereafter, whereby a clock signal phase-locking with external clock signal eCLK is output from clock driver 56.

FIG. 24 shows the structure of respective unit stages of forward delay array 52, mirror control circuit 53 and backward delay array 54 of FIG. 22. Referring to FIG. 24, delay stage 52a in forward delay array 52 includes a NAND circuit 52aa receiving the signals applied to input nodes UIN1 and UIN2, and an inverter 52ab inverting the output signal of NAND circuit 52aa. Select gate 53a in mirror control circuit 53 includes a NAND circuit 53aa receiving clock signal CLKi and signal UOUT1 output from inverter 52ab of delay stage 52a. The output signal of NAND circuit 53aa is applied to the delay stage of the subsequent stage in forward delay array 52 as an input signal, which connection will be described in details afterwards.

Delay stage 54a in backward delay array 54 includes a NAND circuit 54aa receiving the output signal of select gate 53a and output signal BIN of the preceding delay stage, an inverter circuit 54ab receiving the output signal of NAND circuit 54aa to generate output signal BOUT transmitted to the delay circuit of the succeeding stage, and a NAND circuit 54ac receiving the output signal of inverter circuit 54ab and the ground voltage. NAND circuit 54ac corresponds to select gate 53aa and equalizes the delay time of delay stage 54a in backward delay array 54 with the delay time of delay stage 52a in forward delay array 52 (equalize the output loads of inverters 52ab and 54ab). Accordingly, the delay time of each stage in the forward delay array and the backward delay array can be made equal.

FIG. 25 schematically shows the connection of each delay stage and select gate of forward delay array 52, mirror control circuit 53 and backward delay array 54. Referring to FIG. 25, each of forward delay stages 52a-1~52a-3 receives the output signal of the preceding delay stage and the output signal of a preceding-by-two stage of select gates 53a-1~53a-3. Each of delay stages 54a-1~54-3 of backward delay array 54 receives the output signal of a corresponding one of select gates 53a-1~53a-3 and the output signal of the preceding stage of delay stages 54a-2~54a-4 (not shown). Ground voltage is commonly applied to NAND circuits 54ac serving as respective load capacitors of delay stages 54a-1~54a-3. The last stage of backward delay array 54 (provided corresponding to the last delay stage of forward delay array 52) receives the output signal of a corresponding select gate and power supply voltage Vccc. The operation of the SMD shown in FIGS. 24 and 25 will be described with reference to the signal waveform diagram of FIG. 22.

It is now considered that an output signal φ2 of delay stage 52a-2 is in phase with clock signal CLKi. The delay time of delay stages 52a-1~52a-3 and 54a-1~54a-3 is ½ the pulse width of clock signal CLKi.

The clock signal CLKi is sequentially delayed in forward delay array 52. Output signal φ1 of delay stage 52a-1 is ahead in phase of internal clock signal CLKi. When output signal φ1 of delay stage 52a-1 is driven to an H level, output signal ψ1 of select gate 53a-1 is at the L level during the H level period of internal clock signal CLKi and signal φ1. Here, it is assumed that the delay time of select gates 53a-1~53a-3 of the mirror control circuit is negligible. Output signal ψ1 of select gate 53a-1 is applied to delay stage 54a-1 and also to delay stage 52a-3. Therefore, delay stage 52a-2 delays signal φ1 by a predetermined time to generate a signal φ2. This signal φ2 is phase-locking with internal clock signal CLKi. In response to signal φ2, output signal ψ2 of select gate 53a-2 is pulled down to an L level. When signal φ1 attains an L level, output signal ψ3 from delay stage 52a-3 maintains the L level even when signal φ2 input to delay stage 52a-3 changes.

In response to the rise of output signal ψ1 of select gate 53a-1 to an H level, the output signal of delay stage 52a-3 changes according to signal φ2. Signal φ3 attains an H level at an elapse of the delay time of delay stage 52a-3 from the rise of signal ψ1 to an H level. Therefore, the H level period of signal φ3 is equal to the common H level period of both signals φ2 and ψ1. When signal φ3 rises to an H level, signal ψ3 output from select gate 53a-3 maintains the H level since clock signal CLKi is at an L level. In the forward delay array, the signal output from the succeeding delay stage maintains the L level to inhibit transmission of a clock signal to subsequent stages.

In contrast, signal ψ3 is at an H level. Therefore, signal A1 output from delay stage 54a-3 is driven to an H level (in the backward delay array, the output signal of the preceding delay stage is at an H level). Since signal A1 is at H level, delay stage 54ac receives output signal ψ2 of select gate 53a-2 to delay the signal by a predetermined delay time for output. In delay stage 54a-1, signal A3 attains an L level regardless of the state of signal A2 when signal φ1 is driven to an L level. More specifically, in response to signal ψ1 attaining an L level, signal A3 is pulled down to an L level at an elapse of the delay time of delay stage 54a-1, and then maintained at the L level even when signal ψ1 is sequentially pulled up to an H level since signal ψ2 is now at an L level. When signal A2 attains an H level, signal A3 is driven to an H level at an elapse of the delay time of delay stage 54a-1. This signal A3 is sequentially transmitted through the delay stages of the backward delay array. The signal output from the backward delay array is phase-locking with clock signal CLKi although including an error at one delay stage. By selecting an appropriate value for the delay time of delay stages 52a-1~52a-3 and 54a-1~54a-3, an internal clock phase-locking with clock signal CLKi can be generated at high accuracy.

Since a NAND circuit is employed for select gates 53a-1~53a-3 in the structure of FIG. 24, the clock signal transmitted through the forward delay array is inverted to be applied to the backward delay array. An inverter circuit is provided at an appropriate location to set clock signals CLKd and CLKi into clock signals of the same phase.

In order to reset the internal nodes in the SMD, a structure is employed in which the signal line transmitting the clock signal from clock input buffer 50 (the output of clock input buffer 50) is reset to an L level at the time of initialization since the clock signal line is unstable when the power is turned on. In this case, signals ψ1–ψ3 are reset to an H level.

Structure 2 of Clock Reproduction Circuit

Figure 27:
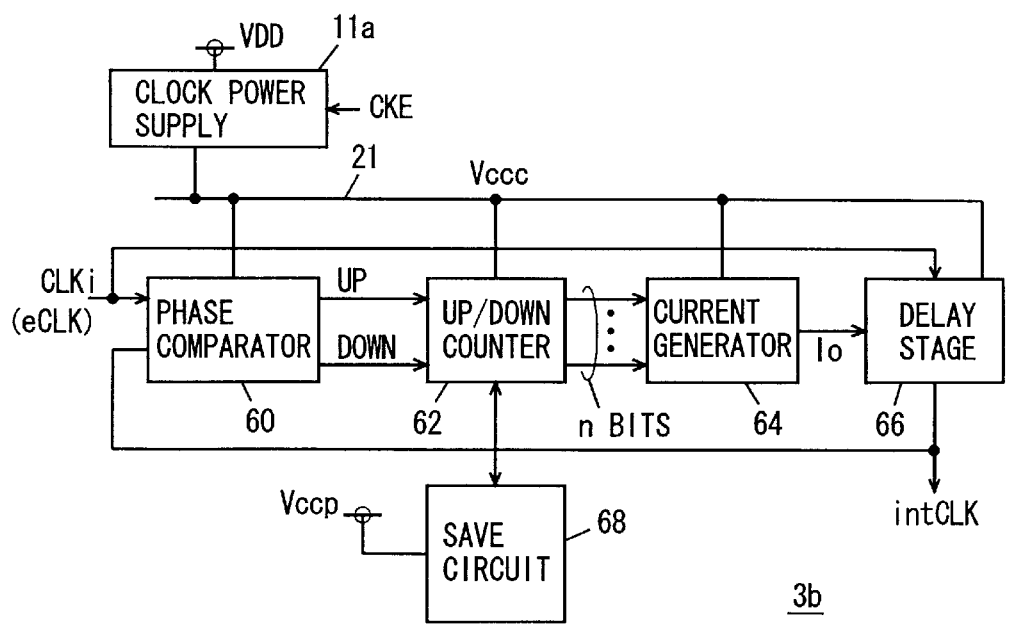
FIG. 27 schematically shows a structure of a main part of a semiconductor integrated circuit device according to the fourth embodiment of the present invention.

FIG. 27 schematically shows another structure of a clock reproduction circuit. The clock reproduction circuit of FIG. 27 has a DLL structure. This DLL 3b includes a phase comparator 60 comparing signal CLKi (or external clock signal eCLK) with an internal clock signal intCLK, an up/down counter 62 counting up/down designating signals UP and DOWN from phase comparator 60, a current generator 64 converting the output signal of n bits from up/down counter 62 into current information, a delay stage 66 operating with the operating current determined by a current I0 from current generator 64 to delay clock signal CLKi to generate internal clock signal intCLK, and a save circuit 63 saving the count value of up/down counter 62 when clock enable signal CKE is active/inactive.

Phase comparator 60, up/down counter 62, current generator 64 and delay stage 66 receive power supply voltage Vccc on power supply line 21 as an operating power supply voltage. Save circuit 68 receives periphery power supply voltage Vccp as an operating power supply voltage. Clock power supply circuit 11a is rendered inactive when clock enable signal CKE is inactive, whereby power supply voltage Vccc on power supply line 21 is discharged to the level of the ground voltage.

During inactivation of clock enable signal CKE, i.e., in a power down mode, the count value of up/down counter 62 is saved in save circuit 68 to be retained therein. When the power down mode is released, the count value stored in save circuit 68 is transferred to up/down counter 62. Accordingly, an internal signal intCLK phase-locking with clock signal CLKi can be generated speedily even when the power down mode is released. The structure of each component will be described briefly.

FIG. 28 shows an example of the structure of phase comparator 60 of FIG. 27. Referring to FIG. 28, phase comparator 60 includes an inverter 60a receiving initialization designating signal PREP, a NAND circuit 60b receiving initialization designating signal PREP and clock signal CLKi, a NOR circuit 60c receiving clock enable signal /CKE and a test mode designating signal TEST, a NAND circuit 60d receiving initialization designating signal PREP and internal clock signal intCLK, a NAND circuit 60e receiving the output signal of inverter 60a and clock signal CLKi, an inverter 60f receiving the output signal of NAND circuit 60b, an inverter 60g receiving the output signal of NOR circuit 60c, a NAND circuit 60h receiving the output signals of NAND circuits 60d and 60e, a NAND circuit 60i receiving the output signal of inverter 60f at its first input, a NAND circuit 61j receiving the output signal of inverter 60f at its first input, a NAND circuit 60k receiving the output signals of NAND circuits 60j and 60s to provide the output signal to the second input of NAND circuit 60j, a NAND circuit 60l receiving the output signal of NAND circuit 60s at its first input, a NAND circuit 60m receiving the output signals of NAND circuits 60l and 60h to provide the output signal to the second input of NAND circuit 60l, a NAND circuit 60n receiving the output signals of NAND circuits 60m and 60h, a NAND circuit 60o receiving the output signal of NAND circuit 60i at its first input, a 3-input NAND circuit 60p receiving the output signals of NAND circuits 60o, 60j and 60s to provide the output signal to the second input of NAND circuit 60o, and a NAND circuit 60q receiving the output signals of NAND circuits 60s, 60m and 60r. NAND circuit 60r receives the output signals of NAND circuits 60q and 60n.

Phase comparator 60 further includes a NOR circuit 60t receiving the output signals of inverter 60g and NAND circuit 60p, two stages of cascaded inverters 60u and 60v receiving the output signal of NOR circuit 60t, a NOR circuit 60w receiving the output signals of NAND circuit 60q and inverter 60g, and two stages of cascaded inverters 60x and 60y receiving the output signal of NOR circuit 60w. Count up designating signal UP is output from inverter 60v. Count down designating signal DOWN is output from inverter 60i.

NAND circuits 60j and 60k form a flip flop that is set and reset when the output signal of inverter 60f is at an L level and the output signal of NAND circuit 60s is at an L level, respectively. NAND circuits 60l and 60m form a flip flop that is set and reset when the output signal of NAND circuit 60h is at an L level and the output signal of NAND circuit 60s is at an L level, respectively.

NAND circuits 60o and 60p form a flip flop that is set and reset when the output signal of NAND circuit 60i is at an L level and the output signal of NAND circuit 60j or 60s is at an L level, respectively. NAND circuits 60q and 60r form a flip flop that is set and reset when the input signal of NAND circuit 60n is at an L level and the output signal of NAND circuit 60m or 60s is at an L level, respectively.

Figure 29:
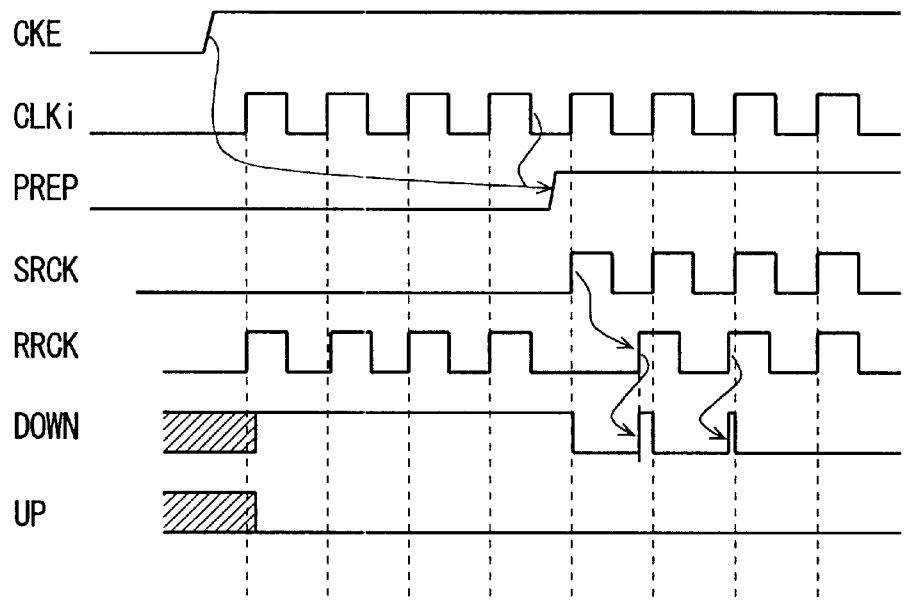
FIG. 29 is a timing chart representing the operation of circuitry of the FIG. 28.

The operation of phase comparator 60 of FIG. 28 will be described with respect to the timing chart of FIG. 29.

In the power down mode, clock enable signal CKE is at an L level. Power supply voltage Vccc of the ground voltage level is applied to phase comparator 60. When the power down mode is released and power supply voltage Vccc arrives at a constant voltage level and is stabilized, clock enable signal CKE for the clock reproduction circuit is driven to an H level (refer to third embodiment). In response to clock enable signal /CKE rising to an H level, signal CKE applied to NOR circuit 60c attains an L level. NOR circuit 60c and inverter 60g operate as a buffer circuit.

At the time of initialization, the states of up and down designating signals UP and DOWN are unstable. Therefore, initialization designating signal PREP is maintained at an L level. Under this state, in response to the output signal of NAND circuit 60b attaining an H level, signal SRCK from inverter 60f is fixed at an L level. When the output signal of NAND circuit 60d is pulled up to an H level, clock signal CLKi is transmitted via NAND circuits 60e and 60h. Signal RFCK changes in synchronization with clock signal CLKi. In response to the rise of signal RRCK to an H level, the output signal of NAND circuit 60n attains an L level and the output signal of NAND circuit 60r attains an H level since the output signal of NAND circuit 60m is at an H level. When the output signal of NAND circuit 60s is at an H level, NAND circuit 60q provides an output signal of an L level whereas NOR circuit 60w provides an output signal of an H level. In response, down designating signal DOWN is set at an H level.

When the output signal of NAND circuit 60s is at an L level, i.e., when the output signals of NAND circuits 60o and 60r each are at an H level, the output signal from NAND circuit 60q attains an H level, whereby down designating signal DOWN is set at an L level. Under this state, the output signal of NAND circuit 60l attains an H level. In response, the output signal of NAND circuit 60m is pulled down to an L level and the output signal of NAND circuit 60n is pulled up to an H level. In response to the output signal of NAND circuit 60n attaining an H level, NAND circuit 60r has both inputs driven to an H level. The output signal from NAND circuit 60r is driven to an L level. The output signal of NAND circuit 60s is driven to an H level. Therefore, when signal RRCK rises again to an H level at the next cycle, down designating signal DOWN is reliably driven to an H level. When the output signal of NAND circuit 60s is driven to an H level, the flip flop formed of NAND circuits 60o and 60p maintain the initial latching state since the output signal of NAND circuit 60j is at an H level. Therefore, count up signal UP is maintained at a voltage level corresponding to the initially set, latching state of NAND circuits 60o and 60p.

At the completion of the initialization operation, initialization signal PREP is driven to an H level. Inverter 60a provides an output signal of an L level. In response, the output signal of NAND circuit 60e is fixed at an H level. Internal clock signal intCLK is transmitted as a signal RRCK via NAND circuits 60d and 60h. Clock signal CLKi is transmitted as signal SRCK via NAND circuit 60b and inverter 60f. When signal SRCK is pulled from an L level to an H level under this state, NAND circuit 60i provides an output signal of an L level. In response, NAND circuit 60o provides an output signal of an H level and NAND circuit 60p provides an output signal of an L level. In response to the output signal of an H level from NAND circuit 60o, NAND circuits 60s and 60q provide output signals of an L level and an H level, respectively, since the output signal of NAND circuit 60r is at an H level. Accordingly, down designating signal DOWN is driven to an L level. When signal SRCK is pulled down to an L level, NAND circuit 60p provides an output signal of an H level. Accordingly, up designating signal UP is pulled down to an L level.

Next, phase comparison between signals SRCK and RRCK is carried out. Here, signal RRCK is a delayed version of signal CLKi. In response to the rise of signal RRCK, down designating signal DOWN is driven to an H level and signal SRCK is pulled up to an H level. Down designating signal DOWN is reset to an L level. Under this state, count up designating signal UP maintains the L level. In other words, when signal RRCK is driven to an H level prior to signal SRCK, NAND circuit 60q is driven to an L level, whereby down designating signal DOWN is pulled up to an H level. The output signal of NAND circuit 60r is maintained at an H level. When signal SRCK is then driven to an H level, NAND circuit 60o provides an output signal of an H level and NAND circuit 60s provides an output signal of an L level. Down designating signal DOWN is reset to an L level. Signal UP is maintained at an L level. In contrast, when signal SRCK is pulled up earlier than RRCK (when the phase advances), an output signal of an H level from NAND circuit 60o causes the output signal of NAND circuit 60p to be driven to an L level. Count up designating signal UP is driven to an H level. When signal RRCK then rises to an H level, output signals of NAND circuits 60r, 60s and 60p are driven to an H level, an L level and an H level, respectively. Count up signal UP is reset to an L level, while count down designating signal DOWN maintains the L level (since output signal of NAND circuit 60m is maintained at an H level due to the latching state of NAND circuits 60q and 60r).

When the phases of signals SRCK and RRCK are equal, the output signal of NAND circuit 60s maintains an L level. Therefore, signals UP and DOWN both maintain an L level. Accordingly, count up designating signal UP and count down designating signal DOWN can be generated according to the difference in phase between signals SRCK and RRCK, i.e., clock signals CLKi and intCLK.

Up/down counter 62 is formed of a general bi-directional binary counter to increment and decrement the count value when count up designating signal UP is active and count down designating signal DOWN is active, respectively. The delay amount becomes smaller as the count value becomes greater. The delay amount becomes greater as the count value becomes smaller.

Figure 30:
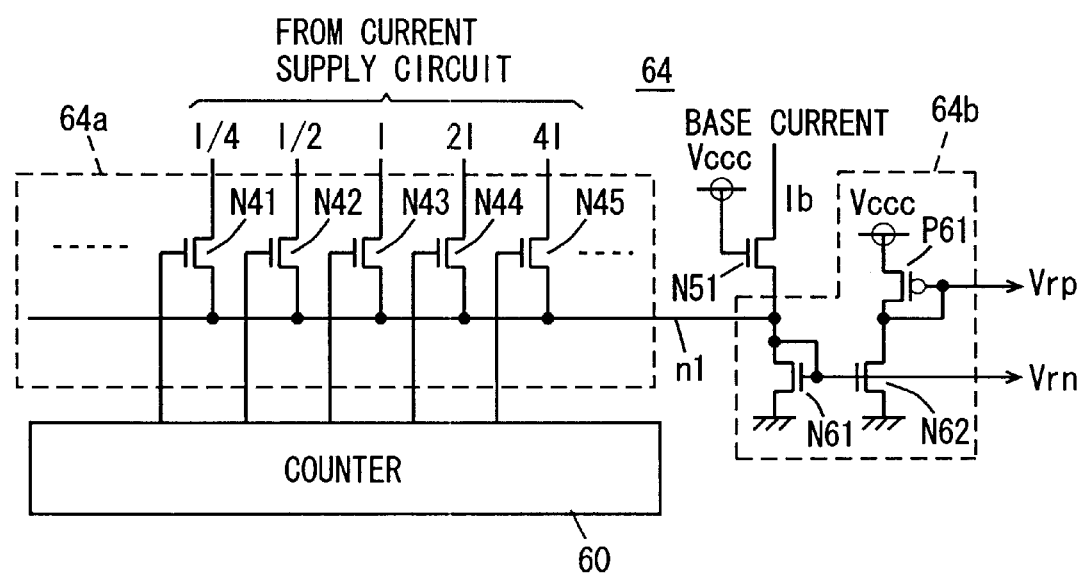
FIG. 30 shows an example of a structure of the current generator of FIG. 27.

FIG. 30 schematically shows a structure of current generator 64 of FIG. 27. Referring to FIG. 30, current generator 64 includes a current combining circuit 64a generating a current corresponding to the value of the count of counter 60, and a voltage generation circuit 64b generating reference voltages Vrp and Vrn determining the operating current of the delay stage according to the output signal of current combining circuit 64a. Current combining circuit 64a includes n channel MOS transistors N41, N42, N43, N44 and N45 for supplying a current I/4, I/2, I, 2I, 4I, . . . according to the digits of the count value in counter 60. MOS transistors N41–N45 have their source nodes connected common to node n1. Although an n channel MOS transistor (current source transistor) corresponding to the respective count bits of counter 60 is provided in count combining circuit 64a, five MOS transistors N41–N45 are shown representatively in FIG. 30. Alternatively, a structure can be employed in which the count value of counter 60 is decoded and the current source transistor of count combining circuit 64a is selectively rendered conductive.

An n channel MOS transistor N51 supplying a base current Ib to free-run the delay stage is connected to node n1. MOS transistor N51 receives operating power supply voltage Vccc at its gate, and has its source connected to node n1. Voltage generation circuit 64b includes an n channel MOS transistor N61 connected between node n1 and the ground node and having a gate connected to node n1, a p channel MOS transistor P61 having a source receiving power supply voltage Vccc, and a gate and drain connected in common, and an n channel MOS transistor N62 connected between MOS transistor P61 and the ground node and having a gate connected to node n1. Reference voltage Vrp is output from the gate of MOS transistor P61. Reference voltage Vrn is output from the gates of n channel MOS transistors N61 and N62. MOS transistors N61 and N62 form a current mirror circuit. A current of the same magnitude flows through MOS transistors N61, N62 and P61. MOS transistors P61 and N61 generate voltages Vrp and Vrn according to the drain currents by the interconnection of the gates and drains.

According to the structure of current combining circuit 64a of FIG. 30, MOS transistors N41–N45 are selectively rendered conductive according to the count bits of counter 60, whereby a current according to the count value is transmitted to node n1. Therefore, a current of the sum of the current from current generation circuit 64a to node n1 and base current Ib flows through voltage generation circuit 64b. Reference voltages Vrp and Vrn are generated according to the sum current.

Figure 31:
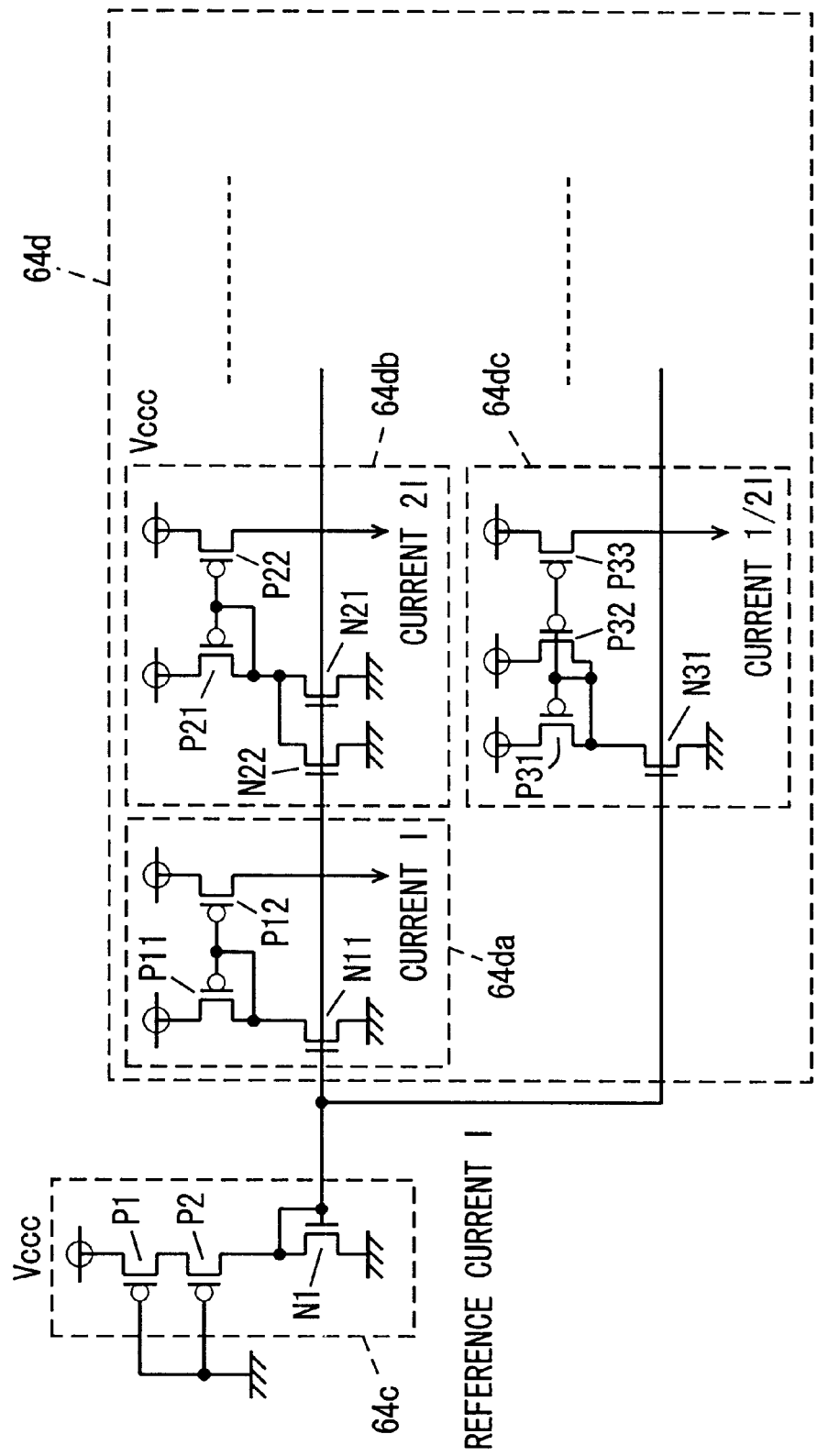
FIG. 31 shows a structure of a current supply circuit included in the current generator of FIG. 27.

FIG. 31 shows an example of a structure of a current supply circuit that supplies current to count combining circuit 64a. Referring to FIG. 31, the current supply circuit includes a reference current source 64c generating a reference current I, and a weighted current generation circuit 64d generating currents I, 2·I, and ½·I according to reference current I from reference current source 64c.

Reference current source 64c includes p channel MOS transistors P1 and P2 having their gates connected to the ground to function as a constant current source, and an n channel MOS transistor N1 connected between MOS transistor P2 and the ground node and having a gate connected to a drain thereof. P channel MOS transistors P1 and P2 operate in a resistance mode to supply a constant current.

Weighted current generation circuit 64d includes a cell current sources 64da, 64db, 64dc, . . . provided corresponding to weighted currents I, 2I, ½I, . . . , respectively. In FIG. 31, three cell current sources 64da–64dc are indicated representatively.

Cell current source 64da includes an n channel MOS transistor N11 that forms a current mirror circuit with an n channel MOS transistor N1, a p channel MOS transistor P11 connected between the power supply node and MOS transistor N11 and having a gate connected to the drain of MOS transistor N11, and a p channel MOS transistor P12 connected between the power supply node and the output node and having a gate connected to the gate of MOS transistor P11.

Cell current source 64*db* includes n channel MOS transistors N21 and N22 connected parallel to each other and having gates connected to the gate of MOS transistor N1, a p channel MOS transistor P21 connected between the drains of MOS transistors N21 and N22 and the power supply node and having a gate connected to the drains of MOS transistors N21 and N22, and a p channel MOS transistor P22 connected between the output node and the power supply node and having a gate connected to the gate of MOS transistor P21.

Cell current source 64*dc* includes an n channel MOS transistor N31 having a gate connected to the gate of n channel MOS transistor N1, p channel MOS transistors P31 and P32 connected parallel to each other between MOS transistor N31 and the power supply node and having respective gates connected to the drain of MOS transistors N31, and a p channel MOS transistor P33 connected between the power supply node and the output node and a having a gate connected to the gates of MOS transistors P31 and P32.

MOS transistors N1, N11, N22, N21 and N31 have the same size (ratio of channel width to channel length) and same current supply capability. MOS transistors P11, P12, P21, P22, P31, P32 and P33 have the same size (ratio of channel width to channel length) to conduct a current flow of the same magnitude.

In cell current source 64*da*, MOS transistors N1 and N11 form a current mirror circuit. MOS transistors P11 and P12 form a current mirror circuit. Therefore, a reference current I of the same magnitude is output from cell current source 64*da*.

In cell current source 64*db*, MOS transistors N21 and N22 form a current mirror circuit with MOS transistor N1. A current I of the same magnitude flows through MOS transistors N21 and N22. Since MOS transistors N21 and N22 are supplied with a current through MOS transistor P21, a current 2·I flows to MOS transistor P21. MOS transistors P21 and P22 form a current mirror circuit. Therefore, a current of 2·I is output from MOS transistor P22.

In cell current source 64*dc*, MOS transistor N31 forms a current mirror circuit with MOS transistor N1. The current from MOS transistors P31 and P32 is supplied to MOS transistor N31. Therefore, a current of ½·I flows through MOS transistors P31 and P32. MOS transistor P33 forms a current mirror circuit with MOS transistors P31 and P32. Therefore, a current of ½·I flows from MOS transistor P33.

The other currents of 4·I, ¼·I, . . . can be easily generated by employing a similar structure.

Figure 32:
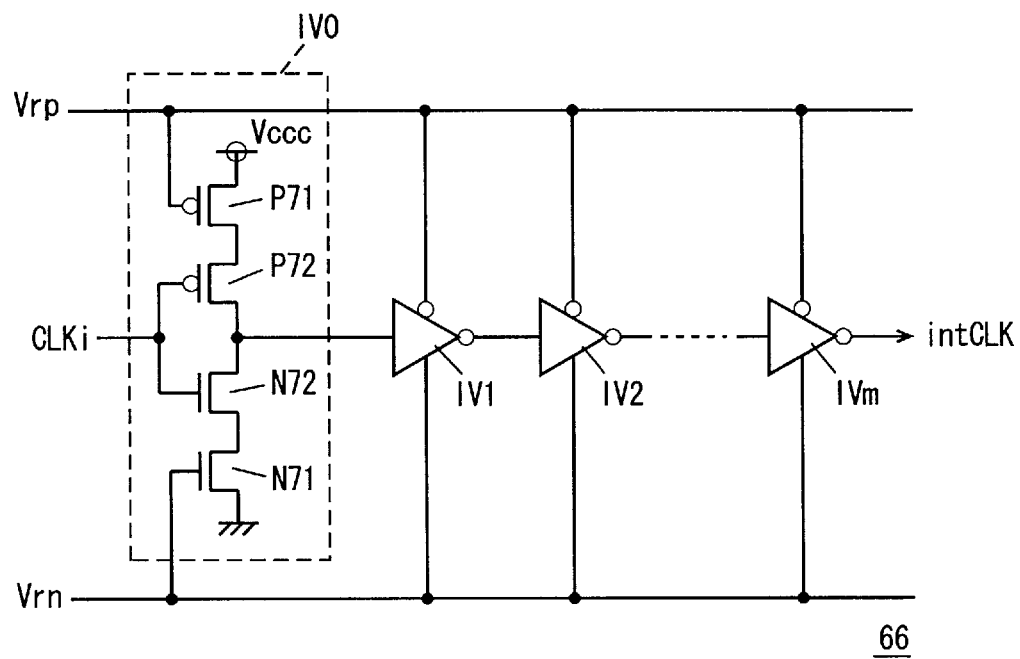
FIG. 32 shows a example of the structure of the delay stage of FIG. 27.

FIG. 32 schematically shows a structure of delay stage 66 of FIG. 27. In FIG. 32, delay stage 66 includes an even number of stages of inverters IV0–IVm. Each of inverters IV0–IVm has the same structure. In FIG. 32, the structure of inverter IV0 is shown representatively.

Inverter IV0 includes p channel MOS transistors P71 and P72 connected in series between the power supply node and an output node, and n channel MOS transistors N71 and N72 connected in series between the output node and the ground node. Input clock signal CLKi is applied to the gates of MOS transistors P72 and N72. Reference voltage Vrp is applied to the gate of MOS transistor P71. Reference voltage Vrn is applied to the gate of MOS transistor N71. MOS transistor P71 forms a current mirror circuit with MOS transistor P61 of FIG. 30 to supply the mirror current flowing through MOS transistor P61. MOS transistor N71 forms a current mirror circuit with MOS transistor N61 of FIG. 30 to supply a mirror current of the current that flows through MOS transistor N61. The operating speed of inverters IV0–IVm is determined by the operating current thereof. By adjusting the value of reference voltages Vrp and Vrn, the operating current of inverters IV0–IVm, i.e., the operating speed, is adjusted. Accordingly, the phase of input clock signal intCLK can be adjusted. Power supply voltage Vccc is applied to delay stage 66. An operating current determined by current generation circuit 64*b* is consumed from power supply voltage Vccc.

Figure 33:
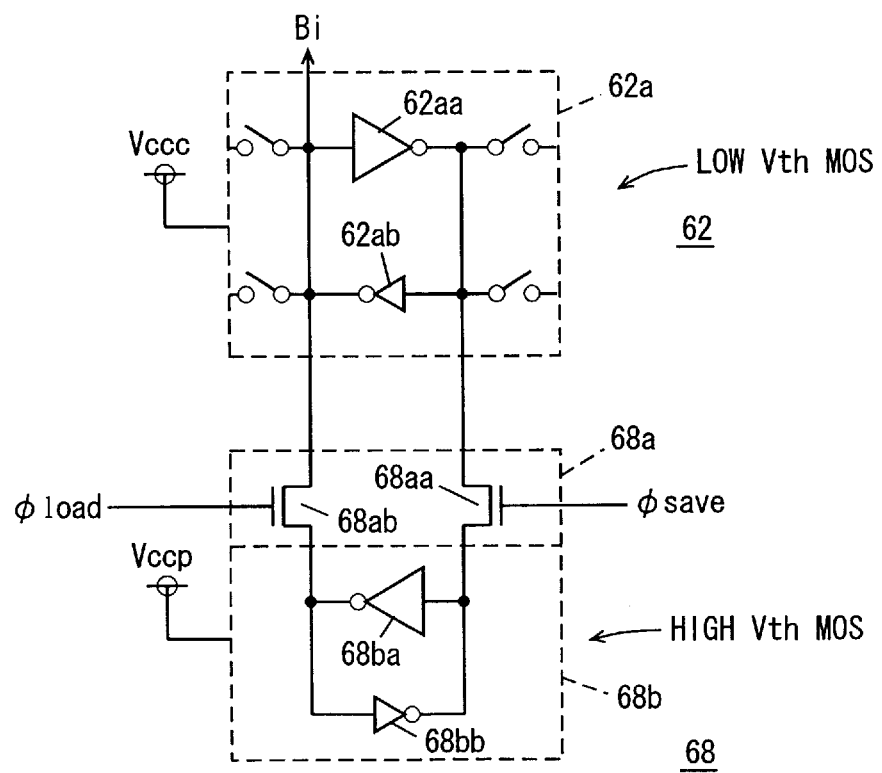
FIG. 33 schematically shows a structure of the save circuit and up/down counter of FIG. 27.

FIG. 33 schematically shows a structure of save circuit 68 of FIG. 27. In FIG. 33, the structure of a save circuit that is provided corresponding to one stage of counter 62 is shown. Referring to FIG. 33, a counter stage 62*a* that outputs count bit Bi in counter 62 includes inverters 62*aa* and 62*ab* forming a latch circuit. The current drivability of inverter 62*aa* is set greater than that of inverter 62*ab*. The structure of counter stage 62*a* is arbitrary, provided that a bi-directional (up/down) count operation is carried out and the count value is latched. In FIG. 33, an inverter latch representative of a latch stage is shown in counter 62.

Save circuit 68 includes a transfer circuit 68*a* responsive to a save designating signal φsave to transfer the latched bit of counter stage 62*a* and transferring the saved information to counter stage 62*a* according to a load designating signal φload, and a register circuit 68*b* latching the count bit applied via transfer circuit 68*a* and transferring the same to count stage 62*a* via transfer circuit 68*a*. Register circuit 68*b* includes inverters 68*ba* and 68*bb* forming a latch circuit. Inverter 68*ba* is connected in an opposite manner and parallel to inverter 62*aa* in counter stage 62*a*. The current drivability of inverter 68*ba* is set sufficiently greater than that of inverter 68*bb*.

Transfer circuit 68*a* includes transfer gates 68*aa* and 68*ab* rendered conductive in response to save designating signal φsave and load designating signal φload to connect counter stage 62*a* and register circuit 68*b*. Transfer circuit 68*a* can alternatively be formed of a CMOS transmission gate.

Figure 34:
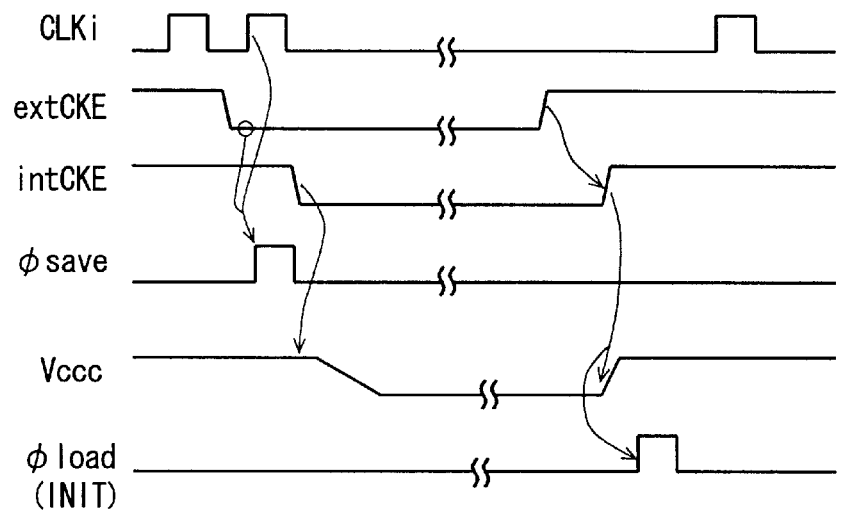
FIG. 34 is a signal waveform diagram representing the operation of circuitry of FIG. 33.

Counter 62 receives clock power supply voltage Vccc as an operating power supply voltage. Save circuit 68 receives periphery power supply voltage Vccp as an operating power supply voltage. The operation of the save circuit of FIG. 33 will be described with respect to the waveform diagram of FIG. 34.

Upon transition to the power down mode, external clock enable signal extCKE is driven to an L level from an H level. Internal clock enable signal intCKE is pulled down to an L level with a delay of half a clock cycle to external clock enable signal extCKE. Save designating signal φsave is generated as a one shot pulse in response to the fall of external clock enable signal extCKE and the rise of internal clock signal CLKi. When save designating signal φsave attains a H level, transfer gate 68*aa* in transfer circuit 68*a* is turned on. The signal output from inverter 62*aa* is transferred to register circuit 68*b* of save circuit 68 to be latched by inverters 68*ba* and 68*bb*.

At the fall of internal clock enable signal intCKE to an L level, the operation of generating power supply voltage Vccc is stopped (refer to second embodiment). Save circuit 68 receives periphery power supply voltage Vccp as an operating power supply voltage to maintain the saved count bit stably.

At the completion of the power down mode, external clock enable signal extCKE is driven to an H level. Then, internal clock enable signal intCKE is driven to an H level. In response to the rise of internal clock enable signal intCKE, the clock power supply circuit is rendered active, whereby power supply voltage Vccc is raised to the level of the reference voltage. In response to the rise of internal clock enable signal intCKE, load designating signal φload is rendered active in a one shot pulse form. The data stored in register circuit 68b is transferred to counter stage 62a via transfer gate 68ab. Counter stage 62a can hold properly the count bit transferred from save circuit 68 since power supply voltage Vccc has arrived at the stable state. Since the DLL has the delay amount thereof set to the delay amount established intermediately before the transition to the power down mode, an internal clock signal synchronous with the external clock signal can be generated speedily when the power down mode is released. Load designating signal φload may be a signal identical to initialization signal INIT of the second embodiment. Also, the retained count value of counter 62 can be loaded after initialization (reset) of counter 62.

The provision of save circuit 68 allows a MOS transistor of a low Vth to be employed as the component of counter 62, as shown in FIG. 33, to realize high speed operation. Since power supply voltage Vccc is lowered to the level of the ground voltage in the power down mode, no leakage current is generated in counter 62. In contrast, a MOS transistor of a high Vth is employed in save circuit 68 and the sub threshold leakage current thereof can be neglected even during the power down mode. A count bit value can be retained stably with low power consumption.

As for the digital DLL, a structure of initializing the latch node of each latch circuit of phase comparator 60 (refer to FIG. 28) is to be employed. Also, a structure can be employed in which the count bit from save circuit 68 is transferred to counter 62 after the count value in counter 62 is reset to the initial state.

Figure 35:
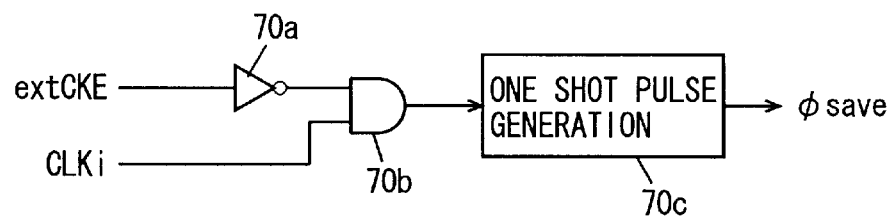
FIG. 35 schematically shows a structure of a save designating signal generation unit of FIG. 34.

FIG. 35 schematically shows a structure of the portion that generates a save designating signal. Referring to FIG. 35, a save designating signal generation portion includes an inverter 70a receiving an external clock enable signal extCKE, an AND circuit 70b receiving the output signal of inverter 70a and internal clock signal CLKi, and a one shot pulse generation circuit 70c generating a one shot pulse in response to a rise of the output signal of AND circuit 70b. Save designating signal φsave is output from one shot pulse generation circuit 70c. By employing the structure of the circuitry shown in FIG. 35, save designating signal φsave can be generated at the timing of the waveform shown in FIG. 35.

Figure 36:
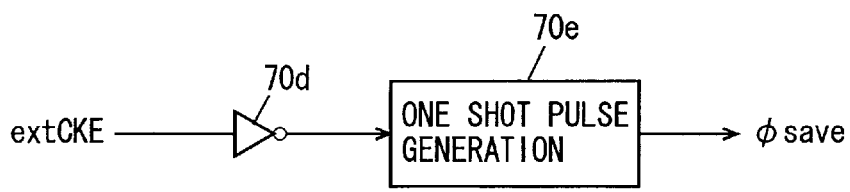
FIG. 36 shows a modification of the save designating signal generation unit of FIG. 34.

FIG. 36 schematically shows another structure of a save designating signal generation portion. Referring to FIG. 36, the save designating signal generation portion includes an inverter 70d receiving external clock enable signal extCKE, and a one shot pulse generation circuit 70e generating a one shot pulse in response to a rise of the output signal of inverter 70d. Save designating signal φsave is output from one shot pulse generation circuit 70e. According to the structure of FIG. 36, save designating signal φsave is generated in response to a fall of external clock enable signal extCKE. The count bit can be saved from counter 62 into save circuit 68 in the stabilized state of power supply voltage Vccc in any of the structures of the save designating signal generation portions of FIGS. 35 and 36.

Load designating signal φload can be generated using the circuitry for generating initialization designating signal INIT shown in FIG. 20.

According to the fourth embodiment of the present invention, a MOS transistor of low Vth can be employed for the clock reproduction circuit and a clock reproduction circuit that operates at high speed can be implemented since the clock power supply circuit is maintained at an inactive state during the power down mode. In the power down mode, clock power supply voltage Vccc is reduced to the level of ground voltage. No leakage current occurs in the clock reproduction circuit. Therefore, power consumption can be reduced significantly.

In the DLL, the count value is saved in the save circuit in the power down mode, and the saved count bits in the save circuit are used for initializing the counter when the power down mode is released. Therefore, an internal clock signal phase-locking with the external clock signal can be generated speedily when the power down mode is released.

FIFTH EMBODIMENT

Figure 37:
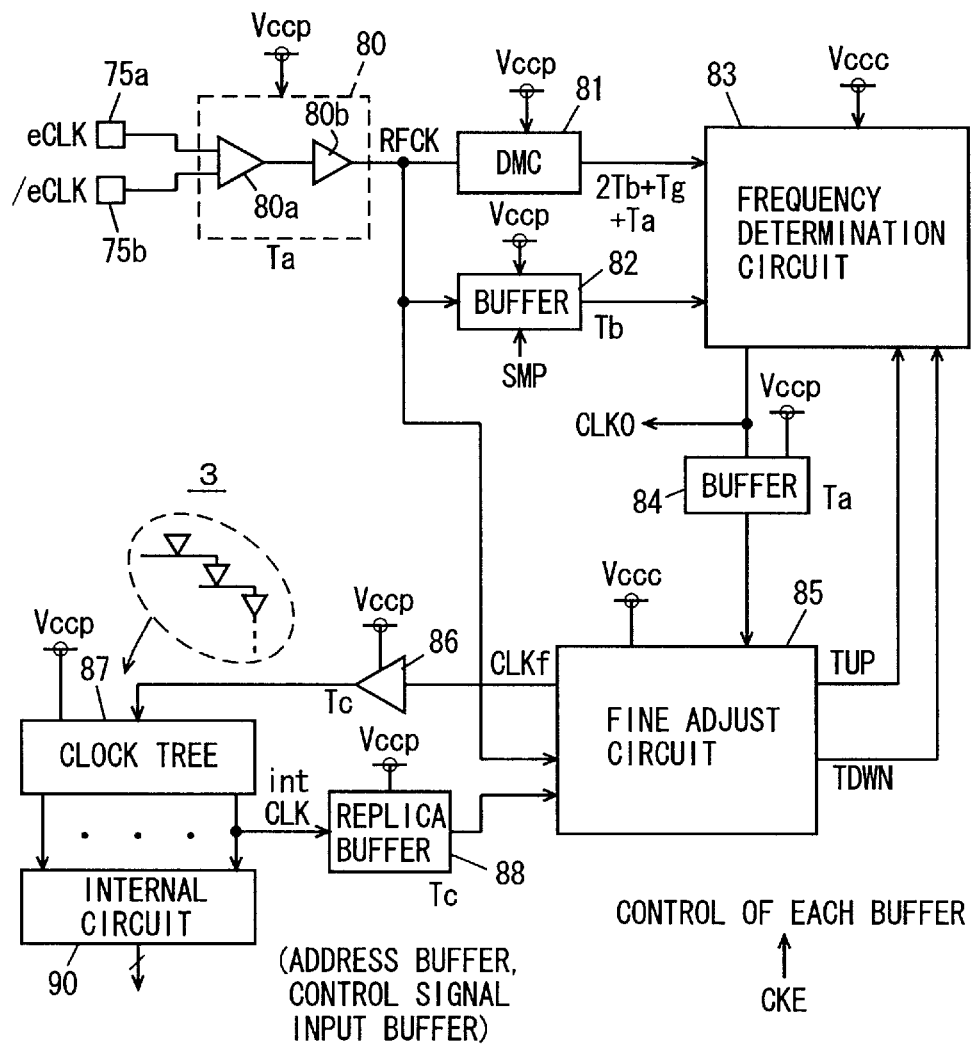
FIG. 37 schematically shows a structure of a clock reproduction circuit according to a fifth embodiment of the present invention.

FIG. 37 shows a structure of a clock generator according to a fifth embodiment of the present invention. Referring to FIG. 37, a clock generator 3 includes a clock input buffer 80 receiving external clock signals eCLK and /eCLK applied to pads 75a and 75b to generate a reference clock signal RFCK, a dummy delay circuit (DMC) 81 delaying reference clock signal RFCK from clock input buffer 80, a buffer circuit 82 rendered active in response to a sampling trigger signal SMP to transmit reference clock signal RFCK, a frequency determination circuit 83 comparing the phases of output clock signal from dummy delay circuit 81 and a clock signal from buffer circuit 82 to generate a clock signal CLKo phase-locking at a first precision, a buffer circuit 84 buffering clock signal CLKo from frequency determination circuit 83, a fine adjustment circuit 85 providing a clock signal CLKf according to the clock signal from buffer circuit 84, a buffer circuit 86 buffering clock signal CLKf output from fine adjustment circuit 85, a clock tree 87 for branching the clock signal from buffer circuit 86 into internal circuit 90, and a replica buffer 88 receiving an output clock signal intCLK closest to fine adjust circuit 85 from clock tree 87.

Fine adjust circuit 85 adjusts the phase of output clock signal CLKf according to the phase-comparison between the clock signal from replica buffer 88 and reference clock signal RFCK. Clock input buffer 80 and buffer circuit 84 have a delay time of Ta. Buffer circuit 86 and replica buffer 88 have a delay time of Tc. Sampling buffer circuit 82 has a delay time of Tb. Dummy delay circuit 81 has a delay time of 2·Tb+Tg+Ta. Frequency determination circuit 83 having a structure that will be described in detail afterwards includes a forward delay chain and a backward delay chain. The delay for the output signal from buffer circuit 82 influences both the forward and backward delay chains. Therefore, the delay time is set to 2·Tb in dummy delay circuit 81. Delay time Tg indicates the delay time of the tap stage to select a delay stage in the forward delay chain of frequency determination circuit 83.

Clock tree 87 includes buffers that are arranged in a mirror symmetric manner. A clock signal is transmitted with the same delay time to each buffer in internal circuit 90. Internal circuit 90 includes an address buffer and a control signal input buffer.

According to the structure of clock generator 3 of FIG. 37, frequency determination circuit 83 and fine adjust circuit 85 related to the synchronizing operation receive clock power supply voltage Vccc as an operating power supply voltage. Clock input buffer 80, dummy delay circuit 81, sampling buffer circuit 82, buffer circuits 84 and 86, clock tree 87 and replica buffer 88 receive periphery power supply voltage Vccp as an operating power supply voltage. These buffer circuits require a great current drivability and the separated power supply arrangement prevents the operation of these circuit from varying the operating power supply voltage of frequency determination circuit 83 and fine adjust circuit 85 that carry out synchronizing operations. Accordingly, the synchronizing operation is effected stably.

When clock enable signal CKE is inactive, i.e., in a power down mode or in a standby state, the operations of frequency determination circuit 83 and fine adjust circuit 85 are stopped (power supply voltage Vccc is reduced to the level of ground voltage). Therefore, buffer circuits 80, 81, 82, 84, 86, 87 and 88 are rendered inactive when clock enable signal CKE is inactive, and these buffer circuits are prevented from operating even when such an unstable signal potential is applied. Thus, reduction in current consumption and suppression of erroneous operation are implemented in a standby state.

Fine adjust circuit 85 adjusts the phase of output clock signal CLKf according to the phase comparison result of the clock signal from replica buffer 88 and clock signal RFCK from clock input buffer 80. The delay stage in frequency determination circuit 83 has a relatively large delay time to synchronize the phase of output clock signal CLKo with the phase of external clock signal eCLK at the precision of delay time TD of one delay stage. Fine adjust circuit 85 adjusts the phase at a second precision (TD/n) that is higher in accuracy than the first precision (delay time TD). The phase adjustment range of fine adjust circuit 85 corresponds to the delay time of one delay stage in frequency determination circuit 83.

Figure 38:
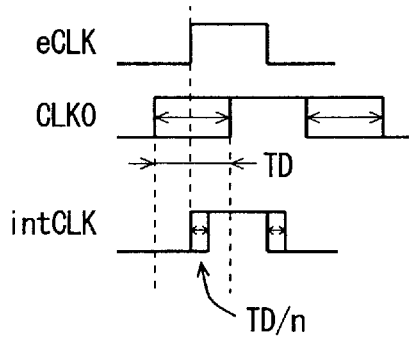
FIG. 38 schematically shows the adjustment range of a frequency determination circuit and a fine adjustment circuit of FIG. 37.

When the phase must be adjusted exceeding the fine adjustment range, fine adjust circuit 85 selectively renders active an up designating signal TUP and a down designating signal TDOWN to shift by one stage the delay stage of the delay chain in frequency determination circuit 83 (refer to FIG. 38). This operation is analogous to the shift up/shift down operation of a counter. Accordingly, the number of delay stages required in frequency determination circuit 83 can be reduced.

In clock generator 3 of FIG. 37, the phase of external clock signal eCLK is made equal to the phase of internal clock signal intCLK output from clock tree 87. In this case, the circuit arrangement is adapted to establish phase synchronization between external clock signal eCLK and internal clock signal intCLK speedily.

Figure 39:
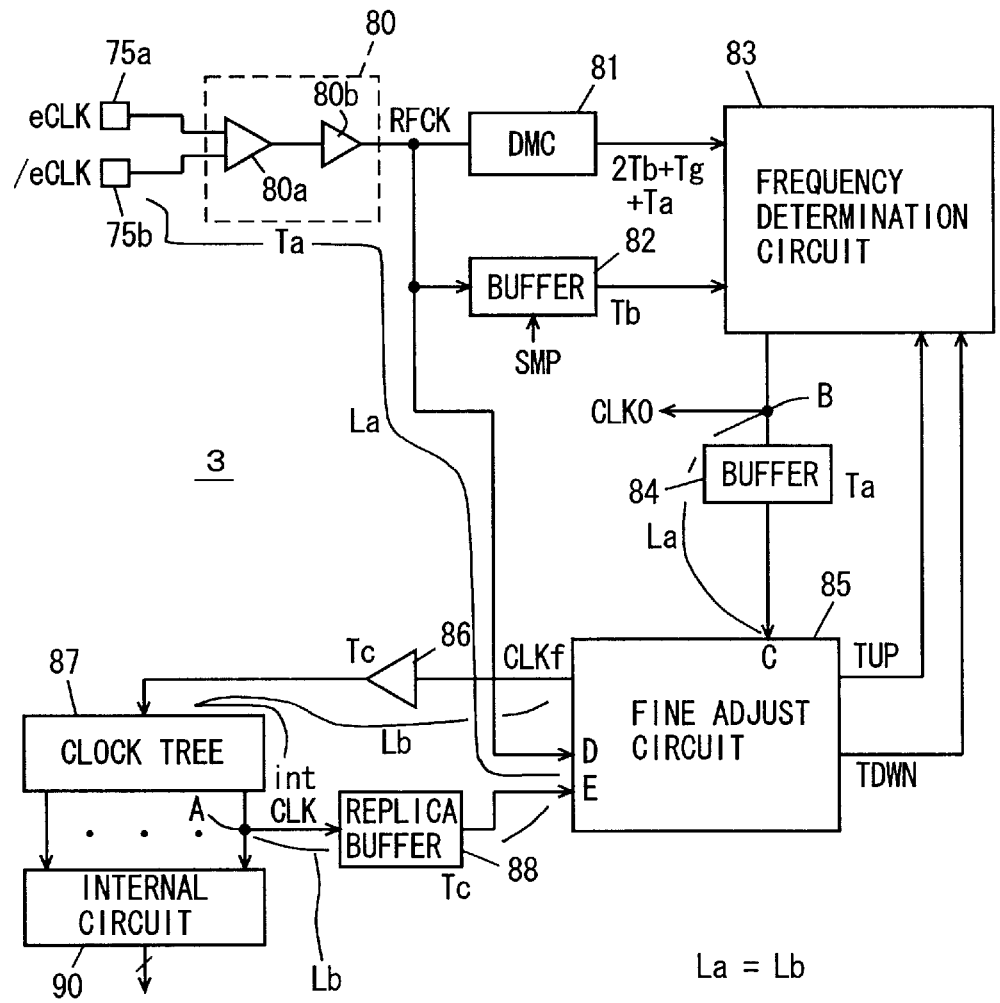
FIG. 39 represents the signal propagation delay of each path in the clock reproduction circuit of FIG. 37.

FIG. 39 schematically shows signal propagation delay in the internal line of clock generator 3. In FIG. 39, the signal propagation delay time of the path from clock input pads 75a and 75b to node D of fine adjust circuit 85 is set to La. The signal propagation delay time of the path from clock output node B of frequency determination circuit 83 to clock input node C of fine adjust circuit 85 is set to La. The signal propagation delay time of the path from the clock output node of fine adjust circuit 85 up to the circuit servicing point (clock signal output node) A of the clock tree via clock tree 87 is set to Lb. The delay time of the propagation path from circuit servicing point A to input node E of fine adjust circuit 85 is set to Lb.

Delay time La is set equal to delay time Lb. In this case, the phase of clock signal CLKf is adjusted in fine adjust circuit 85 so that the phase difference of the clock signals applied to nodes D and E is zero. The signal propagation delay time of the path from node A to clock input node E of fine adjust circuit 85 is Lb. The signal propagation delay time of the path from clock input nodes 75a and 75b to clock input node D of fine adjust circuit 85 is Lb, equal to the above signal propagation delay time. By setting the phases of the clock signals of nodes D and E equal by fine adjust circuit 85, the phase of clock signal intCLK at node A can be made equal to the phase of clock signal eCLK at clock input pad 75a. Fine adjust circuit 85 delays the signal from node B to generate output clock signal CLKf. Clock signal CLKo at node B is phase-locking with clock signal eCLK applied at clock input pad 75a by frequency determination circuit 83. Therefore, fine adjust circuit 85 similarly adjusts the phase of output clock signal CLKf according to external clock signal eCLK. In adjusting the phase by fine adjust circuit 85, clock signal CLKo from node B can be made to synchronize in phase with external clock signal eCLK properly when the delay amount of frequency determination circuit 83 is adjusted according to signals TUP and TDOWN.

Figure 40:
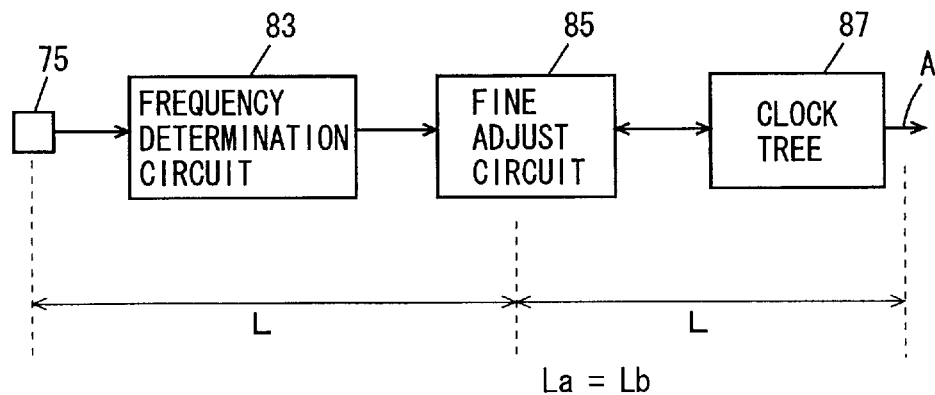
FIG. 40 schematically shows the circuit arrangement of the clock reproduction circuit of FIGS. 37 and 39.

FIG. 40 schematically shows the arrangement of clock generator 3. In FIG. 40, fine adjust circuit 85 is arranged substantially intermediate clock input pad 75 and the circuit servicing point of clock tree 87. Frequency determination circuit 83 is arranged between clock input node 75 and fine adjust circuit 85. The signal propagation delay time of the path between fine adjust circuit 85 and clock input pad 75 and the signal propagation delay time of the path between fine adjust circuit 85 and the circuit servicing point A of clock tree 87 both can be set equal to L, whereby the signal propagation time of each signal propagation delay path can be easily set equal, as shown in FIG. 39. Therefore, an internal clock signal can be generated easily in synchronization with an external clock signal when the power down mode (standby mode) is released.

Figure 41:
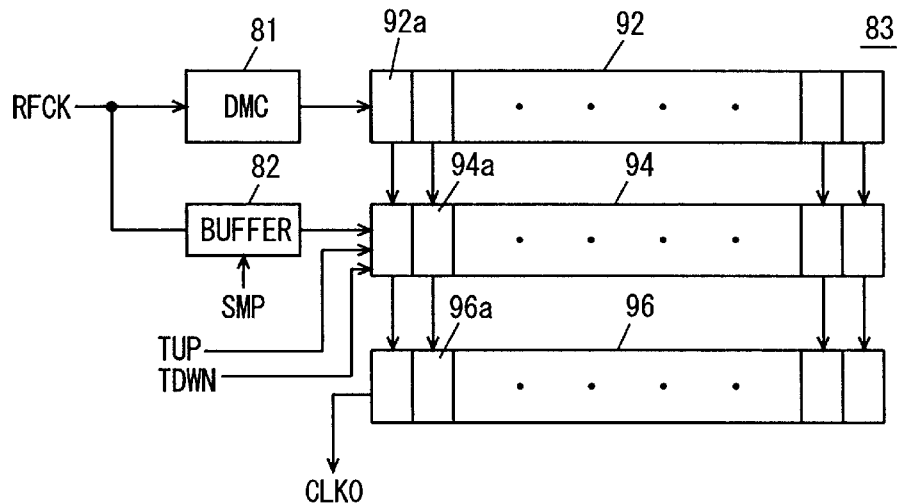
FIG. 41 schematically shows a structure of the frequency determination circuit of FIG. 37.

FIG. 41 schematically shows a structure of frequency determination circuit 83 of FIG. 39. Referring to FIG. 41, frequency determination circuit 83 includes a forward delay chain 92 delaying the output signal of dummy delay circuit 81, a tap chain 94 comparing the output signal of buffer 82 with the output signal of each delay stage in forward delay chain 92 to select a signal having a matching phase, and a backward delay chain 96 delaying the output signal of tap chain 94. Forward delay chain 92 includes a plurality of cascaded delay stages 92a each having a unit delay time.

Figure 42:
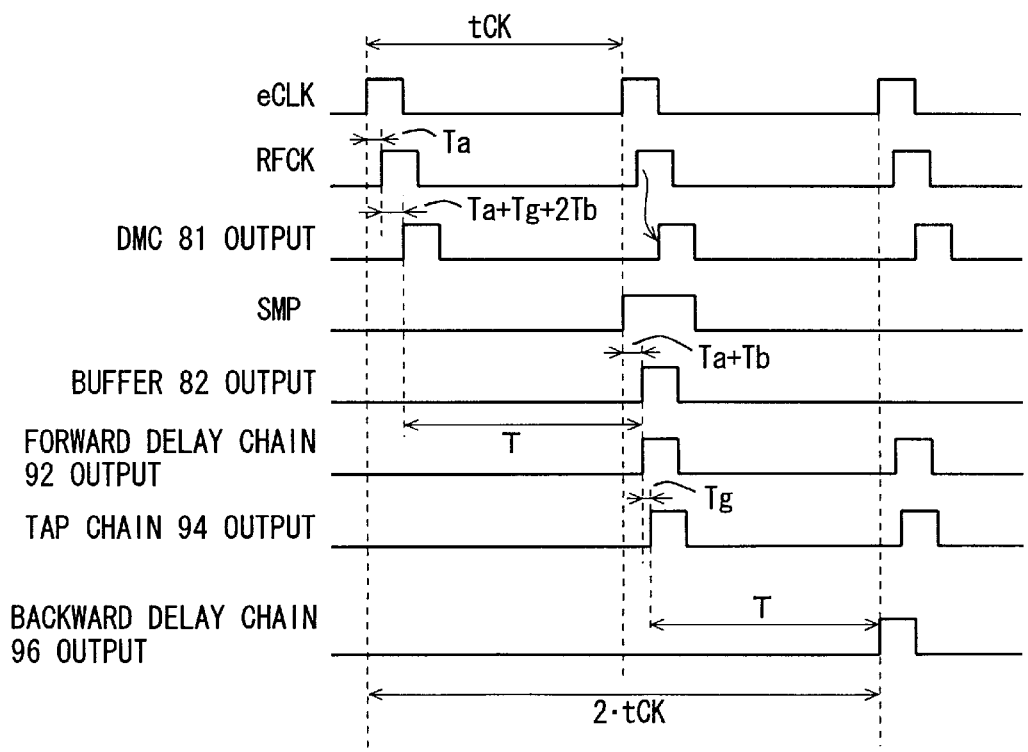
FIG. 42 is a signal waveform diagram representing the operation of the circuit of FIG. 41.

Tap chain 94 includes a tap 94a provided corresponding to each delay stage 92a in forward delay chain 92. Tap 94a determines whether the phase of the output signal from a corresponding delay stage of forward delay chain 92 matches/not-matches the phase of the clock signal applied from buffer 82 to selectively pass the output signal from the corresponding delay stage when the phases match. Backward delay chain 96 includes cascaded delay stages 96a to transmit the clock signal from tap chain 94 in a direction opposite to that of forward delay chain 92. Delay stages 92a and 96a have the same delay time (TD). Tap 94a of tap chain 94 includes a flip flop (latch circuit) to maintain the state of the selected tap in the tap chain. Up and down designating signals TUP and TDOWN from fine adjust circuit 85 shown in FIG. 39 are applied to tap chain 92. In response, tap chain 94 shifts the selected tap by one stage in the specified direction. The operation of frequency determination circuit 83 of FIG. 41 will be described with respect to the timing chart of FIG. 42.

Reference clock signal RFCK has a delay time Ta with respect to external clock signal eCLK (delay time of clock input buffer 80). Reference clock signal RFCK is applied to forward delay chain 92 via dummy delay circuit 81. Dummy delay circuit 81 has a delay time of Ta+Tg+2Tb. Sampling trigger signal SMP is at an L level. Buffer 82 is at an inactive state. Therefore, tap chain 94 is inhibited of the transmission of reference clock signal RFCK in this cycle.

At the next clock cycle, sampling signal SMP is rendered active, whereby and buffer 82 is rendered active. Reference clock signal RFCK is applied to tap chain 94. Buffer 82 has a delay time of Tb. Therefore, the signal output from buffer 82 has the delay time of Ta+Tb with respect to external clock signal eCLK. In each tap stage 94a of tap chain 94, determination is made on whether the phase of the output signal of each delay stage 92a of forward delay chain 92 matches/ not-matches the phase of the clock signal from buffer 82. The output signal of forward delay chain 92 matching in phase with the output signal of buffer 82 is selected and applied to backward delay chain 96 via tap chain 94. Tap stage 94a of tap chain 94 has a delay time of Tg. The output signal from tap chain 94 passes through backward delay chain 96 to be transmitted through a number of delay stages identical to the number of delay stages of forward delay chain 92, whereby clock signal CLKo is generated. In this case, the delay time of the clock signal is T for both forward delay chain 92 and backward delay chain 96. Delay time T of delay chains 92 and 96 is obtained in the following.

Here, tCK is the cycle of external clock signal eCLK. Reference clock signal RFCK has a delay time of Ta with respect to external clock signal eCLK. Dummy delay circuit 81 delays reference clock signal RFCK by the time of Ta+Tg+2Tb. The delayed signal of forward delay chain 92 has a phase identical to that of the output signal of buffer 82. Therefore, the following equations are obtained.

$$tCK+Ta+Tb=Ta+Ta+Tg+2\cdot Tb+T$$

$$T=tCK-(Ta+Tb+Tb)$$

The output signal from forward delay chain 92 is delayed through tap stage 94a and backward delay chain 96. Therefore, clock signal CLKo has a delay time set forth in the following with respect to external clock signal eCLK.

$$tCK+Ta+Tb+Tg+T=2\cdot tCK$$

A clock signal CLKo phase-locking with external clock signal eCLK behind two cycles is output from backward delay chain 96. This state is maintained stationarily as long as up and down designating signals TUP and TDOWN are at constant values. However, when sampling signal SMP is rendered active and buffer 82 attains an active state, the frequency determination operation is executed at frequency determination circuit 83, whereby tap chain 94 selects and retains the optimum tap.

In frequency determination circuit 83, an error is generated corresponding to the delay time (first precision) of delay stages 92a and 96a. The error is adjusted by fine adjust circuit 85.

Figure 43:
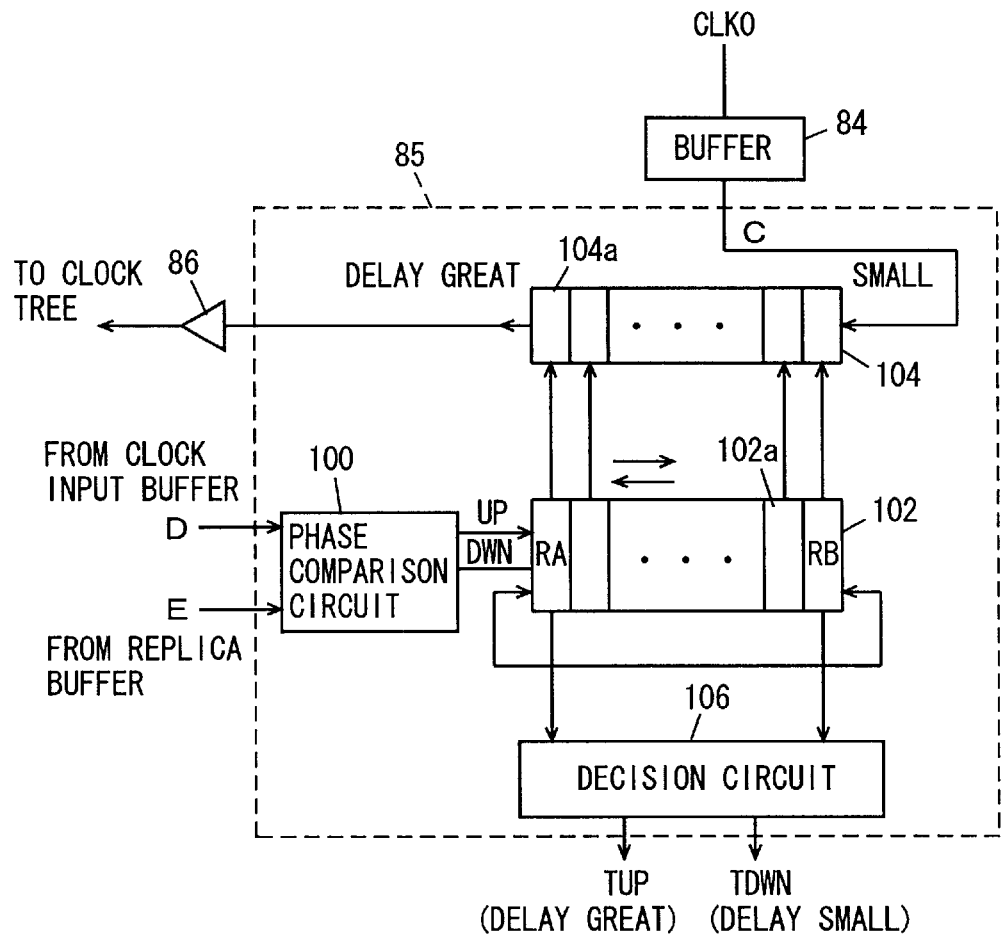
FIG. 43 schematically shows a structure of a fine adjustment circuit of FIG. 37.

FIG. 43 shows a specific structure of fine adjust circuit 85 of FIG. 39.

Referring to FIG. 43, fine adjust circuit 85 includes a phase comparison circuit 100 comparing the phase of the clock signal applied to node D with the phase of the clock signal applied to node E, a bi-directional shift register 102 shifting the stored data bi-directionally according to count up and down designating signals UP and DOWN from phase comparison circuit 100, and a fine adjust delay chain 104 having the delay amount set according to the output signal from bi-directional shift register 102. Fine adjust delay chain 104 includes n delay stages 104a each having a delay time set to TD/n. Therefore, the maximum delay time of fine adjust delay chain 104 is equal to the delay time of each of delay stages 92a and 96a of forward delay chain 92 and backward delay chain 96 of FIG. 41. Fine adjust delay chain 104 adjusts the delay time of the clock signal by the step of TD/n. Bi-directional shift register 102 includes a register 102a provided corresponding to respective delay stages 104a of fine adjust delay chain 104. Bi-directional shift register 102 can shift the stored data circularly.

Fine adjust circuit 85 includes a decision circuit 106 receiving the output signals of registers RA and RB of the first and final stages in bi-directional shift register 102 to render active tap up designating signal TUP or tap down designating signal TDOWN in the shifting operation between these registers. Decision circuit 106 renders tap down designating signal TDOWN active at the transition of the stored value in bi-directional shift register 106 from the smallest value (register RB) to the largest value (register RA) to reduce the delay time of frequency determination circuit 83. At the transition of the output value from the largest value (register RA) to the smallest value (register RB) in bi-directional shift register 102, decision circuit 106 renders tap up designating signal TUP active to increase the delay time of frequency determination circuit 83 by one delay stage (in each delay chain). The phase of the clock signal set at the precision of delay time TD in frequency determination circuit 83 is further adjusted at the precision of TD/n. When the difference in phase of the clock signal is greater than delay time TD (when the fine adjust range is exceeded), the delay time of frequency determination circuit 83 is adjusted. Phase synchronization between the external clock signal and the internal clock signal is established at high speed. By the coarse adjustment and fine adjustment, the number of delay stages in the frequency determination circuit can be reduced. Therefore, the number of components constituting the circuitry can be reduced. The operation of fine adjust circuit 85 of FIG. 43 will be described with respect to the signal waveform diagram of FIG. 44.

Figure 44:
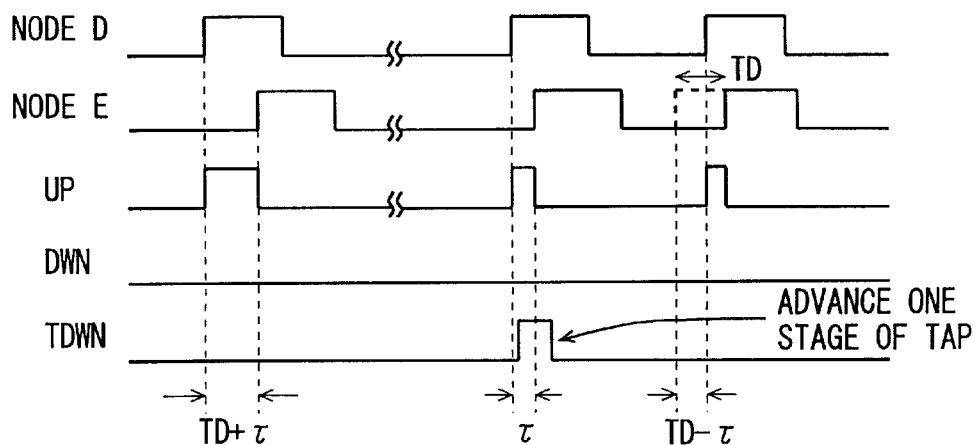
FIG. 44 is a signal waveform diagram representing the operation of the fine adjustment circuit of FIG. 43.

Consider the case where the clock signal of node D is ahead of the clock signal of node E by a time TD+τ, as shown in FIG. 44. Phase comparison circuit 100 renders count up designating signal UP active. A shift operation is initiated in bi-directional shift register 102 rightwards in FIG. 43. The delay time of fine adjust delay chain 104 is reduced to advance the phase of the clock signal from clock buffer 86. There is the phase difference of τ between the clock signals of nodes D and E even when the output signal of register RB corresponding to the shortest delay in bi-directional shift register 102 is rendered active. In this case, phase comparison circuit 100 renders count up designating signal UP active again. In bi-directional shift register 102, that signal of an active state is transmitted from register RB to register RA. Upon detection of a shift operation, decision circuit 106 renders tap down designating signal TDWN active, whereby the phase of the clock signal (clock signal CLKo) in frequency determination circuit 83 is advanced by one delay stage. Although the clock signal of node E is advanced in phase by the time of TD−τ to the clock signal of node D, the delay amount of fine adjust delay chain 104 is the greatest value TD by the shift operation of bi-directional shift register 102. The actual delay time is τ. Under this state, phase comparison circuit 100 carries out a comparison operation again. Count up (shift up) designating signal UP is rendered active, whereby bi-directional shift register 102 effects a shift operation. The delay time of fine adjust delay chain 104 is reduced to advance the phase of clock signal of node E. Similar to the so-called carry/borrow operation, the delay amount of frequency determination circuit 83 is adjusted and a fine adjust operation is carried out by fine adjust circuit 85. The phases of internal clock signal and the external clock signal can be made to synchronize with each other at high speed.

FIG. 44 shows the case where the phase of the clock signal of node D is ahead of the clock signal of node E. When the phase of the clock signal of node D is behind the phase of the clock signal of node E, a count down (shift down) designating signal DWN is generated from phase comparison circuit 100, whereby decision circuit 106 renders tap up designating signal TUP active.

Fine adjust delay chain 104 can be formed of n delay stages to select an output signal of a corresponding delay stage according to the output signal from bi-directional shift register 102. Alternatively, a structure can be employed in which the operating current of an inverter delay circuit is adjusted according to the output signal of bi-directional shift register 102, whereby the delay time is adjusted, as will be described in detail afterwards.

FIG. 45A shows an example of a structure of bi-directional shift register 102 of FIG. 43. The structure of a register circuit of one stage is shown representatively in FIG. 45. Referring to FIG. 45A, a register circuit 102a includes a master latch circuit 102am and a slave latch 102as, a switching element SW2 between latch circuits 102am and 102as to transfer data in response to a transfer designating signal T$\phi$2, and a switching element SW1 transferring data between registers in response to a transfer designating signal T$\phi$1. Master latch circuit 102am includes an inverter IVa, a switching element SW3 rendered conductive in response to a latch designating signal T$\phi$3 to transmit the output signal of inverter IVa, and a switching element SW4 rendered conductive in response to a latch designating signal T$\phi$4 to transmit the output signal of inverter IVb. The signal transmitted by switching element SW3 is sent to the input of inverter IVb. The output signal of inverter IVb passes through switching element SW4 to be delivered to the input of inverter IVa.

Slave latch circuit 102as includes an inverter IVc, a switching element SW5 rendered conductive in response to latch designating signal T$\phi$3 to transmit the output signal of inverter IVc to switching element SW1, an inverter IVd receiving a signal applied via switching element SW5 or SW1, and a switching element SW6 rendered conductive in response to a latch designating signal T$\phi$4 to transmit the output signal of inverter IVd to switching element SW2 and to the input of inverter IVc. Inverters IVa–IVd have the same current drivability. The operation will now be described briefly.

In a latching state, transfer designating signals T$\phi$1 and T$\phi$2 are at an L level. Switching elements SW1 and SW2 are nonconductive. Latch designating signals T$\phi$3 and T$\phi$4 are at an H level. Switching elements SW3–SW6 conduct. Under this state, master latch circuit 102am and slave latch circuit 102as respectively form an inverter latch circuit to latch applied signals. Therefore, signal $\phi$Bi output from each register circuit 102a is at a latched state.

The operation of the generation of count up designating signal UP from phase comparison circuit 100 shown in FIG. 43 will be described with respect to FIG. 45B. Transfer designating signal T$\phi$2 attains an H level, and latch designating signal T$\phi$4 attains an L level. Latch designating signal T$\phi$3 maintains an H level. Transfer designating signal T$\phi$1 maintains an L level. In this state, switching element SW2 conducts, and switching elements SW4 and SW6 are in a nonconductive state. Accordingly, master latch circuit 102am and slave latch circuit 102as in register circuit 102a are released from the latching state. The output signal of inverter IVa is transmitted to inverter IVc of slave latch circuit 102as via switching elements SW3 and SW2. In other words, data is transferred from master latch circuit 102am to slave latch circuit 102as in register circuit 102a.

At the completion of this transfer operation, transfer designating signal T$\phi$1 is pulled up to an H level, and latch designating signal T$\phi$4 is pulled down to an L level. Under this state, switching element SW1 is at a conductive state. Switching elements SW4 and SW6 are at a nonconductive state. Master latch circuit 102am and slave latch circuit 102as are canceled from the latching state. The output signal of inverter IVc of slave latch circuit 102as is transmitted through switching elements SW5 and SW1 to master latch circuit 102am of the next stage of register circuit 102a. Upon completion of this transfer operation, transfer designating signal T$\phi$1 attains an L level, and latch designating signal T$\phi$4 attains an H level. Master latch circuit 102am and slave latch circuit 102as both attain a latching state. Therefore, data is transferred between register circuits 102a by transfer designating signal T$\phi$1. Data transfer is executed between the registers by transfer designating signals T$\phi$1 and T$\phi$2 to complete the shifting operation.

The operation of generating count down designating signal DWN from phase comparison circuit 100 of FIG. 43 will be described with reference to FIG. 45C. Transfer designating signal T$\phi$1 attains an H level, and latch designating signal T$\phi$3 attains an L level. Transfer designating signal T$\phi$2 maintains an L level. Latch designating signal T$\phi$4 maintains an H level. In this case, switching element SW2 attains a nonconductive state, while switching element SW1 attains a conductive state. Switching elements SW3 and SW5 attain a nonconductive state, and switching elements SW4 and SW6 maintain the conductive state. Under this state, the data held in master latch circuit 102am of register circuit 102a is transferred to the slave latch of the preceding stage of the register circuit. Upon completion of the transfer operation, switching elements SW1 and SW2 are rendered nonconductive, and switching elements SW3–SW6 are rendered conductive. Master latch circuit 102am and slave latch circuit 102as maintain the latching state in each register circuit 102a.

Then, transfer designating signal T$\phi$2 attains an H level, and latch designating signal T$\phi$3 attains an L level. Switching element SW1 maintains the nonconductive state, whereas switching element SW2 maintains the conductive state. Switching elements SW3 and SW5 are rendered nonconductive. Master latch circuit 102am and slave latch circuit 102as are released from the latching state. Since switching element Sw2 is in a conducting state, data is transferred from slave latch circuit 102as to master latch circuit 102am in each register circuit 102a. Accordingly, the operation of transferring data to the preceding register circuit from register circuit 102a is completed. Upon completion of this transfer operation, register circuit 102a has switching elements SW1 and SW2 rendered nonconductive, and switching elements SW3–SW6 rendered conductive to attain a latching state.

Figure 46:
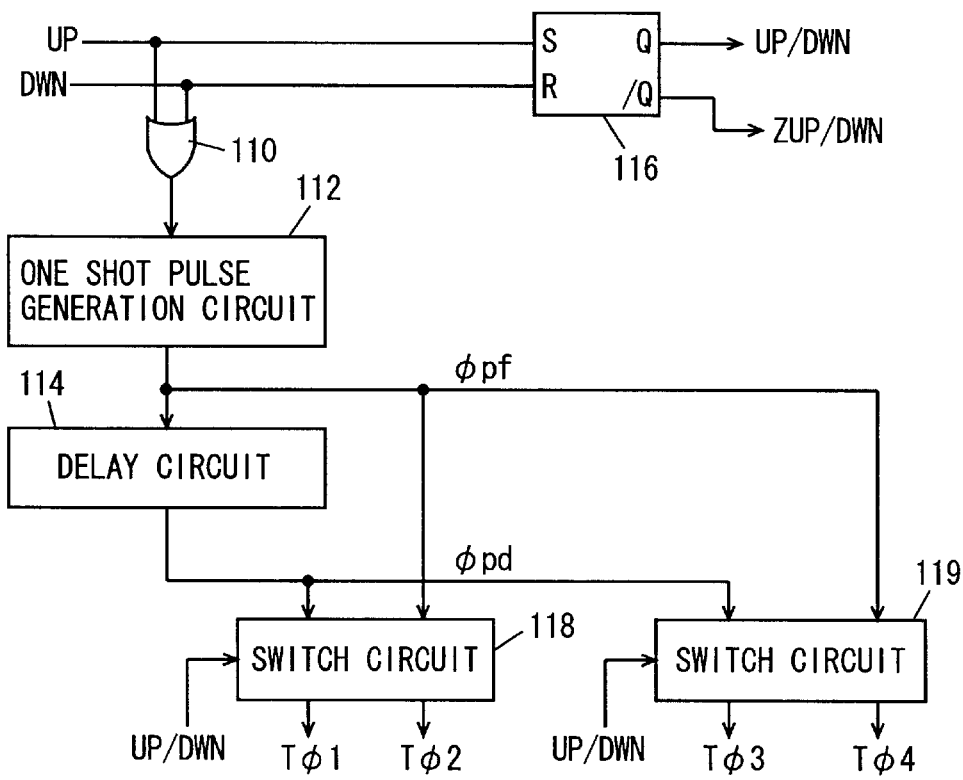
FIG. 46 schematically shows a structure of a control signal generation unit of FIG. 45A.

FIG. 46 schematically shows the structure of the portion of the control circuit generating transfer designating signals T$\phi$1 and T$\phi$2 and latch designating signals T$\phi$3 and T$\phi$4 shown in FIG. 45A. Referring to FIG. 46, the control signal generation circuit includes an OR circuit 110 receiving a count up designating signal UP and a count down designating signal DWN, a one shot pulse generation circuit 112 generating a one shot pulse signal in response to a rise of the output signal of OR circuit 110, a delay circuit 114 delaying an output signal φpf of one shot pulse generation circuit 112 by a predetermined time, a set/reset flip flop 116 set and reset in response to activation of count up designating signal UP and activation of count down designating signal DWN, respectively, a switch circuit 118 responsive to output signal UP/DWN of flip flop 116 to switch the transfer paths of output signal φpf of one shot pulse generation circuit 112 and output signal φpd of delay circuit 114 to generate transfer designating signals Tφ1 and Tφ2, and a switch circuit 119 responsive to up/down designating signal UP/DWN from flip flop 116 to switch the propagation path of signals φpf and φpd to generate latch designating signals Tφ3 and Tφ4.

Figure 47A:
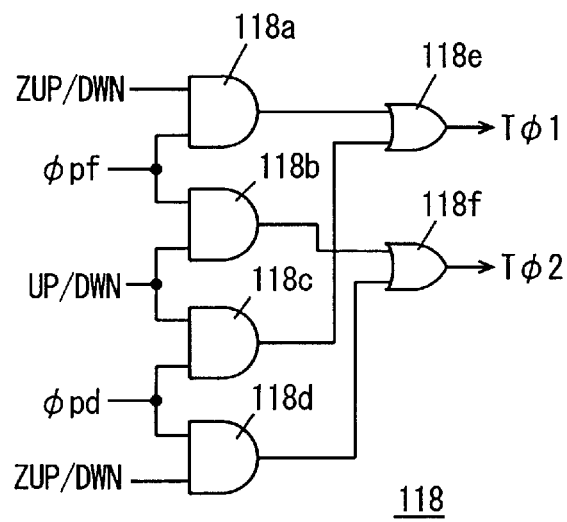
FIGS. 47A and 47B each schematically show a structure of the switch circuit of FIG. 46.

FIG. 47A shows an example of a structure of switch circuit 118 of FIG. 46. Referring to FIG. 47A, switch circuit 118 includes an AND circuit 118a receiving up/down designating signal ZUP/DWN and pulse signal φpf, an AND circuit 118b receiving pulse signal φpf and up/down designating signal UP/DWN, an AND circuit 118c receiving up/down designating signal UP/DWN and delayed pulse signal φpd, an AND circuit 118d receiving delayed pulse signal φpd and up/down designating signal UP/DWN, an OR circuit 118e receiving the output signals of AND gates 118a and 118c to generate transfer designating signal Tφ1, and an OR circuit 118f receiving the output signals of AND circuit 118b and 118d to generate transfer designating signal Tφ2.

When count up designating signal UP is active, up/down designating signal UP/DWN attains an H level, and the complementary up/down designating signal ZUP/DWN is pulled down to an L level. Under this state, transfer designating signal Tφ2 is rendered active in response to pulse signal φpf. Transfer designating signal Tφ1 is rendered active in response to activation of delay pulse designating signal φpd. When count down designating signal DWN is active, up/down designating signal ZUP/DWN attains an H level, and up/down designating signal UP/DWN attains an L level. Since AND circuits 118a and 118d are enabled under this state, transfer designating signal Tφ1 is rendered active in response to pulse signal φpf, whereas transfer designating signal Tφ2 is rendered active in response to delayed pulse signal φpd. As shown in FIGS. 45B and 45C, the activation sequences of transfer designating signals Tφ1 and Tφ2 can be reversed between the count up operation and the count down operation to control the shift operation of the shift register bi-directionally.

Figure 47B:
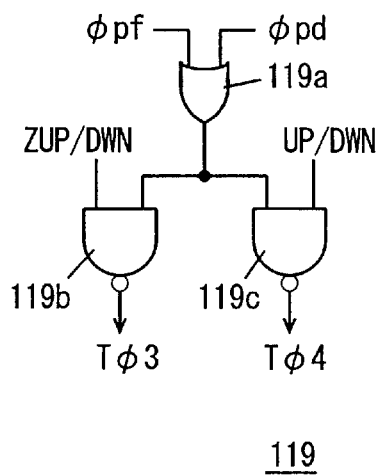

FIG. 47B shows an example of a structure of switch circuit 119 of FIG. 46. Referring to FIG. 47B, switch circuit 119 includes an OR circuit 119a receiving pulse signal φpf and delayed pulse signal φpd, a NAND circuit 119b receiving the output signal of OR circuit 119a and complementary up/down designating signal ZUP/DWN to generate latch designating signal Tφ3, and a NAND circuit 119c receiving the output signal of OR circuit 119a and up/down designating signal UP/DWN to generate latch designating signal Tφ4.

In a count up (shift up) operation, up/down designating signal UP/DWN attains an H level. Latch designating signal Tφ4 attains an L level when pulse signals φpf and φpd are generated. In contrast, latch designating signal Tφ3 maintains the H level since complementary up/down designating signal ZUP/DWN attains an L level. In a count down (shift down) operation, complementary up/down designating signal UP/DWN attains an H level and up/down designating signal UP/DWN attains an L level. Under this state, latch designating signal Tφ3 is driven to an L level when pulse signals φpf and φpd are active. Accordingly, the latching state of the master latch circuit and the slave latch circuit shown in FIG. 45A can be released in the shifting operation of the bi-directional shift register of FIG. 45A to allow data transfer speedily and correctly.

Structure of Decision Circuit

Figure 48:
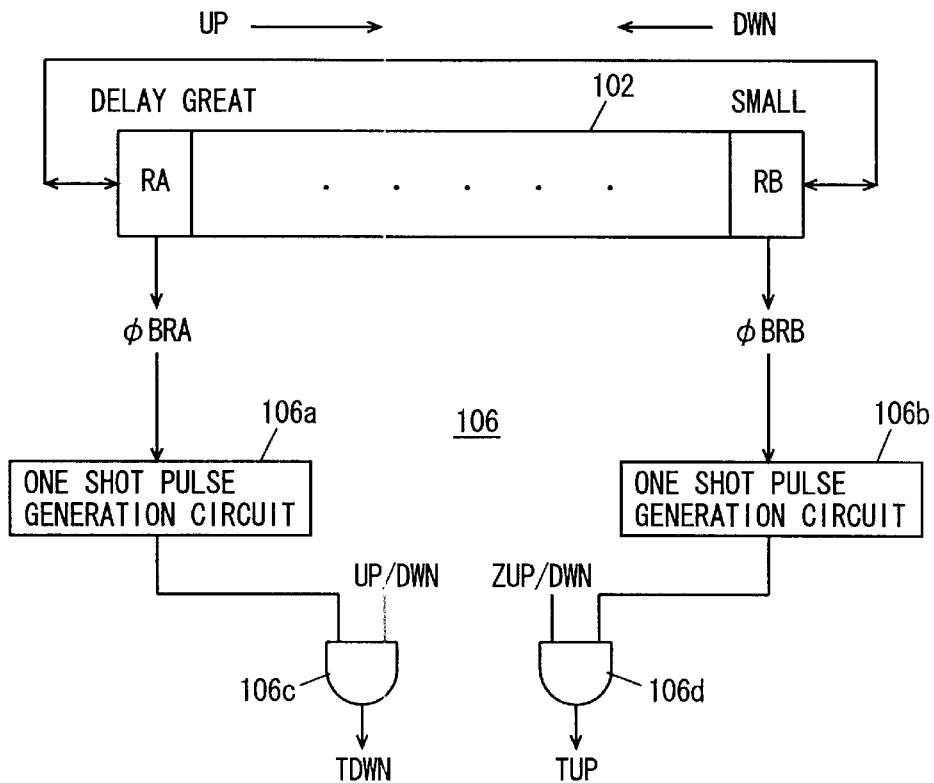
FIGS. 48 and 49 schematically show modified structures of a decision circuit of FIG. 43.

FIG. 48 schematically shows a structure of decision circuit 106 of FIG. 43. Referring to FIG. 48, decision circuit 106 includes a one shot pulse generation circuit 106a generating a one shot pulse signal in response to a rise of an output signal φBRA of register circuit RA in bi-directional shift register 102, a one shot pulse generation circuit 106b generating a one shot pulse signal in response to a rise of a signal φBRB output from register circuit RB of bi-directional shift register 102, an AND circuit 106c receiving the output signal of one shot pulse generation circuit 106a and up/down designating signal UP/DWN to output a tap down designating signal TDWN, and an AND circuit 106d receiving the output signal of one shot pulse generation circuit 106b and up/down designating signal ZUP/DWN to output a tap up designating signal TUP.

Bi-directional shift register 102 carries out a shift operation in a direction of reducing the delay time and in a direction of increasing the delay time when count up designating signal UP and count down designating signal DWN are rendered active, respectively. Therefore, when a count up designating signal is output and up/down designating signal UP/DWN is active, the rise of output signal φBRA of register RA to an H level, indicates the possibility that data is transferred from register circuit RB to register circuit RA. In this state, tap down designating signal TDWN is rendered active. The tap of the tap chain in frequency determination circuit 83 is shifted in a direction of reducing the delay time by one stage. When output signal φBRB of register circuit RB is pulled up to an H level when complementary up/down designating signal ZUP/DWN is at H level, data is transferred from register RA to register RB. In this state, the tap of the tap chain in frequency determination circuit 83 must be shifted in a direction to increase the delay time by one stage. Therefore, tap up designating signal TUP from AND circuit 106 is driven to an active state of an H level.

According to the structure of the decision circuit shown in FIG. 48, the delay time is shifted by one stage in the frequency determination circuit to continue the fine adjust operation of the phase of an internal clock signal when the delay time must be adjusted exceeding the adjustment range of the fine adjust circuit.

Figure 49:
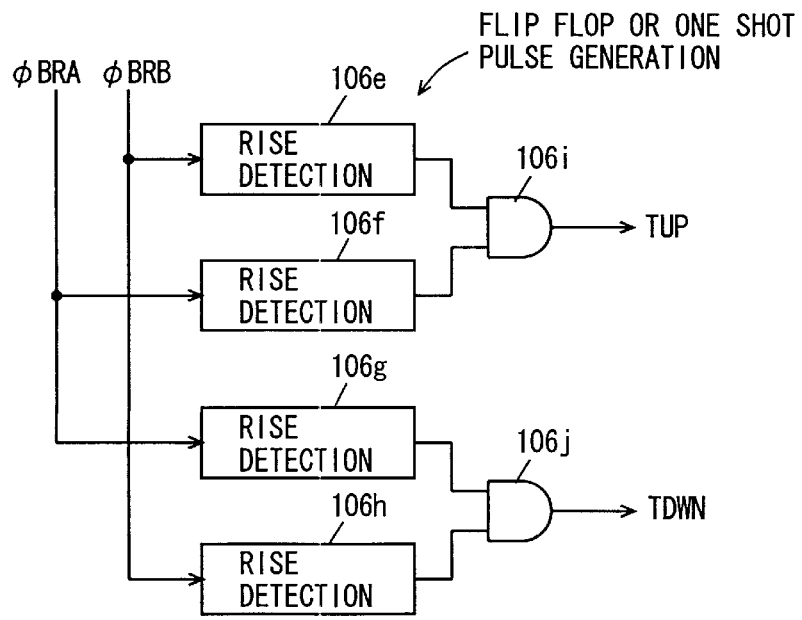

FIG. 49 schematically shows a modification of decision circuit 106 of FIG. 43. Referring to FIG. 49, decision circuit 106 includes a rise detection circuit 106e detecting a rise of output signal φBRB of register RB, a fall detection circuit 106f detecting a fall of output signal φBRA of register RA, a rise detection circuit 106g detecting a rise of signal φBRA, a fall detection circuit 106h detecting a fall of signal φBRB, an AND circuit 106i receiving the output signal of rise detection circuit 106e and the output signal of fall detection circuit 106h to output a tap down designating signal TDWN, and an AND circuit 106j receiving the output signals of rise detection circuit 106g and fall detection circuit 106h to output a tap up designating signal TUP. Rise detection circuits 106e and 106g and fall detection circuits 106f and 106h are each formed of a one shot pulse generation circuit or a flip flop.

When signal φBRB is pulled down and signal φBRA is pulled up, data is transferred from register RB to register RA. Here, the phase of the internal clock signal must be advanced by one delay stage. Tap down designating signal TDWN is driven to an active state. When signal φBRB is driven high and signal φBRA is driven low, data is transferred from register RA to register RB. A count down mode (shift down) operation is carried out. Therefore, tap up designating signal TUP is driven to an active state in order to delay the delay time of the internal clock signal by one stage.

The structure of the decision circuit shown in either of FIGS. 48 and 49 can be employed. When the phase must be corrected exceeding the fine adjustment range in a fine adjustment operation, the delay time of one stage is increased or reduced in the frequency determination circuit to carry out fine adjustment again. This is analogous to the carry/borrow operation of the counter, but there is caused the delay time of two stages of each delay chain due to the effect of the delay stages of the forward delay chain and the backward delay chain.

Figure 50:
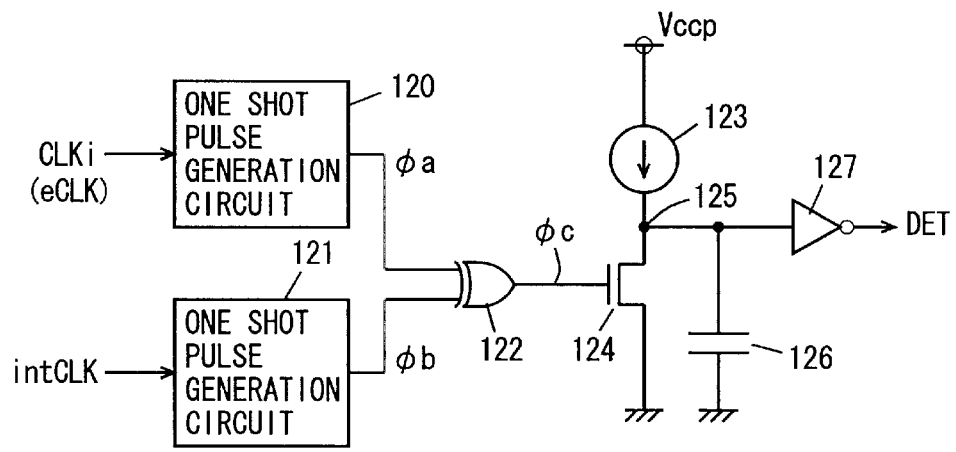
FIG. 50 schematically shows a structure of a coarse adjustment operation completion detection unit.

FIG. 50 schematically shows a structure of a coarse adjustment/fine adjustment switch control portion. Referring to FIG. 50, the coarse adjustment/fine adjustment switch circuit includes a one shot pulse generation circuit 120 generating a one shot pulse signal in response to a rise of an input clock signal CLKi (or eCLK), a one shot pulse generation circuit 121 generating a one shot pulse signal in response to a rise of internal clock signal intCLK, an EXOR circuit 122 receiving output signals φa and φb of one shot pulse generation circuits 120 and 121, a constant current source 123 connected between a periphery power supply node and a node 125 to supply a constant current, an n channel MOS transistor 124 connected between node 125 and the ground node and, receiving an output signal φc of EXOR circuit 122 at its gate, a capacitive element 126 connected between node 125 and the ground node, and an inverter 127 inverting a signal potential of node 125 to output a lock detection circuit DET.

Figure 51:
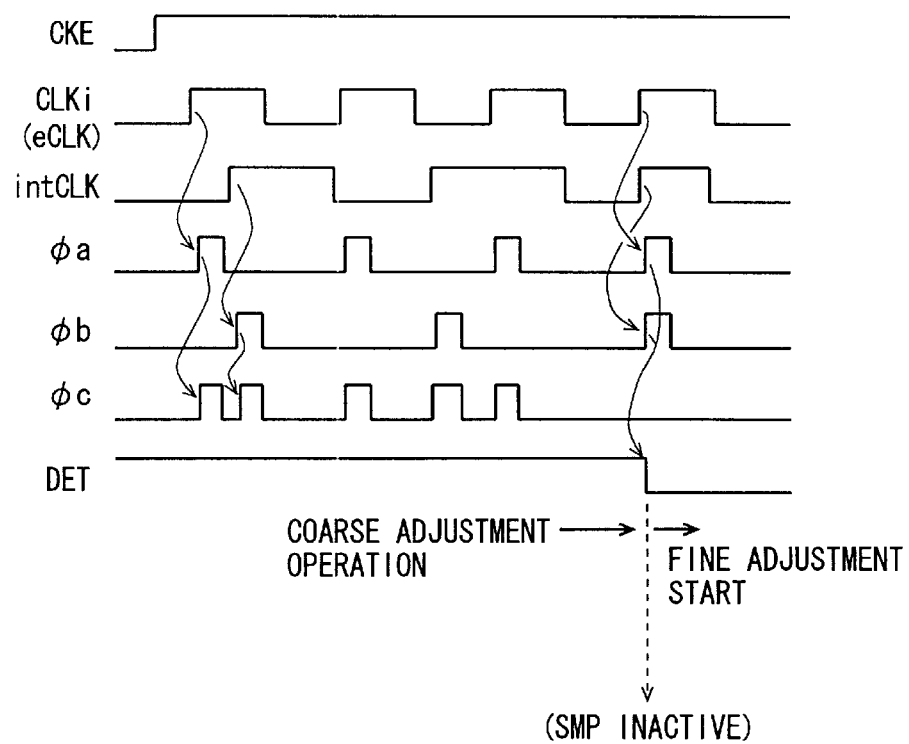
FIG. 51 is a signal waveform diagram representing the operation of circuitry of FIG. 50.

Clock signals CLKi and intCLK are clock signals phase-locking when synchronization is established. The operation of the coarse adjustment/fine adjustment switch circuit of FIG. 50 will be described with reference to the signal waveform diagram of FIG. 51.

Clock enable signal CKE is at an H level. Clock signal CLKi is generated according to external clock signal eCLK. In the initial state, internal clock signal intCLK is generated out of phase even if phase adjustment is carried out by the clock generator. In response to clock signals CLKi and intCLK, one shot pulse signals φa and φb are output from one shot pulse generation circuits 120 and 121, respectively. When the phases are not locked, output signal φc of EXOR circuit 122 is pulled up to an H level according to pulse signals φa and φb. When signal φc attains an H level, MOS transistor 124 is rendered conductive. Node 125 is discharged to the level of ground voltage. When at least one cycle of clock signal CLKi is required to charge capacitive element 126 up to a predetermined voltage, node 125 is discharged by MOS transistor 124 to maintain the voltage level of an L level in the state where the phases are not locked. Detection signal DET attains an H level.

When the phases of clock signals CLKi and intCLK are locked or in synchronization, pulse signals φa and φb from one shot pulse generation circuits 120 and 121 are generated at substantially the same timing (there is an error corresponding to the precision of the coarse adjust circuit). Output signal φc of EXOR circuit 122 maintains an L level. MOS transistor 124 maintains an nonconductive state. Accordingly, capacitive element 126 is charged by the charging current from constant current source 123. The voltage level at node 125 is driven to an H level, and detection signal DET from inverter 127 attains an L level. Determination is made that the coarse adjustment operation is completed when detection signal DET attains an L level. By applying this detection signal DET to the fine adjust circuit, a fine adjust operation can be carried out subsequent to the coarse adjust operation by frequency determination circuit 83 by adjusting activation/inactivation of the signal DET. During the coarse adjustment operation period, sampling trigger signal SMP is applied in synchronization with clock signal CLKi, whereby the coarse adjust operation is executed in frequency determination circuit 83.

By employing the detection circuit shown in FIG. 50, determination is made of establishment of phase-lock of the clock signals at the precision of the delay stage of the delay chain in the frequency determination circuit. The fine adjust circuit does not have to be operated unnecessarily. Therefore, power consumption can be reduced.

The capacitance of capacitive element 126 and the channel resistance of MOS transistor 124 are selected appropriately depending on the phase detection precision of this detection circuit.

When internal clock signal intCLK is applied to the input/output buffer circuit that input/outputs data, an internal activation signal φact generated when active command ACT designating row selection is applied can be used as a signal for switching between the coarse and fine adjustments. Since a read/write command instructing data reading/writing is applied after an active command is provided, a structure in which a fine adjustment operation is initiated when an active command is applied can be employed.

The detection circuit shown in FIG. 50 can be so implemented as to be rendered active when clock enable signal CKE is active.

Figure 52:
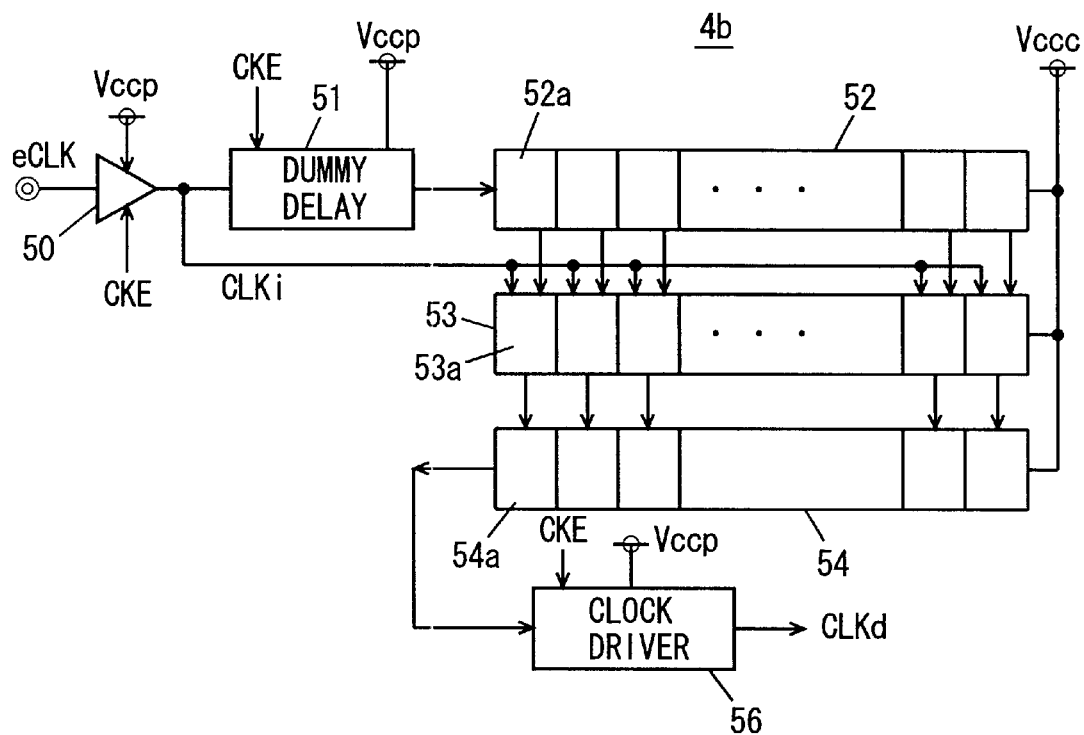
FIG. 52 schematically shows the power supply arrangement of a clock reproduction circuit according to the fifth embodiment of the present invention.

FIG. 52 shows a structure of a modification of the fifth embodiment of the present invention. In FIG. 52, a structure of a synchronizing clock generation circuit employing a SMD is taken as an example. According to the structure of FIG. 52, clock input buffer 50, dummy delay circuit 51 and clock driver 56 receive periphery power supply voltage Vccp as the operating power supply voltage. Forward delay array 52, mirror control circuit 53, and backward delay array 54 that carry out a synchronizing operation receive clock power supply voltage Vccc as the operating power supply voltage. Clock input buffer 50, dummy delay circuit 51 and clock driver 56 have their activation/inactivation controlled according to clock enable signal CKE. In this structure of circuitry employing such a SMD, a MOS transistor of a low threshold voltage can be used for the synchronizing circuit group to implement a synchronizing circuit that operates at high speed, similar to the previous circuit employing a DLL. An advantage described previously with reference to the clock generator can be similarly provided. The illustrated structure can be employed as the coarse adjustment unit in this SMD to adjust the delay of the output clock of the backward delay array by an output signal of a fine adjust unit provided at the input unit of clock driver 56.

According to the fifth embodiment of the present invention, the clock generator is formed of circuitry that carries out coarse adjustment and circuitry that carries out fine adjustment. Therefore, the number of stages of the delay circuits for the coarse adjust circuit can be reduced. Since the delay time of the fine adjust circuit corresponds to a delay time of one delay stage of the coarse adjust circuit and the delay stage of the coarse adjust circuit is shifted by one stage when the adjustment range of the fine adjust circuit is exceeded, an internal clock signal can be locked in phase with an external clock signal at high precision and high speed.

Furthermore, since the fine adjust circuit is arranged at an intermediate position between the circuit servicing point where an internal clock signal is generated and the clock input node, the phase of an internal clock signal can be made to be locked with the phase of an external clock signal easily and speedily.

Only the portion that carries out signal synchronization is supplied with the clock power supply voltage as the operating power supply voltage, and remaining buffer circuitry is supplied with the periphery power supply voltage. Therefore, a MOS transistor of a low threshold voltage can be used for the synchronizing circuitry. An internal clock signal phase-locking can be reliably generated with respect to a clock signal of high speed. By using a MOS transistor of a high threshold voltage as the component in the buffer circuit, current consumption in the power down mode or in the standby mode can be reduced. By rendering the buffer circuit group active/inactive in response to a clock enable signal, an operation according to an unstable potential (noise process) of synchronizing circuitry can be prevented in a power down mode (standby mode). Unnecessary current consumption can be prevented. Also, erroneous operation of circuitry can be prevented.

SIXTH EMBODIMENT

Figure 53:
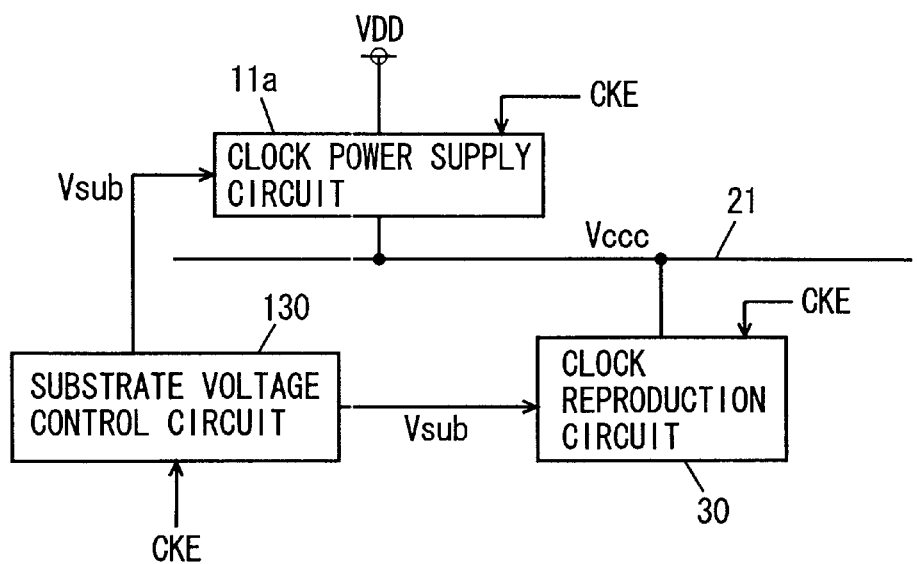
FIG. 53 schematically shows a structure of a main part of a semiconductor integrated circuit device according to a sixth embodiment of the present invention.

FIG. 53 shows a structure of a main part of a synchronous semiconductor memory device according to a sixth embodiment of the present invention. In FIG. 53, a substrate voltage control circuit 130 is provided for clock power supply circuit 11a and clock reproduction circuit 30. Substrate voltage control circuit 130 changes the voltage level of substrate bias voltage Vsub of the MOS transistor forming clock power supply circuit 11a and clock reproduction circuit 30. When clock enable signal CKE is at an inactive state and the synchronous semiconductor memory device is in a power down or standby mode, the substrate bias of the MOS transistors in clock power supply circuit 11a and clock reproduction circuit 30 is increased to reduce the sub threshold leakage current. When clock enable signal CKE is active, substrate voltage control circuit 130 reduces the substrate bias of the MOS transistor in clock power supply circuit 11a and clock reproduction circuit 30 to allow high speed operation.

Figure 54:
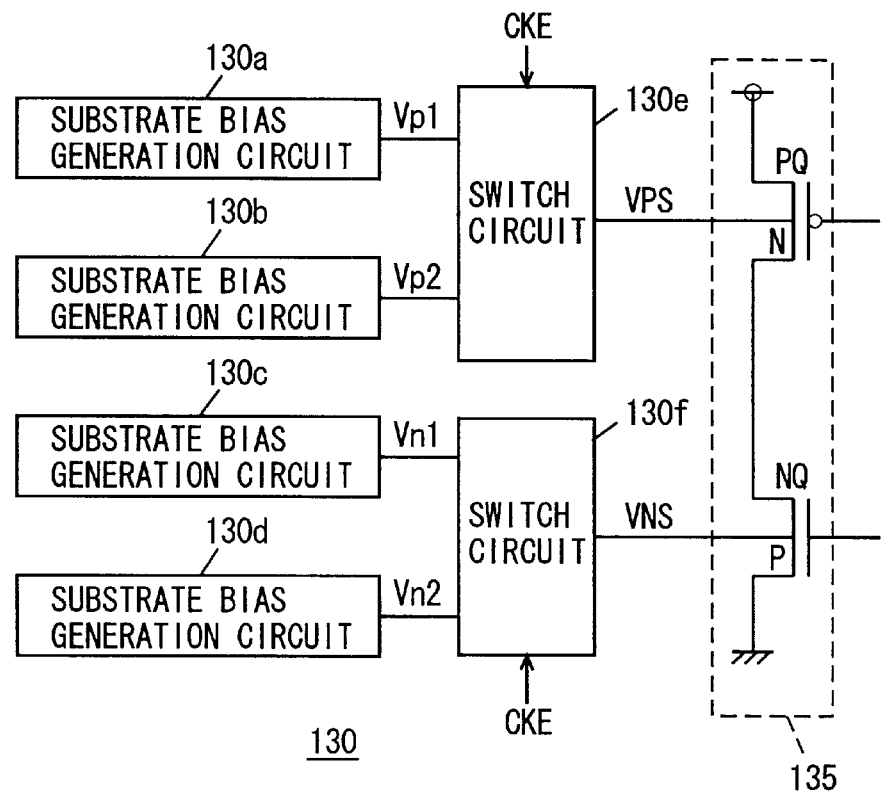
FIG. 54 schematically shows a structure of a substrate voltage control circuit of FIG. 53.

FIG. 54 schematically shows a structure of substrate voltage control circuit 130. In FIG. 54, the circuitry that generates substrate voltages VPS and VNS for the portion of the buffer circuit in clock power supply circuit 11a and clock reproduction circuit 30 is shown.

Referring to FIG. 54, substrate voltage control circuit 130 includes a substrate bias generation circuit 130a generating a substrate bias voltage Vp1, a substrate bias generation circuit 130b generating a substrate bias voltage Vp2, a substrate bias generation circuit 130c generating a substrate bias voltage Vn1, a substrate bias generation circuit 130d generating a substrate bias voltage Vn2, a switch circuit 130e selecting one of substrate bias voltages Vp1 and Vp2 to generate a substrate voltage VPS that is supplied to the p-MOS transistor substrate region according to clock enable signal CKE, and a switch circuit 130f selecting one of substrate bias voltages Vn1 and Vn2 to output a substrate voltage VNS that is applied to the substrate region of the n channel MOS transistor according to clock enable CKE.

Figure 55:
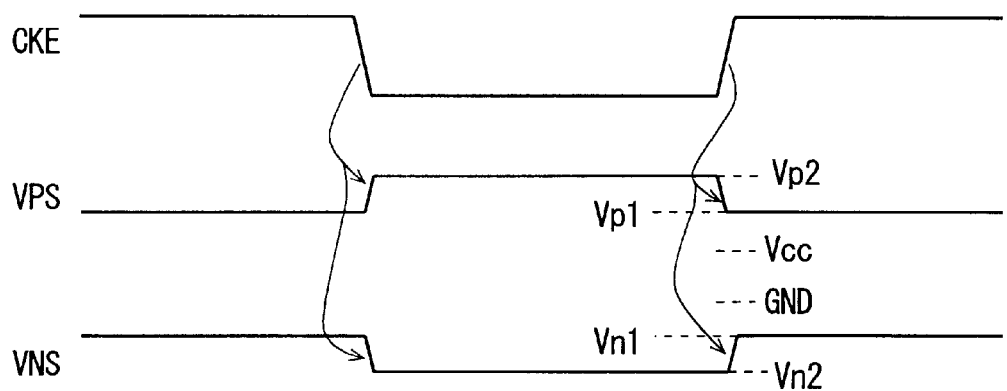
FIG. 55 is a signal waveform diagram representing an operation of the substrate voltage control circuit of FIG. 54.

In FIG. 54, the buffer circuit included in clock power supply circuit 11a and clock reproduction circuit 30 is depicted generically as a circuit 135. This circuit 135 includes a p channel MOS transistor PQ and an n channel MOS transistor NQ. MOS transistor PQ receives substrate voltage VPS from switch circuit 130e at its N type substrate region (well or semiconductor layer). N channel MOS transistor NQ receives substrate voltage VNS from switch circuit 130f at its p type substrate region (well region or semiconductor layer). The operation of substrate voltage control circuit 130 of FIG. 54 will be described with reference to the signal waveform diagram of FIG. 55 now.

The case is considered where substrate bias voltage Vp2 is higher than substrate bias voltage Vp1, and substrate bias voltage Vn1 is higher than substrate bias voltage Vn2. Substrate bias voltages Vn1 and Vn2 are negative voltages.

When clock enable signal CKE is at an active state of an H level, switch circuit 130e select substrate bias voltage Vp1 from substrate bias generation circuit 130a to output the same as substrate voltage VPS. Switch circuit 130f responds to a clock enable signal CKE of an H level to select substrate bias voltage Vn1 from substrate bias generation circuit 130c to output the same as substrate voltage VNS. Under this state, MOS transistors NQ and PQ in circuit 135 operate with respective predetermined threshold voltages.

When clock enable signal CKE is at an inactive state of an L level, the power down mode is entered. Switch circuit 130e selects substrate bias voltage Vp2 from substrate bias generation circuit 130b to generate substrate voltage VPS. Switch circuit 130f selects substrate bias voltage Vn2 from substrate bias generation circuit 130d to output substrate voltage VNS. Under this state, the absolute value of substrate voltage VPS becomes greater. The absolute value of the threshold voltage of MOS transistor PQ is increased. Similarly, the threshold voltage of MOS transistor NQ is increased since the absolute value of substrate voltage VNS becomes greater. The absolute value of the threshold voltages of MOS transistors PQ and NQ becomes greater. Therefore, leakage current (sub threshold leakage current) is reduced. Since external power supply voltage VDD or periphery power supply voltage Vccp is applied to the power supply node of circuit 135, the leakage current can be reduced to allow lower current consumption in a power down mode (or in standby mode).

Figure 56A:
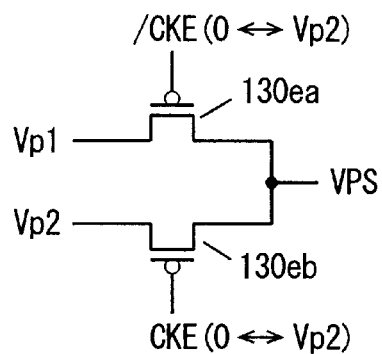
FIGS. 56A and 56B schematically show a structure of the switch circuit of FIG. 54.

FIG. 56A shows an example of switch circuit 130e of FIG. 54. Referring to FIG. 56A, switch circuit 130e includes a transfer gate 130ea formed of a p channel MOS transistor responsive to a complementary clock enable signal /CKE to selectively transmit substrate bias voltage Vp1, and a transfer gate 130eb formed of a p channel MOS transistor responsive to clock enable signal CKE to selectively transmit substrate bias voltage Vp2. The level of substrate bias voltages Vp1 and Vp2 is higher than the level of the power supply voltage (external power supply voltage or periphery power supply voltage). Therefore, level conversion is carried out so that the amplitude of clock enable signals CKE and /CKE is between the ground voltage (0V) and substrate bias voltage Vp2. Transfer gate 130ea conducts when clock enable signal CKE is at an H level, whereby substrate bias voltage Vp1 is selected as substrate voltage VPS. Transfer gate 130eb conducts when clock enable signal CKE is at L level, whereby substrate bias voltage Vp2 is selected as substrate voltage VPS.

Figure 56B:
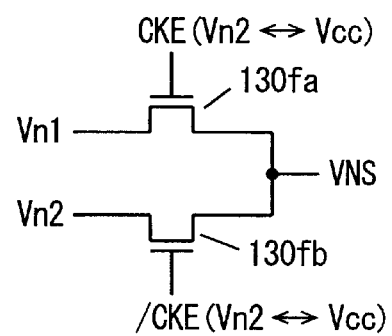

FIG. 56B shows an example of a structure of switch circuit 130f of FIG. 54. Referring to FIG. 56B, switch circuit 130f includes a transfer gate 130fa formed of an n channel MOS transistor responsive to clock enable signal CKE to selectively transmit substrate bias voltage Vn1, and a transfer gate 130*fb* formed of an n channel MOS transistor selectively rendered conductive in response to complementary clock enable signal /CKE to transmit substrate bias voltage Vn2. Substrate bias voltages Vn1 and Vn2 are negative voltages. Clock enable signals CKE and /CKE have their level converted to change between voltage Vn2 and power supply voltage Vcc. Power supply voltage Vcc is periphery power supply voltage Vccp or external power supply voltage VDD.

In switch circuit 130*f* of FIG. 56B, transfer gate 130*fa* conducts when clock enable signal CKE is at an H level, whereby substrate bias voltage Vn1 is selected as substrate bias voltage VNS. When clock enable signal CKE is at an L level (the level of negative voltage Vn2), transfer gate 130*fb* conducts, whereby substrate bias voltage Vn2 is selected as substrate voltage VNS.

Conversion of the level of clock enable signals CKE and /CKE is carried out using a general latch type level converter.

Figure 57:
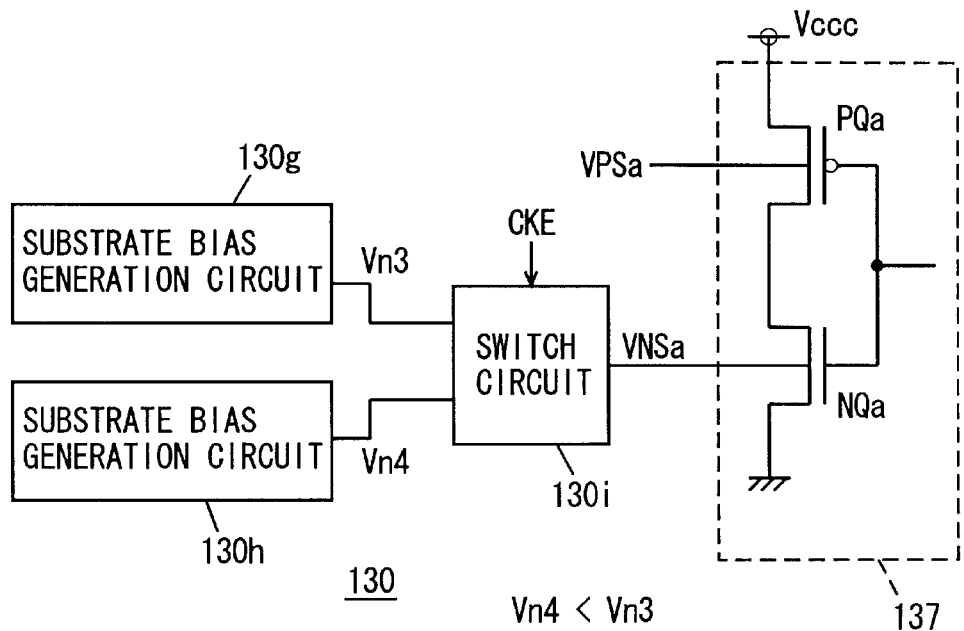
FIG. 57 schematically shows a structure of the clock reproduction circuit of the substrate voltage control circuit of FIG. 53.

FIG. 57 schematically shows a structure related to the synchronizing circuitry of the substrate voltage control circuit shown in FIG. 53. Referring to FIG. 57, substrate voltage control circuit 130 includes a substrate bias generation circuit 130*g* generating a substrate bias voltage Vn3, a substrate bias generation circuit 130*h* generating a substrate bias voltage Vn4, and a switch circuit 130*i* providing one of substrate bias voltages Vn3 and Vn4 as substrate voltage VNS according to clock enable signal CKE. In FIG. 57, a circuit 137 included in this synchronization circuit (delay chain and tap chain) is depicted representatively. This circuit 137 is formed of a CMOS inverter including a p channel MOS transistor PQa and an n channel MOS transistor NQa. Substrate voltage VNSa from switch circuit 130*i* is applied to the substrate region of n channel MOS transistor NQa. A constant substrate bias voltage VPSa is applied to the substrate region of p channel MOS transistor PQa. The source of p channel MOS transistor PQa receives clock power supply voltage Vccc. MOS transistors PQa and NQa are MOS transistors of a low threshold voltage to operate at high speed when clock enable signal CKE is active. In this state, switch circuit 130*i* selects substrate bias voltage Vn3 from substrate bias generation circuit 130*g* to apply the same as substrate voltage VNSa.

When clock enable signal CKE is at an inactive state of an L level, switch circuit 130*i* selects substrate bias voltage Vn4 from substrate bias generation circuit 130*h* to apply the same as substrate voltage VNSa to the substrate region of MOS transistor NQa. Under this state, the threshold voltage of MOS transistor NQa is increased to suppress the leakage current thereof. When clock enable signal CKE is inactive, power supply voltage Vccc is discharged to the level of the ground voltage. By maintaining MOS transistor PQa at the state of a low threshold voltage, power supply voltage Vccc is discharged via MOS transistor PQa to the level of the ground voltage speedily. Even when the signal output node of MOS transistor NQa attains an unstable voltage level, increase in current consumption or erroneous operation caused by this unstable voltage level (due to noise and the like) is suppressed by this discharging.

A structure similar to that shown in FIG. 56B can be used for switch circuit 130*i*. Substrate bias generation circuits 130*a*–130*d* and 130*g* and 130*h* are formed of a general circuit that utilizes the charge pump operation of a capacitor. A structure can be employed in which substrate bias generation circuits 130*a*–130*d* and 130*g* and 130*h* are selectively rendered active according to activation/inactivation of clock enable signal CKE.

In circuit 137, the back gate (substrate region) of MOS transistor PQa can be coupled to receive clock power supply voltage Vccc.

Figure 58:
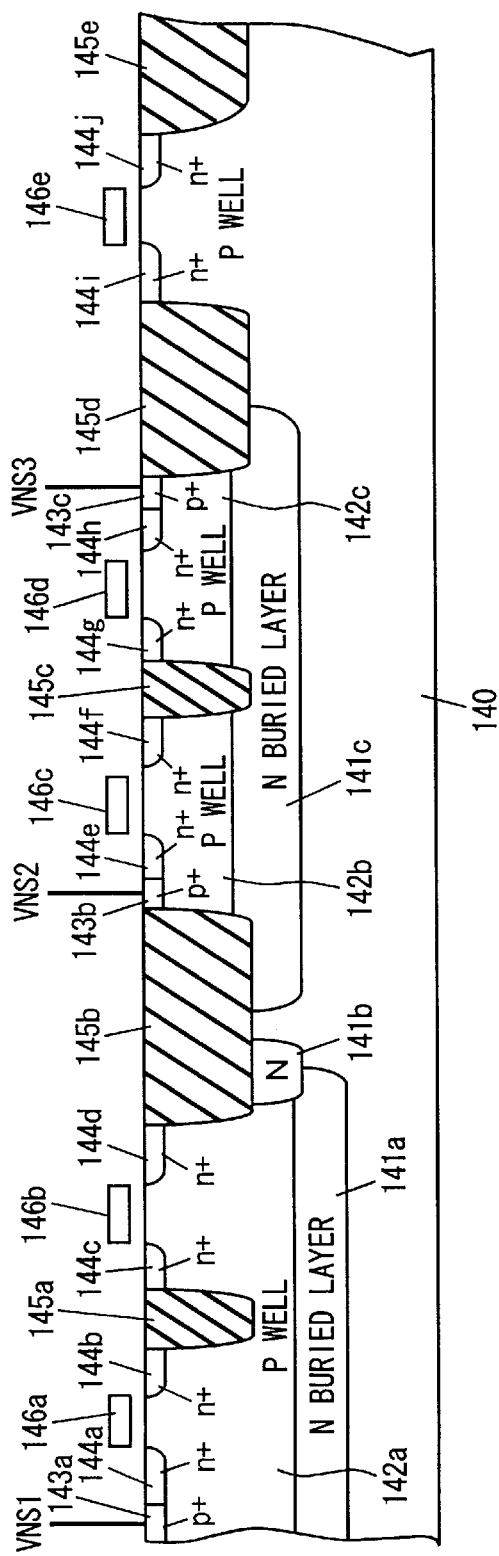
FIG. 58 is a schematic sectional view of a structure of the portion receiving a substrate bias voltage of the sixth embodiment.

FIG. 58 is a schematic sectional view of the structure of the portion receiving substrate voltage VNS. In FIG. 58, an N type buried layer 141*a* is formed in a P well 140. An N type buried layer 141*b* shallower than N type buried layer 141*a* is formed at the end of N type buried layer 141*a*. An N type buried layer 141*c* is formed apart from and substantially at the same depth of N type buried layer 141*b*.

A P well 142*a* is formed on N type buried layer 141*a*. P wells 142*b* and 142*c* are formed on N type buried layer 141*c*. A P type impurity region 143*a* of high concentration is formed at the surface of P well 142*a* to which substrate voltage VNS1 is applied. A P+ type impurity region 143*b* is formed at the surface of P well 142*b*. Substrate voltage VNS2 is applied to P well 142*b* via impurity region 143*b*. A P (p+) type impurity region 143*c* of high concentration is formed at the surface of P well 142*c*. Substrate voltage VNS3 is applied to P well 142*c* via impurity region 143*c*.

N (n+) impurity regions 144*a* and 144*b* of high concentration are formed spaced apart from each other at the surface of P well 142*a*. Also, N type impurity regions 144*c* and 144*d* of high concentration are formed spaced apart from each other at the surface of P well 142*a*. A trench isolation region 145*a* is formed between impurity regions 144*b* and 144*c*. A gate electrode layer 146*a* is formed on the channel region between impurity regions 144*a* and 144*b*. A gate electrode layer 146*b* is formed on the channel region between impurity regions 144*c* and 144*b*. Trench isolation region 145*a* does not reach N type buried layer 141*a*. The n channel MOS transistor formed at P well 142*a* receives the same substrate voltage VNS1 at its substrate region. Trench isolation region 145*a* isolates impurity regions 144*b* and 144*c* to isolate the adjacent transistor elements.

A trench isolation region 145*b* reaching N type buried layers 141*b* and 141*c* is formed between P well 142*a* and 142*b*. N type impurity regions 144*e* and 144*f* of high concentration are formed spaced apart at the surface of P well 142*b*. A gate electrode layer 146*c* is formed on the channel region between impurity regions 144*e* and 144*f*. N type impurity regions 144*g* and 144*h* of high concentration are formed at the surface of P well 142*c*. A gate electrode layer 146*d* is formed on the channel region between impurity regions 144*g* and 144*h*. A trench isolation region 145*c* reaching N type buried layer 141*c* is formed between P wells 142*b* and 142*c*. Accordingly, the N type MOS transistors formed at P wells 142*b* and 142*c* are isolated from each other. This arrangement allows substrate voltages VNS2 and VNS3 of P wells 142*b* and 142*c* to be set to optimum values independent to each other.

A trench isolation region 145*d* reaching N type buried layer 141*c* is formed adjacent to P well 142*c*. N type impurity regions 144*i* and 144*j* of high concentration are formed at the surface of P well 140 between trench isolation regions 145*d* and 145*e*. A gate electrode layer 146*e* is formed on the channel region between impurity regions 144*i* and 144*j*. An appropriate bias voltage is applied to P well 140 at the portion not shown.

Trench isolation regions 145*a*–145*b* have substantially the same depth. By differentiating the depth of N type buried layer 141*a* from the depth of N type buried layers 141*b* and 141*c*, the substrate region can be used in common by the plurality of n channel MOS transistors in P well 142*a*. Accordingly, a common substrate voltage VNS1 can be applied. Since P wells 142*b* and 142*c* are isolated from each other by trench isolation regions 145c and N type buried layer 141c, substrate voltages VNS2 and VNS3 can be set independent of each other. Therefore, the substrate voltage can be set on the basis of a MOS transistor in P wells 142b and 142c.

By employing an N type buried layer of two stages and a trench isolation region of substantially the same depth, the substrate voltage can be set for a group of a plurality of transistors and for each transistor. Therefore, the substrate voltage can be set at an appropriate value according to each circuit configuration. For example, in P wells 142b and 142c, MOS transistors of the buffer circuit included in the clock reproduction circuit can be formed to select an optimum value for the threshold voltage of the MOS transistors of each buffer. In P well 142a, an n channel MOS transistors forming the inverters included in the delay chain, for example, are formed to allow operation under the same operating condition by setting the bias voltage to the same substrate voltage VNS1. The MOS transistor formed at the surface of P well 140 is used for a peripheral control circuit.

An optimum threshold voltage can be selected depending on the applied usage to realize a clock reproduction circuit that has the optimum operating characteristic.

The structure shown in FIG. 58 corresponds to an n channel MOS transistor. For a p channel MOS transistor, the structure shown in FIG. 58 can be employed with the conductivity type of each region opposite. Accordingly, the threshold voltage can be set in the unit of a plurality of MOS transistors and in the unit of each p channel MOS transistor for the p channel MOS transistors.

According to the sixth embodiment of the present invention, the threshold voltage of the MOS transistor of the clock generator is altered according to a power down mode (standby mode) and the normal operation mode. Therefore, high speed operation and lower current consumption can be realized. An optimum threshold voltage can be set for each circuit particularly in the case where the threshold voltages of respective MOS transistors differ between the buffer circuit and the synchronization circuit. Therefore, current consumption (leakage current) can be reliably suppressed in a standby mode. A clock reproduction circuit that operates at low current consumption and at high speed can be realized.

SEVENTH EMBODIMENT

Figure 59:
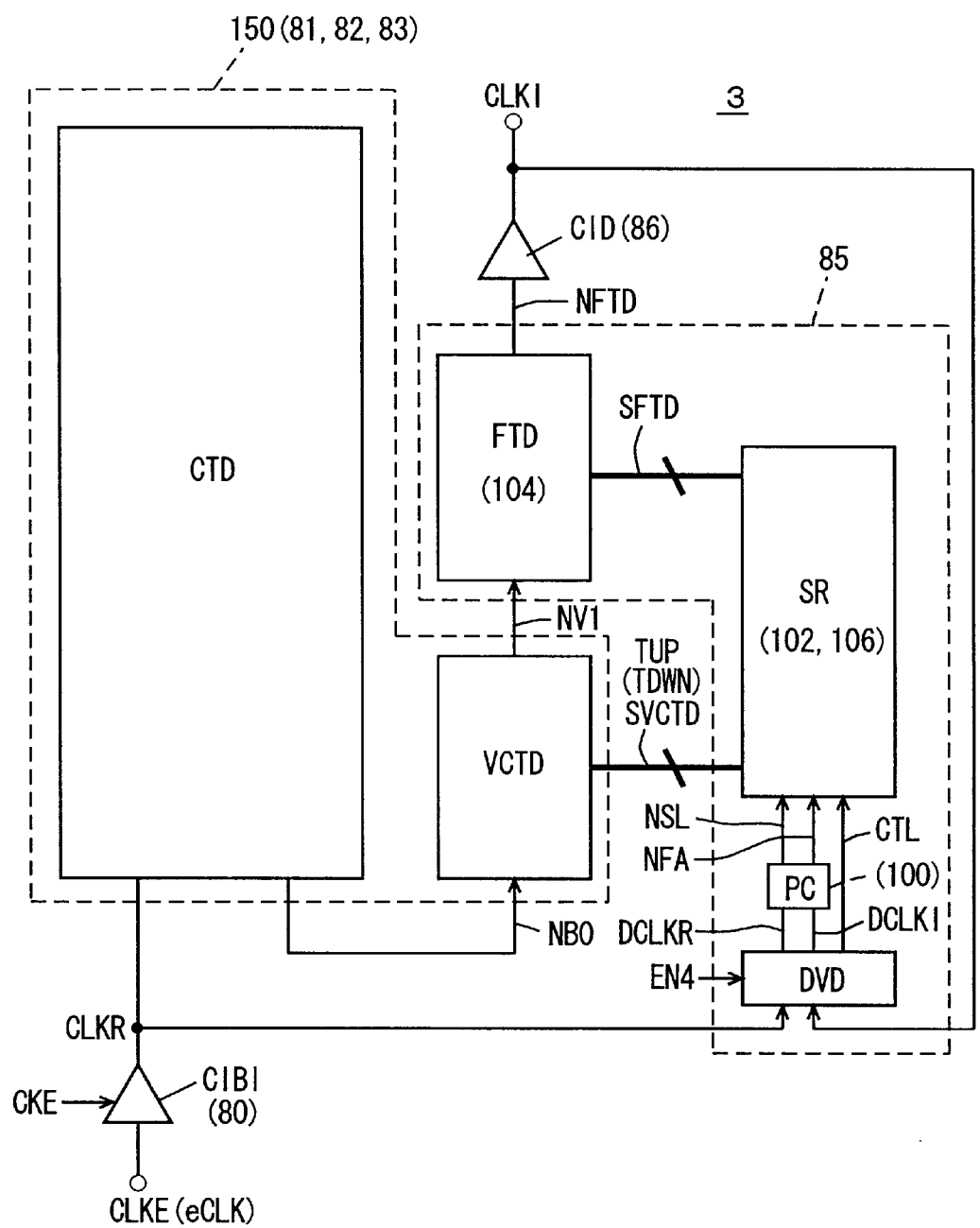
FIG. 59 schematically shows a structure of a clock reproduction circuit according to a seventh embodiment of the present invention.

FIG. 59 schematically shows a structure of a clock reproduction circuit according to a seventh embodiment of the present invention. The clock reproduction circuit of FIG. 59 is depicted so as to correspond to the structure of clock generator 3 of FIG. 37. However, the clock reproduction circuit of FIG. 59 is also applicable to synchronizing clock generation circuit 4 (SMD) of FIG. 1. It is assumed that the clock reproduction circuit of FIG. 59 corresponds to the structure of clock generator 3 shown in FIG. 37 in the following description.

Referring to FIG. 59, clock generator 3 includes a clock input buffer CIBI enabled when (internal) clock enable signal CKE is active to buffer an external clock signal CLKE (eCLK) to generate a reference clock signal CLKR, a coarse adjust circuit 150 generating an internal clock signal NV1 phase-locking with external clock signal CLKE at a first precision according to reference clock signal CLKR from clock input buffer CIBI, a fine adjust circuit 85 adjusting the phase of clock signal NV1 output from coarse adjust circuit 150 at a second precision according to the phase comparison between reference clock signal CLKR and internal clock signal CLKI, and a clock driver CID buffering a clock signal NFTD output from fine adjust circuit 85 to generate internal clock signal CLKI.

In the relationship of correspondence with FIG. 37, clock input buffer CIBI corresponds to clock input buffer 80 of FIG. 37, and coarse adjust circuit 150 corresponds to dummy delay circuit 81, sampling buffer circuit 82 and frequency determination circuit 83 shown in FIG. 37. Fine adjust circuit 85 corresponds to fine adjust circuit 85 of FIG. 37. Clock driver CID corresponds to clock buffer 86 of FIG. 37. The clock reproduction circuit of FIG. 59 matches the phase of external clock signal CLKe with the phase of clock signal CLKI from clock driver CID, through the arrangement that the clock signal is delayed by a backward delay chain having the number of delay stages set by the tap chain after coarse adjustment is completed.

Coarse adjust circuit 150 includes a coarse delay adjust circuit CTD generating a clock signal NB0 phase-locking at the first precision with external clock signal CLKE from reference clock signal CLKR, and a variable coarse delay adjust circuit VCTD having the delay time adjusted according to an adjust designating signal SVCTD output from fine adjust circuit 85 to delay output signal NB0 of coarse delay adjust circuit CTD for output. Delay adjust signal SVCTD of fine adjust circuit 85 corresponds to tap up designating signal TUP and tap down designating signal TDWN shown in FIG. 37.

Fine adjust circuit 85 includes a frequency divider DVD rendered active in response to activation of a fine adjust activation signal (clock control signal) EN4, receiving reference clock signal CLKR and internal clock signal CLKI to generate a phase comparison standard clock signal DCLKR, a phase comparison internal clock signal DCLKI and a shift control clock signal CTL, a phase comparator PC comparing the phases of clock signals DCLKR and DCLKI output from frequency divider DVD, a fine delay adjust circuit FTD adjusting the delay time of clock signal NV1 output from variable coarse delay adjust circuit VCTD at a second precision, and a shift register SR carrying out a shift operation according to signals NFA and NSL output from phase comparator PC to adjust the delay time of variable coarse delay adjust circuit VCTD and fine delay adjust circuit FTD.

Shift register SR carries out shifting according to shift control clock signal CTL from frequency divider DVD. Clock signals DCLKR and DCLKI and shift clock signal CTL are generated alternately. Therefore, the phase comparison operation by phase comparator PC and the shift operation by shift register SR are executed alternately every clock cycle. According to the relationship of correspondence with fine adjust circuit 85 of FIG. 43, phase comparator PC corresponds to phase comparison circuit 100. Fine delay adjust circuit FTD corresponds to fine delay adjust circuit 104. Shift register SR corresponds to bi-directional shift register 102 and decision circuit 106. Clock driver CID corresponds to clock buffer 86.

According to the structure of the clock generator of FIG. 59, the timing error between external clock signal CLKE and internal clock signal CLKI generated by delaying the external clock signal according to the cycle period of the external clock signal is determined by coarse adjust circuit 150 and fine adjust circuit 85 to reduce the phase difference between external clock signal CLKE and internal clock signal CLKI. Particularly, when clock generator 3 is rendered active in power-on or in releasing the power down mode (standby mode), a delay time according to the cycle period of external clock signal CLKE is set by coarse adjust circuit 150. Upon completion of that coarse adjustment operation, the phase between external clock signal CLKE and internal clock signal CLKI is adjusted to generate an internal clock signal CLKI of an extremely small phase error by fine adjust circuit 85.

When the phase error between external clock signal CLKE and internal clock signal CLKI exceeds the adjustable range of fine adjust circuit 85, fine adjust circuit 85 shifts the delay time of variable coarse delay adjust circuit VCTD by one unit by control signal SVCTD to carry out a fine adjustment operation. Thus, an internal clock signal phase-locking with an external clock signal can be generated speedily and properly even when the operating environment changes, as in a case when the power is turned on or when a power down mode is released. Furthermore, when the phase of internal clock signal CLKI changes exceeding the adjusting range of fine adjust circuit 85 caused by change in the operating environment, for example, by operation of internal circuitry in a normal operation mode, the phase of internal clock signal CLKI can be fine-adjusted in fine adjust circuit 85 after adjusting the delay time of coarse adjust circuit 150.

Figure 60:
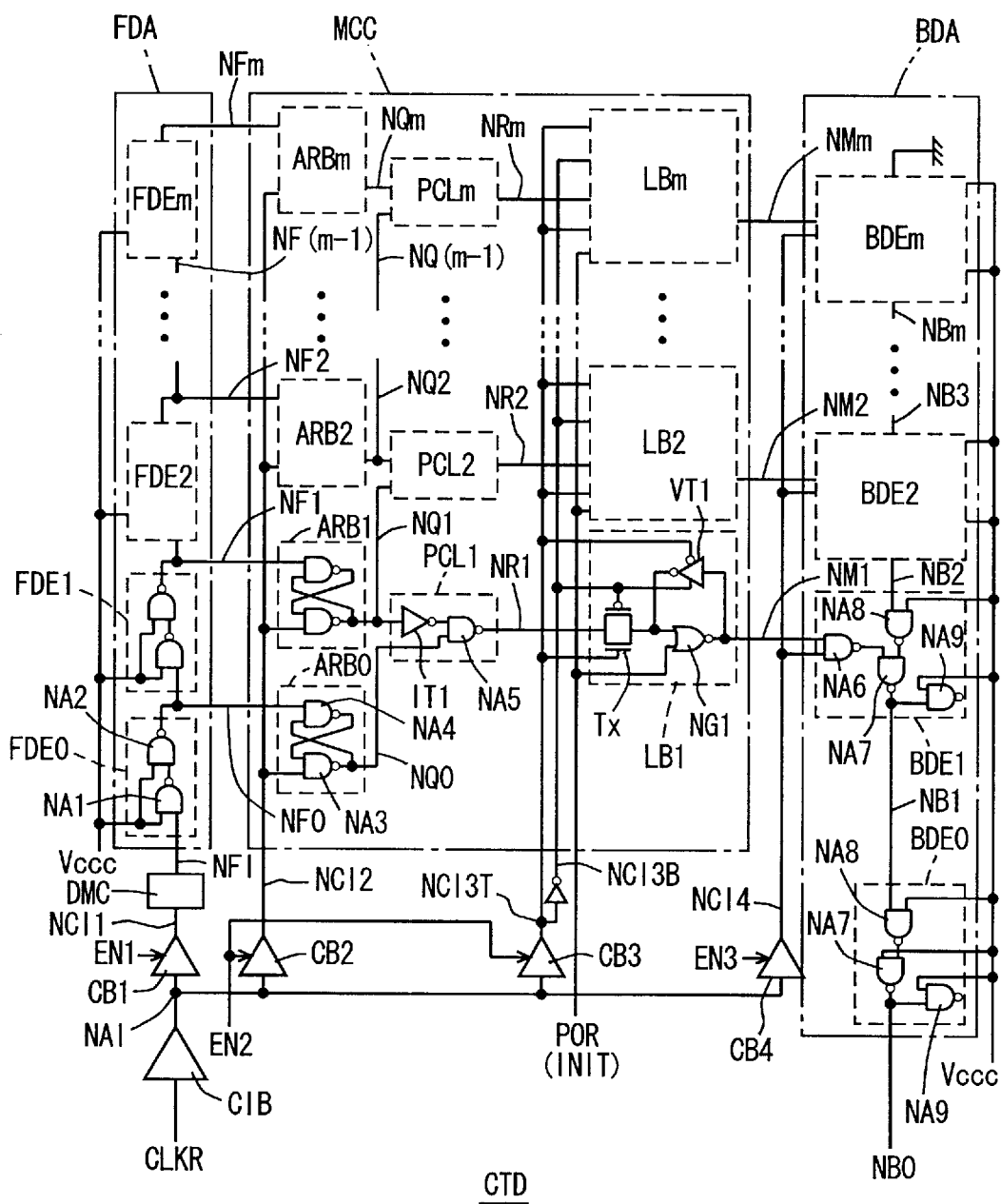
FIG. 60 shows an example of the structure of the coarse delay adjustment circuit of FIG. 59.

FIG. 60 shows a structure of coarse delay adjust circuit CTD of FIG. 59. Referring to FIG. 60, coarse delay adjust circuit CTD includes a clock input buffer CIB to buffer reference clock signal CLKR from clock input buffer CIBI shown in FIG. 59, and clock buffers CB1–CB4 connected in parallel to each other and receiving clock signal NAI output from clock input buffer CIB. Clock buffer CB1 is rendered active in response to activation of clock control signal EN1. Clock buffers CB2 and CB3 are rendered active when clock control signal EN2 is active. Clock buffer CB4 is rendered active when clock control signal EN3 is active. The coarse adjust time and the fine adjust time are determined according to the these clock control signals EN1, EN2 and EN3. Clock buffers CB1–CB4 have a delay time of tDCB.

Coarse delay adjust circuit CTD further includes a delay monitor circuit (dummy delay circuit) DMC delaying output signal NCI1 of clock buffer CB1 by a predetermined time, a forward delay array SDA delaying output signal NFI of delay monitor circuit DMC, a mirror control circuit MCC comparing the phase of output signals NF0–NFm of forward delay array FDA with the phase of output signal NCI2 of clock buffer CB2 to set the delay time according to the comparison result, and a backward delay array BDA delaying output signal NCI4 of clock buffer CB4 to output a coarse delay clock signal NB0 according to output signals NM1–NMm of mirror control circuit MCC.

The delay time of delay monitor circuit DMC is selected to compensate for signal propagation delay of each circuit in order to put the phase of external clock signal CLKE in phase with internal clock signal CLKI (details will be described afterwards).

Forward delay array FDA includes cascaded delay circuits FDE0–FDEm. Delay circuit FDEi (i=0~m) includes a NAND circuit NA1 receiving the output signal of a delay circuit FDEi–1 of the (i–1)th stage and power supply voltage VCCC, and a NAND circuit NA2 receiving power supply voltage VCCC and the output signal of NAND circuit NA1. NAND circuits NA1 and NA2 each receive operating power supply voltage VCCC at one input to operate as an inverter. The reason why a NAND circuit is used is to relatively increase the delay time and to provide a sharp rising characteristic.

Mirror control circuit MCC includes arbiter circuits ARB0–ARBm provided corresponding to delay circuits FED0–FEDm, respectively, to compare the phase of output signals NF0–NFm of corresponding delay circuits with the phase of output signal NCI2 of clock buffer CB2, logic circuits PCL1–PCLm provided corresponding to arbiter circuits ARB1–ARBm, respectively, and receiving the output signals of the arbiter circuits of the preceding stages and the output signals of corresponding arbiter circuits to set the delay time of one cycle period of the clock signal, and latch circuits LB1–LBm provided corresponding to logic circuits PCL1–PCLm, respectively, to latch output signals of corresponding logic circuits according to complementary clock signals NCI3T and NCI3B from clock buffer CB3. The delay time of backward delay array BDA is set according to output signals NM1–NMm of latch circuits LB1–LBm.

Each of arbiter circuits ARB0–ARBm has the same structure, and includes cross-coupled NAND circuits NA3 and NA4. NAND circuit NA3 receives output signal NCI2 of clock buffer CB2 and the output signal of NAND circuit NA4 to output a signal NQi (i=0~m). NAND circuit NA4 receives output signal NFi of a corresponding delay circuit FDEi and the output signal of NAND circuit NA3.

Each of logic circuits PCL1–PCLm has the same structure. Logic circuit PCLi includes an inverter IT1 receiving the output signal of a corresponding arbiter circuit ARBi, and a NAND circuit NA5 receiving the output signal NQ (i–1) of the arbiter circuit of the preceding stage and the output signal of inverter IT1 to generate output signal NRi. Logic circuits each PCL1–PCLm drive output signal NRi to an L level when output signal NQi of a corresponding arbiter circuit ARBi is at an L level and output signal NQ (i–1) of the arbiter circuit of the preceding stage is at an H level.

Latch circuits LB1–LBm have the same structure. Latch circuit LBi includes a CMOS transmission gate Tx rendered conductive in response to complementary clock signals NCI3T and NCI3B from clock buffer CB3 to pass output signal NRi of a corresponding logic circuit PCLi, a NOR circuit NG1 receiving a power on detection signal POR and the output signal from CMOS transmission gate Tx to generate an output signal NMi, and a clocked inverter buffer VT1 rendered active in response to clock signals NCI3T and NCI3B to transmit the output signal of NOR circuit NG1 to the input of NOR circuit NG1. Clocked inverter VT1 is rendered inactive and active when CMOS transmission gate Tx is conducting and non-conducting, respectively. These active clocked inverters VT1 and NOR circuit NG1 form a latch circuit.

Power on detection signal POR attains an H level for a predetermined time, when power is turned on, to initialize output signals NM1–NMm of latch circuits LB1–LBm to an L level. Power on detection signal POR is driven to an L level when power supply voltage VCCC is stabilized, whereby NOR circuit NG1 operates as an inverter. This power on detection signal POR can be used in combination with initialization signal INIT of the previous third embodiment.

Backward delay array BDA includes cascaded delay circuits BDE0–BDEm. Each of delay circuits BDE0–BDEm has a delay time TD equal to that of each of delay circuits FDE0–FDEm in forward delay array FDA. Delay circuits BDE1–BDEm have the same structure. Delay circuit BDEj j=1–m) includes a NAND circuit NA6 receiving the output signal of a corresponding latch circuit LBj and output signal NCI4 of clock buffer CB4, a NAND circuit NA8 receiving output signal NB (j+1) of delay circuit BDE (j+1) of the preceding stage and power supply voltage VCCC, a NAND circuit NA7 receiving the output signals of NAND circuits NA6 and NA8, and a NAND circuit NA9 receiving the output signal of NAND circuit NA7 and power supply voltage VCCC. NAND circuit NA9 corresponds to NAND circuit NA4 included in arbiter circuits ARB1–ARBm to make respective output loads of delay circuits FDE1–FDEm of forward delay array FDA equal to the output loads of the delay circuits of backward delay array BDA.

Delay circuit BDE0 includes a NAND circuit NA8 receiving output signal NB1 of delay circuit BDE1 and power supply voltage VCCC, a NAND circuit NA7 receiving the output signal of NAND circuit NA8 and power supply voltage VCCC, and a NAND circuit NA9 receiving the output signal of NAND circuit NA7 and power supply voltage VCCC. Since this delay circuit BDE0 does not have a corresponding latch circuit, NAND circuit NA7 receives power supply voltage VCCC instead of the output signal of a corresponding latch circuit. The ground voltage is applied to NAND circuit NA8 of delay circuit BDEm. The operation of coarse delay adjust circuit CTD of FIG. 60 will be described with reference to the timing chart of FIG. 61.

Figure 61:
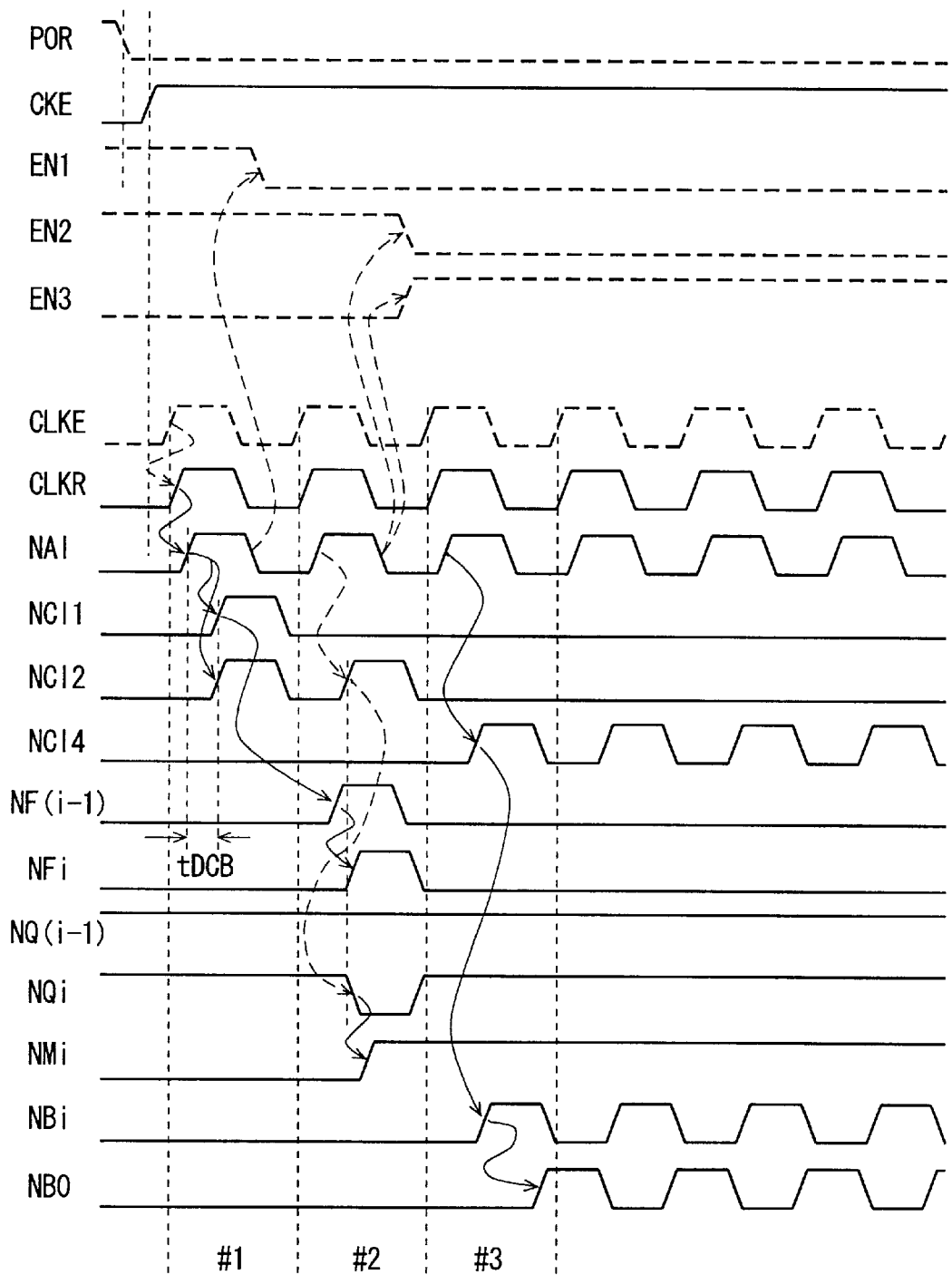
FIG. 61 is a timing chart representing the operation of the coarse delay adjustment circuit of FIG. 60.

In FIG. 61, the clock signal propagated within coarse delay adjust circuit CTD is indicated by a solid line. The control signals and external clock signal CLKE are indicated by a broken line. When power is turned on, power on detection signal POR is driven to an H level for a predetermined time. Output signals NM1–NMm of latch circuits LB1–LBm are initialized to an L level. When the initialization operation is completed and power on detection signal POR is rendered inactive at an L level, internal clock enable signal CKE is set to an L level according to an external clock enable signal.

In response to the drive of clock enable signal CKE to an active state of an H level, clock input buffer CIBI shown in FIG. 59 is rendered active to buffer internal clock signal CLKE to generate reference clock signal CLKR. Clock input buffer CIB buffers reference clock signal CLKR for transmission to clock input buffers CB1–CB4. After the power is turned on, clock control signals EN1 and EN2 are maintained at an active state of an H level whereas clock control signal EN3 is maintained at an inactive state of an L level. Therefore, clock buffer CB4 maintains an inactive state at clock cycle #1. Clock buffer CB1 buffers clock signal NA output from clock input buffer CIB for transmission to forward delay array FDA via delay monitor circuit DMC. Clock buffers CB2 and CB3 are at an enable state to generate signals NCI2, NCI3T and NCI3B according to clock signal NAI from clock input buffer CAB.

Even when clock signal NCI2 from clock buffer CB2 is transmitted to arbiter circuits ARB0–ARBm at clock cycle #1, all output signals NF0–NFm are at an L level in forward delay array FDA since the clock signal has not yet arrived at forward delay array FDA. Therefore, when output signal NCI2 of clock buffer CB2 rises to an H level, output signals NQ0–NQm of arbiter circuits ARB0–ARBm fall to an L level. In response, output signals NR1–NRm of logic circuits PCL1–PCLm are driven to an H level. When clock signal NCI3T is still at an H level, CMOS transmission gates Tx in respective latch circuits LB1–LBm are rendered conductive to transmit the output signals of logic circuits PCL1–PCLm to NOR circuits NG1. Since all signals NR1–NRm are at an H level, output signals NM1–NMm of latch circuits LB1–LBm are at an L level.

In backward delay array BDA, no signal transfer operation is carried out since the output signal of clock buffer CB4 is at an L level and also the output signals of latch circuits LB1–LBm are at an L level. When clock signals NCI3T and NCI3B attain an L level and an H level, respectively, CMOS transmission gate Tx is rendered nonconductive, whereby latch circuits LB1–LBm attain a latch state to maintain signals NM1–NMm at an L level.

When output signal NAI of clock input buffer CIB falls to an L level at clock cycle #1, clock control signal EN1 is rendered inactive at an L level. Clock buffer CI1 has its output set to an L level. In forward delay array FDA, only clock signal NAI generated at clock cycle #1 is transmitted.

At clock cycle #2, output signals NF0–NFm of forward delay array FDA are sequentially driven to an H level according to clock signal NFI applied at clock cycle #1. Also, clock buffer CB2 drives output signal NCI2 to an H level according to output signal NAI of clock input buffer CIB. The phase of signal NCI2 generated at clock cycle #2 is compared with the phase of output signals NF0–NFm of forward delay array FDA at arbiter circuits ARB0–ARBm.

Consider a case where the phases of signals NF0–NF (i−1) are ahead and signals NFi–NFm are behind relative to the phase of signal NCI2 in forward delay array FDA. The phases of output signals NF0–NFm of forward delay array FDA are compared with the phase of output signal NCI2 of clock buffer CB2 in arbiter circuits ARB0–ARBm. Since signal NCI2 rises earlier than signal NFi in arbiter circuit ARBi, output signal NQi thereof attains an L level during the H level period of signal NCI2. In arbiter circuit ARB (i−1), corresponding output signal NF (i−1) rises earlier than signal NCI2 in forward delay array FDA. Therefore, output signal NQ (i−1) maintains the H level. When signal NF (i−1) attains an L level and signal NCI2 is at an H level, the output signal of arbiter circuit ARB (i−1) falls to an L level. However, the fall period of signal NQ (i−1) is so short that the effect thereof can be neglected by the propagation delay time of logic circuit PCL1 and latch circuit LB1. More specifically, even when output signal NRi of logic circuit PCLi is driven to an H level in response to the fall of signal NQ (i−1), the fall of clock signal NCI3T to an L level causes latch circuit LBi to attain a latching state prior to the fall of signal NR (i−1) according to the signal propagation delay time and the latch operation of latch circuit LBi. As a result, output signal NM (i−1) of latch circuit LB (i−1) maintains an L level.

In logic circuit PCLI, output signal NRi is pulled down to an L level during the H level period of signal NCI2. Therefore, output signal NMi of latch circuit LBi is pulled up to an H level, whereby signal NMi of the H level is latched in response to the fall of clock signal NCI3T.

In arbiter circuit ARB (i+1), corresponding output signal NF (i+1) of forward delay array FDA is driven to an H level behind signal NCI2. In arbiter circuit ARB (i+1), output signal NQ (i+1) is pulled down to an L level according to the rise of signal NCI2 to an H level. However, logic circuit PCL (i+1) provides an output signal NR (i+1) maintaining an H level since the output signal NQi of arbiter circuit ARBi of the preceding stage received by NAND circuit NA5 is an L level. More specifically, logic circuits PCL1–PCLm function to select the output of the select circuit that outputs a clock signal phase-locking with signal NCI2 in forward delay array FDA. Therefore, signal NQ (i−1) is illustrated maintaining the H level since output signal NRi of one logic circuit PCLi is driven to an L level by mirror control circuit MCC.

When output signal NAI of clock input buffer CIB is pulled down to an L level at clock cycle #2, clock control signal EN2 is driven to an L level. Clock buffer CB2 has its output set to an L level. Thus, the phase comparison operation is completed.

At clock cycle #2, clock control signal EN3 is rendered active in response to the fall of signal NAI to render clock buffer CB4 active. By inactivation of clock control signal EN2 at clock cycle #2, the affect of the short fall of output signal NQ (i−1) of arbiter circuit ARB (i−1) caused by signal NF (i−1) can be eliminated. This is because CMOS transmission gates Tx of latch circuits LB1–LBm can be set nonconductive at a time earlier than the fall of clock signal NCI2 in latch circuits LB1–LBm.

At clock cycle #3, clock buffer CB4 is rendered active, whereby output signal NCI4 is altered according to signal NAI from clock input buffer CIB. Clock buffer CB4 has a delay time tDCB identical to that of clock buffers CB2 and CB3. In backward delay array BDA, the valid delay circuit is set according to the output signals of latch circuits LB1–LBm. More specifically, when output signal NMi of a corresponding latch circuit is at an H level, NAND circuit NA6 operates as an inverter at delay circuit BDEi. Clock signal NCI4 from clock buffer CB4 is transmitted to NAND circuit NA7. In the other delay circuit BDEj, output signal NMj of a corresponding latch circuit LBj is at an L level. Therefore, the output signal of NAND circuit NA6 is fixed at an H level. In delay circuit BDEj, the delay circuit is formed of NAND circuits NA7 and NA8. Accordingly, the clock signal extracted by delay circuit BDEi is sequentially propagated to be output from delay circuit BDE0.

In backward delay array BDA, the clock signal is delayed through delay circuits BDEi–BDE0 a delay time identical to the delay time of forward delay array FDA. In the path of clock input buffer CIB, clock buffer CB4 and backward delay array BDA, delay monitor circuit DMC is not provided. Therefore, the phase of signal NB0 from backward delay array BDA is ahead in phase of external clock signal CLKE.

By rendering clock control signal EN1 active for only one clock cycle as shown in FIG. 61, one clock pulse signal is transmitted to forward delay array FDA. A phase comparison operation is completed according to clock control signal EN2. By delaying signal NAI from clock input buffer CIB through backward delay array BDA according to clock control signal EN3 following completion of the coarse adjustment operation by phase comparison, a delay time corresponding to substantially one cycle of external clock signal CLK can be set by backward delay array BDA. A clock signal NB0 that is subjected to coarse adjustment can be generated.

Figure 62:
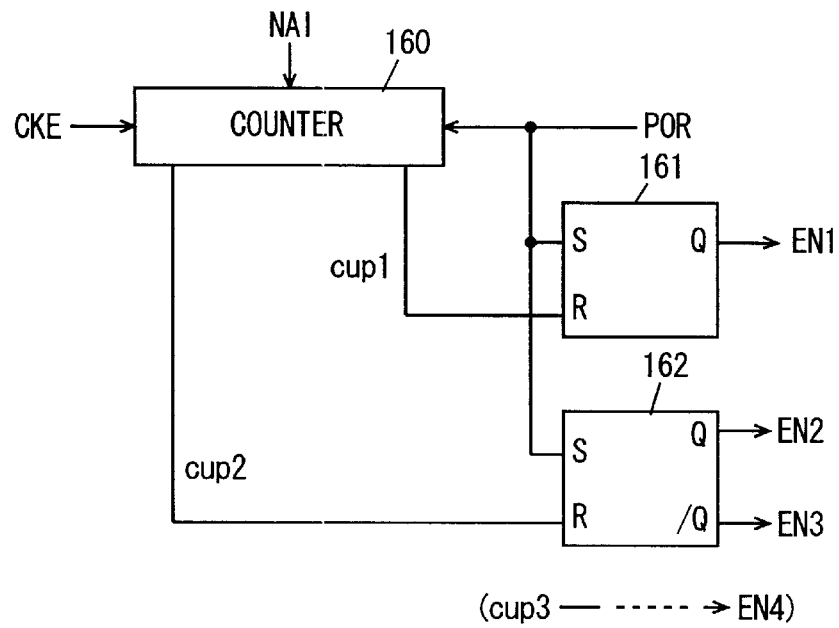
FIG. 62 schematically shows a structure of a clock control signal generation portion of FIG. 60.

FIG. 62 schematically shows a structure of the generation portion of a clock control signal. Referring to FIG. 62, a clock control signal generation portion includes a counter 160 enabled, when clock enable signal CKE is active, to count the fall of output signal NAI of clock input buffer CIB, a set/reset flip flop 161 set in response to activation of power on detection signal POR and reset in response to count up designating signal CUP1 from counter 160, and a set/reset flip flop 162 set in response to activation of power on detection signal POR and reset in response to a count up designating signal CUP2 from counter 160. Clock control signal EN1 is output from output Q of set/reset flip flop 161. Set/reset flip flop 162 provides clock control signals EN2 and EN3 from outputs Q and /Q, respectively. Count up designating signal CUP3 is used for clock control signal EN4 to enable a fine adjustment operation as will be described in detail afterwards.

Counter 160 is initialized in response to activation of power on detection signal POR to render count up designating signal CUP1 active when one fall of clock signal NAI is counted. A count up designating signal CUP2 is rendered active when two falls of clock signal NAI are counted. When clock enable signal CKE is rendered active after the power is turned on, clock control signal EN1 can be maintained at an H level for one clock cycle or clock control signal EN2 can be maintained at an H level for two clock cycles.

Initialization signal INIT of the previous third embodiment can be used instead of power on detection signal POR. When the coarse adjustment detection signal of the previous fourth embodiment is used, the coarse adjust detection circuit can be employed instead of counter 160. In this case, set/reset flip flops 161 and 162 are reset according to the coarse adjustment detection signal.

Figure 63:
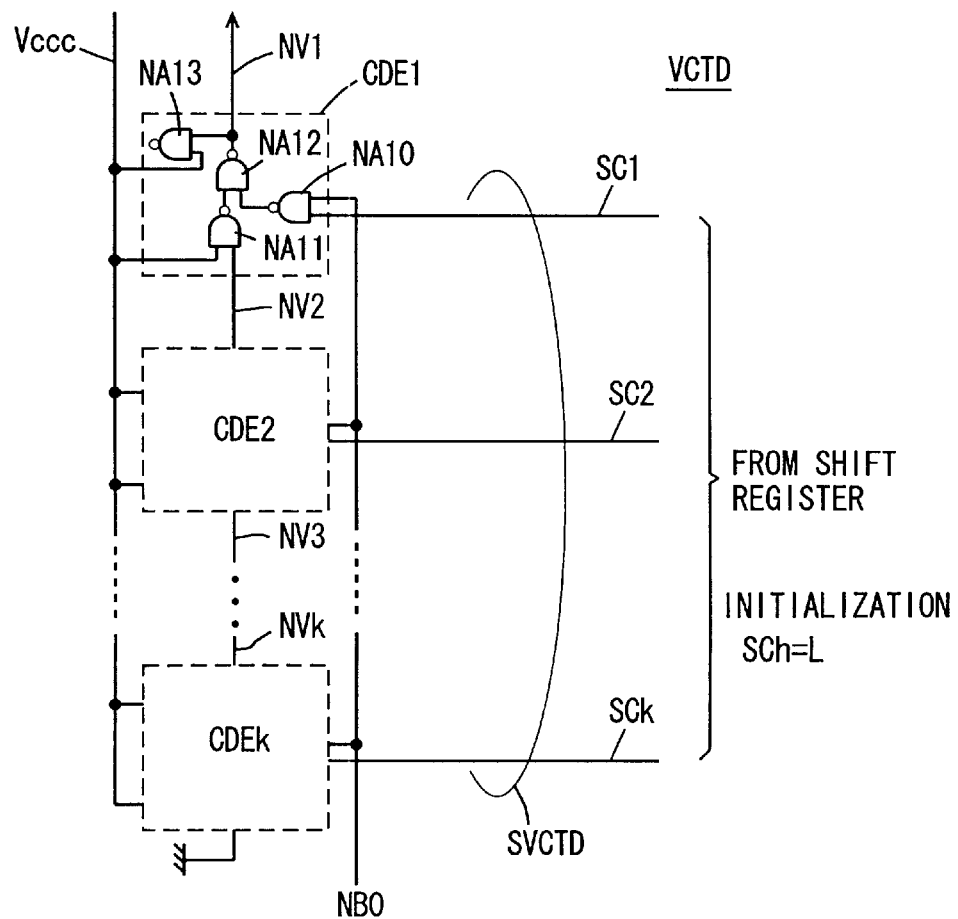
FIG. 63 schematically shows a structure of a variable coarse delay adjustment circuit of FIG. 59.

FIG. 63 schematically shows a structure of variable coarse delay adjust circuit VCTD shown in FIG. 59. Referring to FIG. 63, variable coarse delay adjust circuit VCTD includes a plurality of cascaded delay circuits CDE1–CDEk. Each of delay circuits CDE1–CDEk has a delay time identical to that of delay circuits FDEi and BDEi of coarse delay adjust circuit CTD. Output signal NB0 of coarse delay adjust circuit CTD is applied in common to delay circuits CDE1–CDEk. The number of delay stages of delay circuits CDE1–CDEk is selected by control signals SC1–SCk from the shift register.

Each of delay circuits CDE1–CDEk has the same circuit configuration. The structure of delay circuit CDE1 is shown in FIG. 63 representatively. Delay circuit CDE1 includes a NAND circuit NA11 receiving output signal NV2 of delay circuit CDE2 of the preceding stage and power supply voltage VCCC, a NAND circuit NA10 receiving control signal SC1 from the shift register and output clock signal NB0 of coarse delay adjust circuit CTD, a NAND circuit NA12 receiving the output signals of NAND circuits NA10 and NA11, and a NAND circuit NA13 receiving power supply voltage VCCC and the output signal of NAND circuit NA12.

One of control signals SC1–SCk from the shift register is set to an H level, and the remaining control signals are set to an L level. More specifically, according to control signals SC1–SCk, the delay circuit corresponding to the control signal of the H level inputs and sequentially transmits signal NB0. When control signal SCj from the shift register is at an L level, the output signal of NAND circuit NA10 of a corresponding delay circuit CDEj is fixed at an H level. NAND circuit NA12 operate as an inverter. Thus, a delay circuit is formed by NAND circuits NA11 and NA12 to delay and transmit an output signal NB (j+1) of delay circuit CDE (j+1) of the preceding stage.

At the time of initialization, the h-th control signal SCh out of control signals SC1–SCk from the shift register is set at an H level. Accordingly, both the increase and decreases of the delay time in variable coarse delay adjust circuit VCTD can be accommodated (control signal SCh located at the middle of control signals SC1–SCk is rendered active).

By using variable coarse delay adjust circuit VCTD shown in FIG. 63, the phase of the output signal of the frequency determination circuit can be adjusted easily according to the adjusted result of the fine adjust circuit without any complicated circuit configuration.

Figure 64:
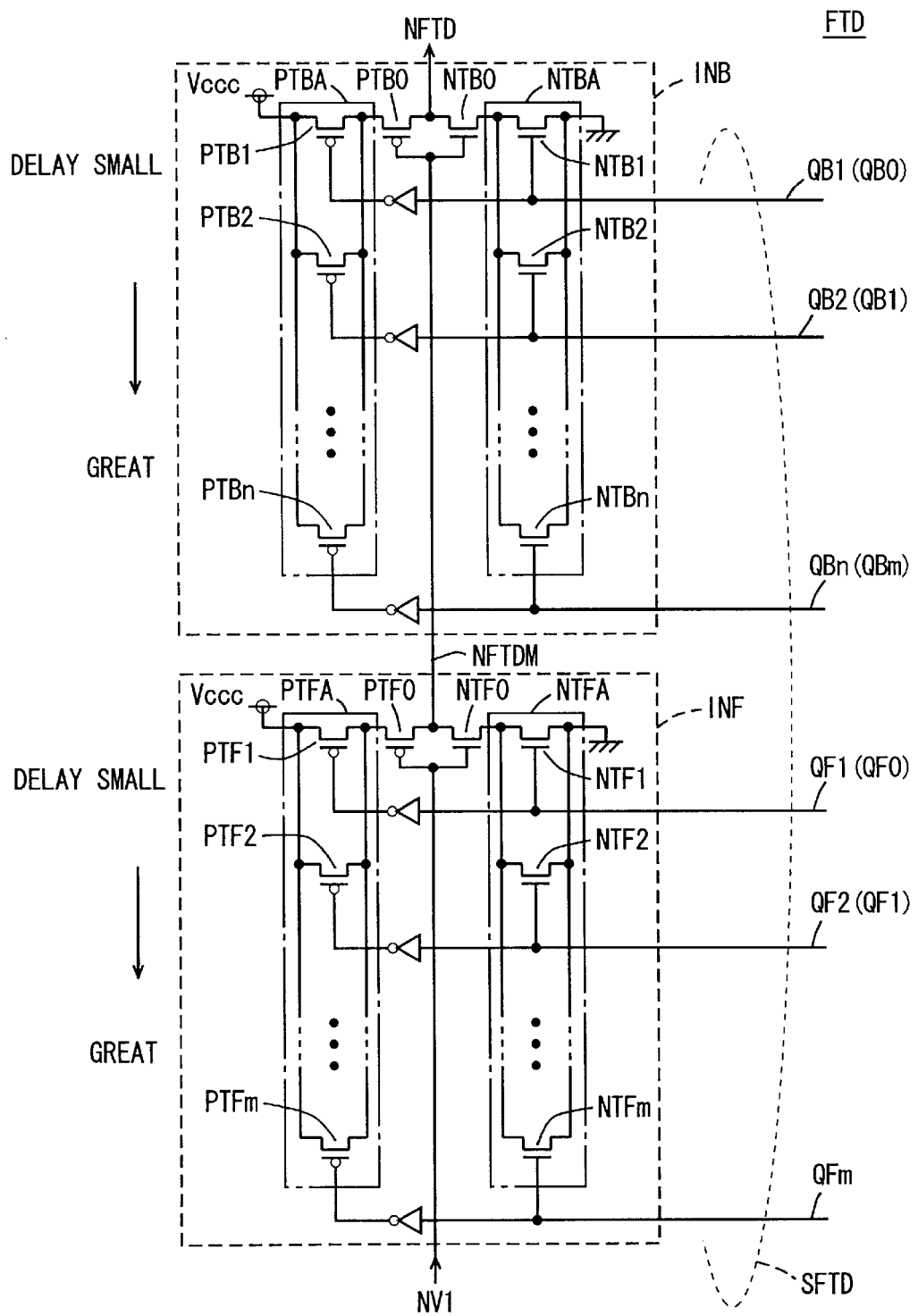
FIG. 64 schematically shows a structure of a fine delay adjustment circuit of FIG. 59.

FIG. 64 shows a structure of fine delay adjust circuit FTD of FIG. 59. Referring to FIG. 64, fine delay adjust circuit FTD includes cascaded current-variable inverters INB and INF. Inverter INF includes MOS transistors PTF0 and NTF0 receiving signal NV1 from variable coarse delay adjust circuit VCTD at their gates to output a signal NFTDM, a current source PTFA responsive to control signals QF1–QFm from the shift register to have the supplying current amount for MOS transistor PTF0 adjusted, and a current source NTFA responsive to control signals QF1–QFm to adjust the discharging current of MOS transistor NTF0. Current source PTFA includes p channel MOS transistors PTF1–PTFm connected in parallel between the power supply node and the source of MOS transistor PTF0. Current source NTFA includes n channel MOS transistors NTF1–NTFm connected in parallel to each other between the source of MOS transistor NTF0 and the ground node. Transistors PTFi and NTFi conduct in response to control signal QFi. The size (the ratio of gate width to gate length) of MOS transistors PTF1–PTFm differs from each other. Also, the size of MOS transistors NTF1–NTFm differs from each other. The current supplied by current sources PTFA and NTFA can be adjusted according to control signals QF1–QFm. Accordingly, the delay time of inverter INF can be adjusted.

Inverter INB includes p and n channel MOS transistors PTB0 and NTB0 receiving output signal NFTDM of inverter INF at their gates to output signal NFTD, a current source PTBA supplying current to p channel MOS transistor PTB0 according to control signals QB1–QBn, and a current source NTBA setting the discharging current amount of MOS transistor NTB0 according to control signals QB1–QBn. Current source PTBA includes p channel MOS transistors PTB1–PTBn connected in parallel to each other between the power supply node and MOS transistor PTB0. The size of MOS transistors PTB1–PTBn differs from each other. Current source NTBA includes n channel MOS transistors NTB1–NTBn connected parallel to each other between MOS transistor NTB0 and the ground. The size of MOS transistors NTB1–NTBn differs from each other. MOS transistors PTBi and NTBi are rendered conductive according to control signal QBi.

By rendering one of control signals QB1–QBn active, the operating current amount of inverter INB is adjusted, whereby the delay time is adjusted. One of control signals QB1–QBn and one of control signals QF1–QFm are rendered active. As the operation sequence, the shifting of active control signal QBi can be carried out subsequent to the sequential activation of control signals QF1–QFm. Alternatively, control signals QF1–QFm and QB1–QBm may be shifted alternately. Any structure in which the delay time of the delay circuit by inverters INF and INB is adjusted by the unit delay time of ΔTD according to control signals QB1–QBn and QF1–QFn can be employed. The adjustment range of the delay time of fine delay adjust circuit FTD is equal to delay time TD of delay circuits FDE and BDE of the coarse delay adjust circuit. Therefore, the maximum value of delay time tFTD provided by fine delay adjust circuit FTD can be represented as tFTD (max)=tFTD (min)+TD where tFTD (min) is the shortest delay time of fine delay adjust circuit FTD.

By adjusting the operating current according to the control signal of the shift register as shown in FIG. 64, the phase (delay time) of the clock signal can be adjusted at a finer precision (the second precision) than the delay time required by the delay circuit.

Figure 65:
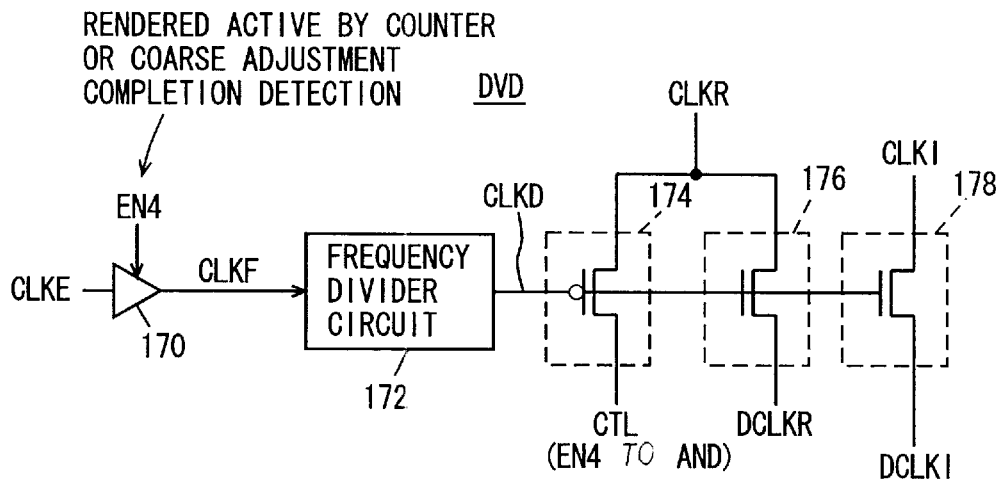
FIG. 65 schematically shows a structure of a frequency divider of FIG. 59.

FIG. 65 schematically shows an example of a structure of frequency divider DVD of FIG. 59. Referring to FIG. 65, frequency divider DVD includes a clock input buffer 170 buffering external clock signal CLKE to generate clock signal CLKF, a frequency divider circuit 172 frequency-dividing output clock signal CLKF from clock input buffer 170 by a factor of 2, a transfer circuit 174 rendered conductive, when output signal CLKD of frequency divider circuit 172 is at an L level, to pass reference clock signal CLKR to generate shift control signal CTL, a transfer circuit 176 rendered conductive, when output clock signal CLKD from frequency divider circuit 172 is at an H level, to pass reference clock signal CLKR to generate comparison clock signal DCLKR, and a transfer circuit 178 rendered conductive, when output clock signal CLKD of frequency divider circuit 172 is at an H level, to pass internal clock signal CLKI to generate comparison clock signal DCLKI.

Figure 66:
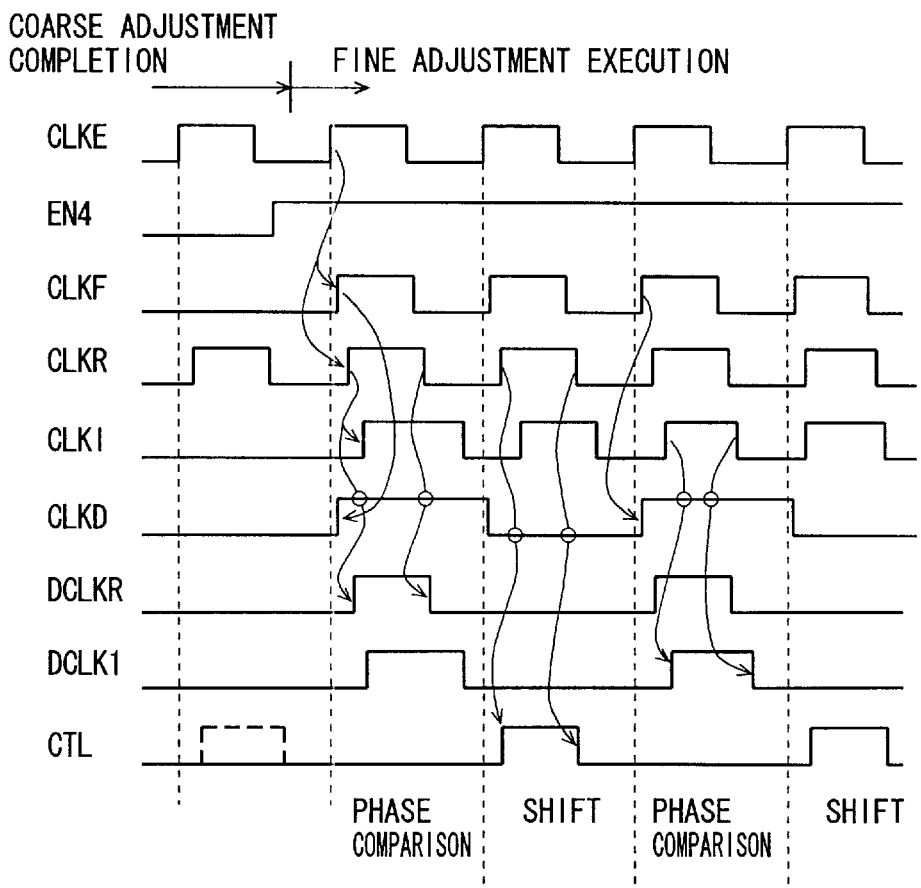
FIG. 66 is a timing chart representing the operation of the frequency divider of FIG. 65.

Clock input buffer 170 having a short delay time generates clock signal CLKF ahead in phase of reference clock signal CLKR. Frequency divider circuit 172 divides clock signal CLKF by a factor of 2. Although transfer circuits 174, 176 and 178 each are shown as being formed of a MOS transistor, these transfer circuits can be formed of CMOS transmission gates, logic gates, or clock buffer. The operation of frequency divider DVD of FIG. 65 will be described now with reference to the timing chart of FIG. 66.

In a coarse adjust operation, clock control signal EN4 is at an inactive state of an L level. Clock input buffer 170 is at an inactive state. Clock signal CLKF is fixed at an L level. Under this state, output clock signal CLKD of frequency divider circuit 172 is at an L level. Transfer circuits 176 and 178 are at a nonconducting state. Although transfer circuit 174 is rendered conductive, the shift operation of the shift register can be inhibited by a structure in which shift control signal CTL is rendered active when clock control signal EN4 is active and applied to the shift register (for example, the AND of CTL and EN4).

In order to initiate fine adjustment at the completion of a coarse adjustment operation, clock control signal EN4 is rendered active at an H level. Clock input buffer 170 operates to generate clock signal CLKF according to external clock signal CLKE. Frequency divider circuit 172 operates to divide clock signal CLKF by a factor of 2 to generate clock signal CLKD. When clock signal CLKD attains an H level, transfer circuits 176 and 178 conduct to generate clock signals DCLKR and DCLKI for comparison according to reference clock signal CLKR and internal clock signal CLKI. The phases of clock signals DCLKR and DCLKI are compared by phase comparator PC. The result of phase comparison by phase comparator PC is maintained also in the next clock cycle.

When frequency-divided clock signal CLKD attains an L level at the next clock cycle, transfer circuit 174 is rendered conductive and transfer circuits 176 and 178 are rendered nonconductive. Clock signals DCLKR and DCLKI maintain an L level. Under this state, shift control signal CTL is generated according to reference clock signal CLKR through transfer circuit 174, whereby the shifting operation by the shift register is executed. Accordingly, the output signal of the shift register is adjusted according to the phase comparison result to adjust the delay time of the delay circuit shown in FIGS. 63 and 64. The above operation is repeatedly carried out during the active period of clock enable signal CKE.

The structure of frequency divider DVD of FIG. 65 is indicated taking the AND of clock control signal EN4 and reference clock signal CLKR only with respect to shift control signal CTL. However, a structure can be implemented in which clock signals CLKR and CLKI are ANDed with clock control signal EN4 to generate clock signals DCLKR and DCLKI for comparison.

Figure 67:
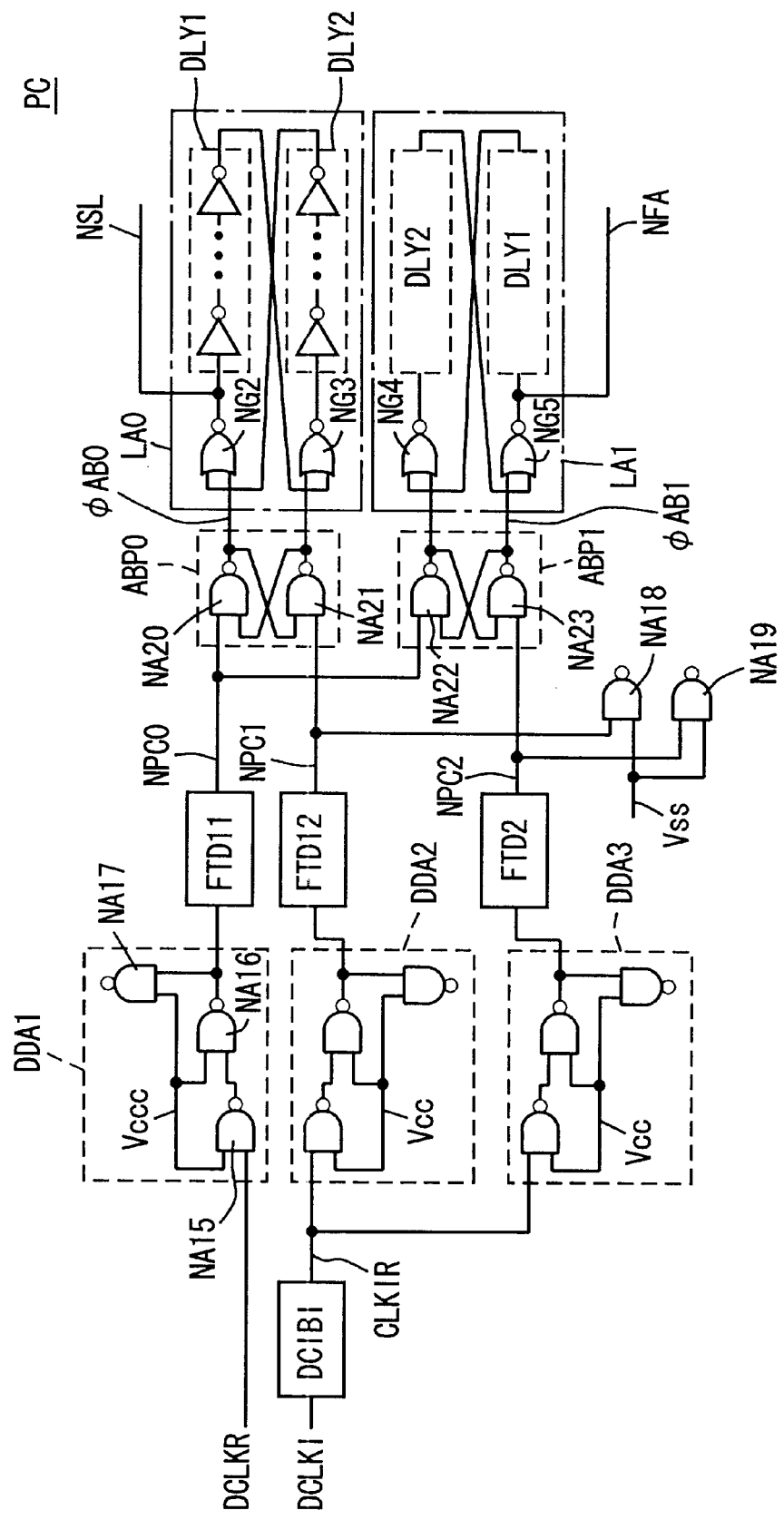
FIG. 67 schematically shows a structure of a phase comparator of FIG. 59.
Figure 68:
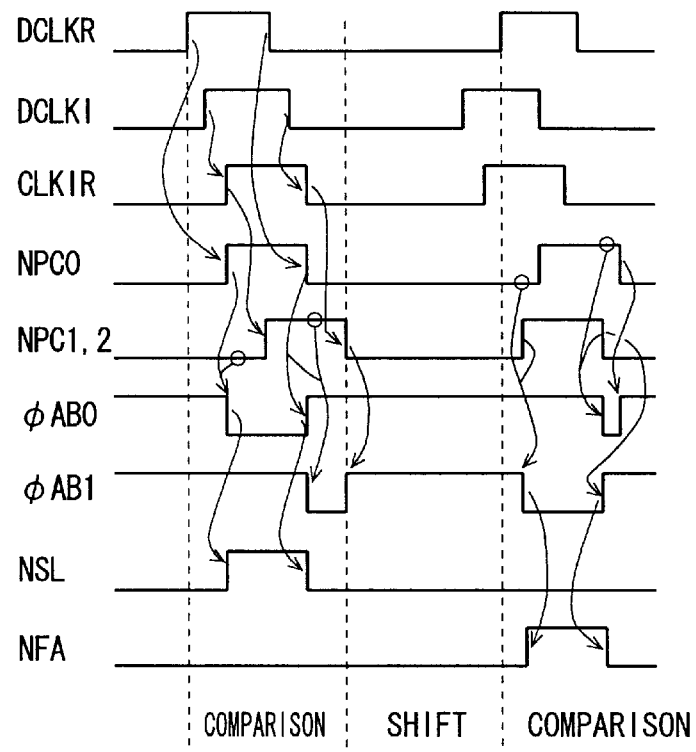
FIG. 68 is a signal waveform diagram representing an operation of the phase comparator of FIG. 67.

FIG. 67 shows a structure of phase comparator PC of FIG. 59. Referring to FIG. 67, phase comparator PC includes a dummy clock input buffer DCIBI delaying comparison clock signal DCLKI, a delay circuit DDA1 delaying comparison clock signal DCLKR, delay circuits DDA2 and DDA3 provided parallel to each other to delay clock signal CLKIR from dummy clock input buffer DCIBI, a delay circuit FTD11 delaying the output signal of delay circuit DDA1, a delay circuit FTD12 delaying the output signal of delay circuit DDA2, a delay circuit FTD2 delaying the output signal of delay circuit DDA3, an arbiter circuit ABP0 comparing the phase of output signal NPC0 of delay circuit FTD11 with the phase of output signal NPC1 of delay circuit FTD12, an arbiter circuit ABP1 comparing the phases of output signal NPC0 from delay FTD11 and output signal NPC2 of delay circuit FTD2, a latch circuit LA0 latching the output signal of arbiter circuit ABP0 to generate a phase adjust signal NSL, and a latch circuit LA1 latching the output signal of arbiter circuit ABP1 to output a phase adjust signal NFA.

Dummy clock input buffer DCIBI has a delay time identical to the delay time of clock input buffer CIBI of FIG. 59. Delay circuits DDA1, DDA2 and DDA3 have a delay time identical to that of delay circuits FDEi and BDEi included in coarse delay adjust circuit CTD and variable coarse delay adjust circuit VCTD. Delay circuits DDA1–DDA3 include a NAND circuit NA15 receiving a clock signal, a NAND circuit NA16 receiving power supply voltage VCCC and the output signal of NAND circuit NA15, and a NAND circuit NA17 receiving power supply voltage VCCC and the output signal of NAND circuit NA16. NAND circuit NA17 adjusts the output load for NAND circuit NA16.

Delay circuits FTD11, FTD12 and FTD2 have a structure similar to that of the current adjust variable delay circuit (fine delay adjust circuit FTD) shown in FIG. 64. By driving respective delay circuits FTD11, FTD12 and FTD2 by delay circuits DDA1–DDA3, the drivability of delay circuits FTD11, FTD12 and FTD2 is set equal to the initial current drivability of fine delay adjust circuit FTD of FIG. 64. The provision of dummy clock input buffer DCIBI provides the advantage of preventing the input load of delay circuits DDA2 and DDA3 from affecting clock signal CLKIR. A delay time is equally provided to clock signals DCLKR and CLKIR. By providing delay circuits FTD11, FTD12 and FTD2, the sensitivity of phase comparator PC can be set to an optimum value. The sensitivity of phase comparator PC is represented by the difference between the delay time tD of delay circuits FTD11 and FTD12 and the delay time tD +$\Delta$tD of delay circuit FTD2, i.e., $\Delta$tD.

Output signal NPC0 of delay circuit FTD11 is applied to arbiter circuits ABP0 and ABP1. Output signal NPC1 of delay circuit FTD12 is applied to arbiter circuit ABP0. Output signal NPC2 of delay circuit FTD2 is applied to arbiter circuit ABP1. NAND circuits NA18 and NA19 are provided in order to equalize the loads for signals NPC0, NPC1 and NPC2. NAND circuit NA18 receives ground voltage VSS and signal NPC1. NAND circuit NA19 receives ground voltage VSS and signal NPC2. The reason why ground voltage VSS is applied is to reduce current consumption and to equalize the load for the signal that rises at the later timing out of signals NPC0–NPC2. Also, the charge/discharge of the output nodes at the floating state of NAND circuits NA18 and NA19 at the transition of signals NPC2 and NPC1 is suppressed to prevent generation of power supply noise.

Arbiter circuit ABP0 includes cross-coupled NAND circuits NA20 and NA21. Arbiter circuit ABP1 includes cross-coupled NAND circuits NA22 and NA23. Arbiter circuit ABP0 compares the phases of signals NPC0 and NPC1. Arbiter circuit ABP1 compares the phases of signals NPC0 and NPC2.

Latch circuit LA0 includes NOR gates NG2 and NG3 respectively receiving the complementary output signals of arbiter circuit ABP0, a delay circuit DLY1 delaying the output signal of NOR circuit NG2 to apply the delayed signal to the other input of NOR circuit NG3, and a delay circuit DLY2 delaying the output signal of NOR circuit NG3 to apply the delayed signal to the other input of NOR circuit NG2. Delay circuits DLY1 and DLY2 are each formed of an even number of stages of cascaded inverters. Phase adjust signal NSL is output from NOR circuit NG2.

Latch circuit LA1 includes NOR circuits NG4 and NG5 receiving the complementary output signals of arbiter circuit ABP1, a delay circuit DLY2 delaying the output signal of NOR circuit NG4 to apply the delayed signal to the other input of NOR circuit NG5, and a delay circuit DLY1 delaying the output signal of NOR circuit NG5 to apply the delayed signal to the other input of NOR circuit NG4. Phase adjust signal NFA is output from NOR circuit NG5. The provision of delay circuits DLY1 and DLY2 suppresses generation of a glitch due to a short pulse of the output signals of arbiter circuits ABP0 and ABP1. The H level period of phase adjust signals NFL and NFA is set equal to the H level period of signal DCLKR or CLKIR that has an advanced phase. The operation of phase comparator PC of FIG. 67 will be described with reference to the signal waveform of FIG. 65.

Clock signal DCLKI is delayed by dummy clock input buffer DCIBI, whereby a clock signal CLKIR is generated. Signal DCLKR is delayed by delay circuits DDA1 and FTD11, whereby signal NPC0 is generated. Signal CLKIR is delayed by delay circuits DDA2 and FTD12, whereby signal NPC1 is generated. Also, signal NPC2 is generated from signal CLKIR by delay circuits DDA3 and FTD2.

Arbiter circuits ABP0 and ABP1 compare the phases of signals NPC0 and NPC1 (NPC2). The phases of clock signals DCLKR and CLKIR are accordingly compared by arbiter circuits ABP0 and ABP1. When clock signal DCLKR is earlier in phase than clock signal CLKIR, output signal $\phi$AB0 of arbiter circuit ABP0 is driven to an L level in response to a rise of signal NPC0. Output signal $\phi$AB1 of arbiter circuit ABP1 maintains an H level. Signal $\phi$AB0 maintains the L level when signal NPC0 is at an H level in arbiter circuit ABP0. In response to the fall of signal NPC0 to an L level, output signal $\phi$AB0 of arbiter circuit ABP0 rises to an H level. When signal NPC0 is pulled down to an L level and signal NPC2 is at an H level in arbiter circuit ABP1, signal $\phi$AB1 is driven to an L level. When signal NPC2 is pulled down to an L level, signal $\phi$AB1 is pulled up to an H level.

When signal $\phi$AB0 is driven to an L level in latch circuit LA0, signal NSL from NOR circuit NG2 rises to an H level. When signal $\phi$AB0 rises to an H level, signal NSL is pulled down to an L level. In latch circuit LA1, signal NFA maintains an L level during the H period of signal $\phi$AB1. Even when signal $\phi$AB1 is pulled down to an L level, the output signal of delay circuit DLY2 is at an H level in latch circuit LA1, whereby signal NFA maintains an L level. At an elapse of the delay time of delay circuit DLY2, the output signal from delay circuit DLY2 is pulled down to an L level. However, signal $\phi$AB1 has returned to the H level, and therefore signal NFA maintains an L level without the generation of a glitch. Therefore, signal NLS attains an H level during the H level period of clock signal CLKIR when clock signal DCLKI is ahead in phase of signal CLKIR.

When clock signal DCLKR lags behind signal CLKIR in phase, signal $\phi$AB1 is pulled down to an L level in response to the rise of signal NPC2 at arbiter circuit ABP1. As a result, signal NFA from latch circuit LA1 is pulled up to an H level. This state is maintained even when signal NPC0 is subsequently driven to an H level. In response to the fall of signal NPC2 to an L level, signal φAB1 is pulled up to an H level, and signal NFA is driven to an L level.

When signal NPC1 is driven to an H level in latch circuit LA0, the output signal of NAND circuit NA21 is pulled down to an L level, whereby signal φAB0 maintains the H level. When signal NPC1 is driven to an L level, the output signal of NAND circuit NA21 attains an H level. When signal NPC0 is driven to an H level, signal φAB0 attains an L level. Signal φAB0 is pulled up to an H level in response to the fall of signal NPC0. However, since delay circuits DLY1 and DLY2 are provided in latch circuit LA0, output signal NSL of NOR circuit NG2 is maintained at an L level by virtue of the output signal of delay circuit DLY2 attaining an H level, even when signal φAB0 is pulled down to an L level. Therefore, signal NSL maintains an L level even when there is a short L level period of signal φAB0. Therefore, when clock signal DCLKR is behind clock signal CLKIR in phase, signal NFA attains an H level during the H level period of signal CLKIR. Using phase adjust signals NFA and NSL from phase comparator PC as the up/down designating signal, a shift operation that will be described hereinafter is carried out in the shift register.

Figure 69:
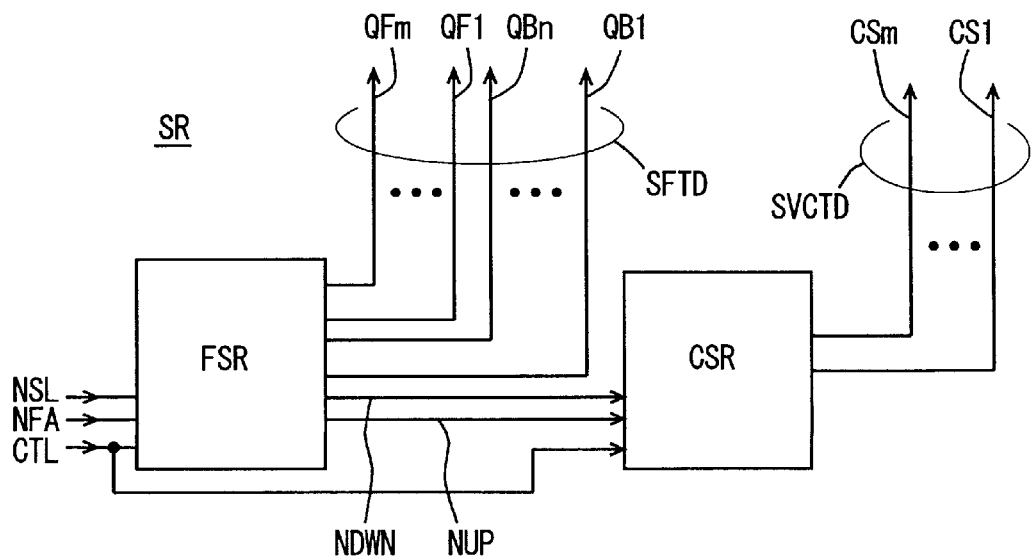
FIG. 69 schematically shows a structure of a bi-directional shift register of FIG. 59.

FIG. 69 schematically shows a structure of bi-directional shift register SR of FIG. 59. Referring to FIG. 69, bi-directional shift register SR includes a fine adjust bi-directional shift register FSR carrying out a shift operation according to control signal CTL and output signals NSL and NFA from phase comparator PC shown in FIG. 67 to output delay adjust signals QB1–QBn and QF1–QFm for fine delay adjust circuit FTD, and a coarse adjust bi-directional shift register CSR carrying out a shift operation according to output signals NUP and NDWN from fine adjust bi-directional shift register FSR and shift control signal CTL to output delay adjust signals CS1–CSn (SVCTD) for variable coarse delay adjust circuit VCTD.

Bi-directional shift registers FSR and CSR have the structure shown in FIG. 45. Fine adjust bi-directional shift register FSR shifts output signals QB1–QBn and QF1–QFm in a predetermined sequence. For example, fine adjust bi-directional shift register FSR shifts the output signal of an active state in the sequence of (QF1, QB1), (QF2, QB1), . . . (QFm, QB1), (QFm, QB2), . . . (QFm, QBn), and further from (QFm, QBn) to (QF1, QB1), (QF2, QB1), . . . Alternatively, the signal can be shifted in the sequence of (QF1, QB1), (QF2, QB1), (QF2, QB2), . . . (QFm, QBn–1), (QFm, QBn), and further from (QFm, QBn) to (QF1, QB1), . . . At the first shift sequence, a shift register for signals QF1–QFm and a shift register for signals QB1–QBn are provided. When the output signal from the shift register for signals QF1–QFm changes from the maximum value to the minimum value or from the minimum value to the maximum value, a shift operation is carried out in the shift register provided for signals QB1–QBn. In the structure of the second shift sequence, a shift register is provided for signals QB1–QBn and QF1–QFm, respectively. A shift operation is carried out alternately by these shift registers. Any structure can be employed.

Figure 70:
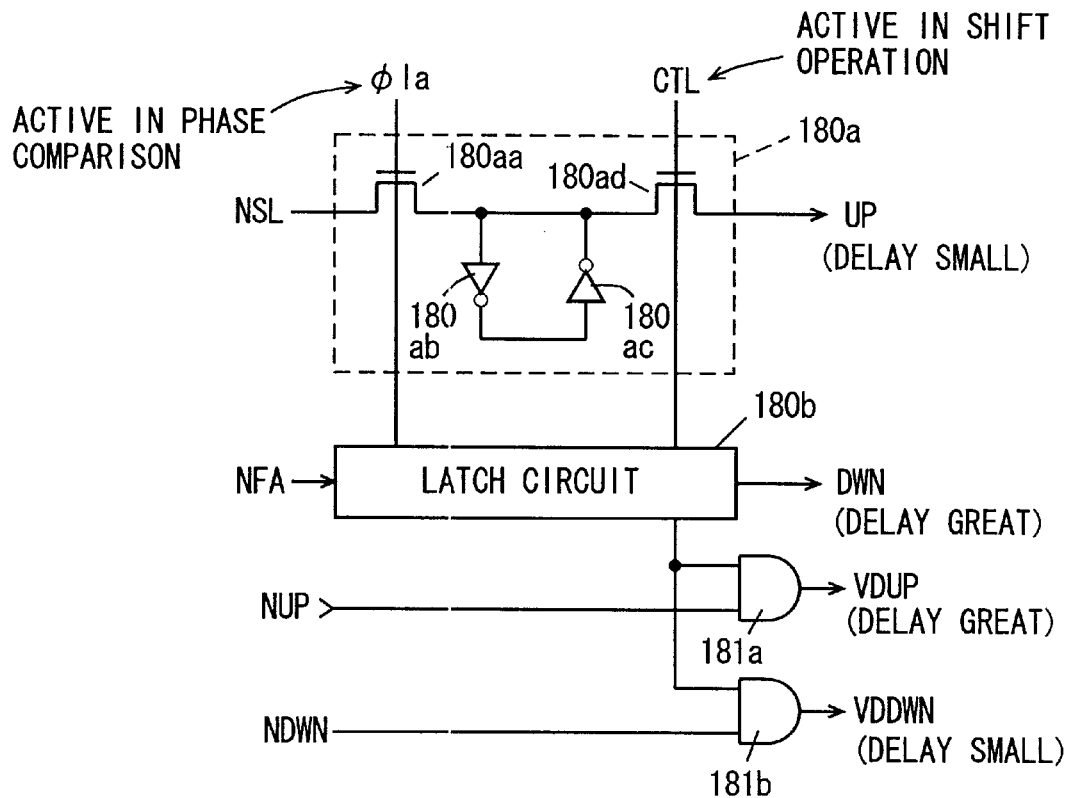
FIG. 70 schematically shows a structure of a shift control signal generation portion of the bi-directional shift register of FIG. 69.

FIG. 70 shows an example of the portion providing control of the shift operation of bi-directional shift register SR of FIG. 69. Referring to FIG. 70, the shift control portion includes latch circuits 180a and 180b latching signals NSL and NFA output from the phase comparator, and AND circuits 181a and 181b receiving fine adjust shift control signals NUP and NDWN to generate coarse adjust shift designating signals VDUP and VDDWN according to shift control signal CTL.

Latch circuits 180a and 180b respond to activation of latch designating signal φ1a to input respectively applied signals NSL and NFA to output the input signals as respective shift control signals UP and DWN when shift control signal CTL is at an H level. Latch circuit 180a includes a transfer gate 180aa rendered conductive in response to activation of latch designating signal φ1a to pass signal NSL, two stages of inverters 180ab and 180ac latching the signal passed through transfer gate 180aa, and a transfer gate 180ab transmitting the signal latched by inverters 180ab and 180ac according to shift control signal CTL.

Latch designating signal φ1a is driven to an H level for a predetermined time in response to a rise of either clock signal DCLKI or CLKIR. Output signals UP and DWN of latch circuits 180a and 180b are applied to the control portion shown in FIG. 46, whereby shift operation control signals Tφ1–Tφ4 are generated. Output signals VDUP and VDDWN of AND circuits 181a and 181b are applied to a control portion having a structure similar to that shown in FIG. 46 provided for coarse adjust shift circuit CTR, whereby the shift operation of coarse adjust shift register CSR is executed. A latch circuit is not provided for signals NUP and NDWN because, when shift control signal CTL is driven to an H level to cause a shift operation in fine adjust shift register FSR, signals NUP and NDWN are selectively rendered active according to the shifted result. Another structure will be described in detail afterwards.

When signal UP is rendered active in fine adjust shift register FSR, a shift operation is carried out so as to reduce the delay time of fine delay adjust circuit FTD. When signal DWN is rendered active, a shift operation is carried out so as to increase the delay time of fine delay adjust circuit FTD. When signal VDUP is rendered active in coarse adjust shift register CSR, a shift operation is carried out to increase the delay time of variable coarse delay adjust circuit VCTD. When signal VDDWN is rendered active, a shift operation is carried out so as to reduce the delay time of variable coarse delay adjust circuit VCTD. The shift register of these bi-directional shift registers FSR and CSR includes a master/slave type register circuit shown in FIG. 45A.

In FIG. 70, transfer gates 180aa and 180ad of latch circuit 180a are shown. However, transfer gates 180aa and 180ad can be formed of a CMOS transmission gate or a tri-state buffer.

Figure 71:
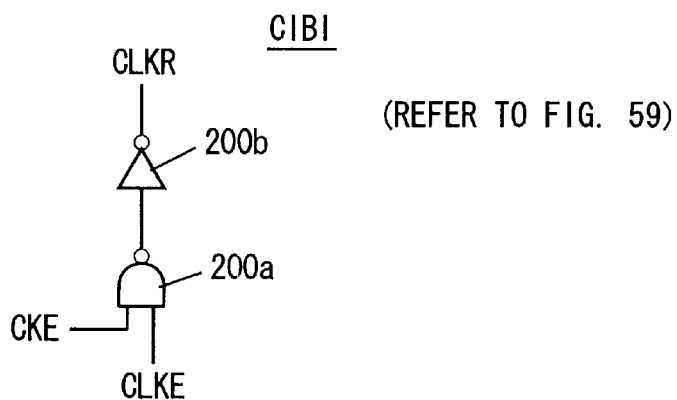
FIGS. 71 and 72 show a structure of a clock input buffer of FIGS. 59 and 60, respectively.

FIG. 71 shows a structure of clock input buffer CIBI of FIG. 59. Referring to FIG. 71, clock input buffer CIBI includes a NAND circuit 200a receiving clock enable signal CKE and external clock signal CLKE, and an inverter circuit 200b inverting the output signal of NAND circuit 200a to generate reference clock signal CLKR. When clock enable signal CKE is at an L level, reference clock signal CLKR is fixed at the L level irrespective of the state of external clock signal CLKE.

Figure 72:
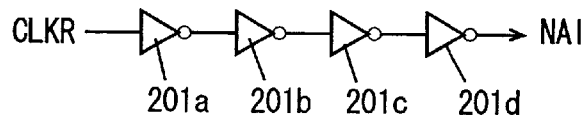

FIG. 72 shows a structure of clock input buffer CIB of FIG. 60. Referring to FIG. 72, clock input buffer CIB includes four stages of cascaded inverter circuits 200a–201d receiving reference clock signal CLKR. Clock signal NAI is output from inverter circuit 201d.

Figure 73:
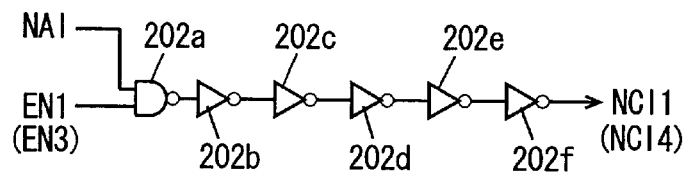
FIGS. 73 and 74 show a structure of a clock buffer of FIG. 60.
Figure 75:
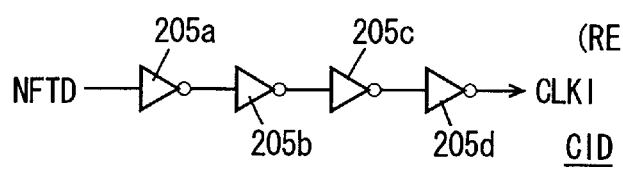
FIG. 75 shows a structure of a clock driver of FIG. 59.

FIG. 73 shows a structure of clock buffers CB1 and CB4 of FIG. 60. Since clock buffers CB1 and CB4 have the same structure, only one clock buffer is shown in FIG. 75. Referring to FIG. 73, clock buffer CB1 (CB4) includes a NAND circuit 202a receiving clock signal NAI output from clock input buffer CIB and clock control signal EN1 (EN3), and five stages of cascaded inverter circuits 202b–202f receiving the output signal of NAND circuit 202a. Clock signal NCI1 (NCI4) is output from the final stage of inverter circuit 202f.

When clock control signal EN1 (EN3) is at an L level, the output signal of NAND circuit 202a is fixed at an H level. In response, clock signal NCI1 (NCI4) is fixed at an L level. When clock control signal EN1 (EN3) is set at an H level, NAND circuit 202a operates as an inverter. Control signal NA1 from clock input buffer CIB is buffered, whereby signal NCI1 (NCI4) is generated.

Figure 74:
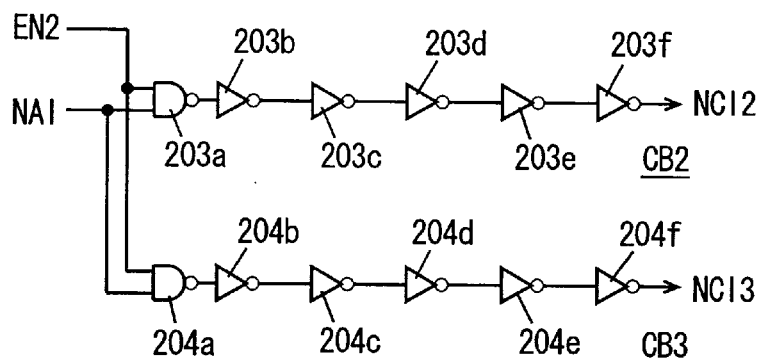

FIG. 74 shows a structure of clock drivers CB2 and CB3 of FIG. 60. Referring to FIG. 74, clock driver CB2 includes a NAND circuit 203a receiving clock control signal EN2 and output clock signal NAI of clock input buffer CIB, and five stages of cascaded inverter circuits 203b–203f receiving the output signal of NAND circuit 203a. Clock signal NCI2 is output from the final stage of inverter circuit 203f.

Clock driver CB3 includes a NAND circuit 204a receiving clock control signal EN2 and clock signal NAI, and five stages of cascaded inverter circuits 204b–204f receiving the output signal of NAND circuit 204a. Signal NCI3 is output from the final stage of inverter circuit 204f.

As shown in FIGS. 73 and 74, clock drivers CB1, CB2, CB3 and CB4 have the same structure. The delay times of these clock buffers are set substantially equal to each other.

FIG. 75 shows a structure of clock driver CID of FIG. 59. Referring to FIG. 75, clock driver CID includes four stages of cascaded inverter circuits 205a–205d receiving clock signal NFTD output from the fine adjust circuit. Internal clock signal CLKI from inverter circuit 205d is transmitted to each internal circuit.

FIG. 76 shows a structure of delay monitor circuit DMC of FIG. 60. Referring to FIG. 76, delay monitor circuit DMC includes a dummy clock input buffer DCIBI receiving a signal NCI1 from clock driver CB1, a dummy clock input buffer DCIB receiving the output signal of dummy clock input buffer DCIBI, a dummy clock driver DCB receiving the output signal of dummy clock input buffer DCIB, a dummy variable coarse delay adjust circuit DVCTD receiving the output signal of dummy clock driver DCB, a dummy delay circuit DDA receiving the output signal of dummy variable coarse adjust delay circuit DVCTD, a dummy fine delay adjust circuit DFTD receiving the output signal of dummy delay circuit DDA, and the dummy clock driver DCID receiving the output signal of dummy fine delay adjust circuit DFTD. Signal NFI that is applied to forward delay array FDA is output from dummy clock driver DCID.

Dummy clock input buffer DCIBI has a delay time identical to that of clock input buffer CIBI, and includes a NAND circuit 203c and an inverter circuit 200d. This is identical to dummy delay circuit DCBI of phase comparator PC and compensates for that delay.

Dummy clock input buffer DCIB has a delay time identical to that of clock input buffer CIB, and includes four stages of cascaded inverter circuits 201e–201h. An inverter 201i for adjusting a fan-out (output load) is provided at the output of inverters 201e–201h.

Dummy clock driver DCB has a delay time identical to that of each of clock drivers CB1–CB4, and includes a NAND circuit 202g receiving the output signal of dummy clock input buffer DCIB and power supply voltage VCC, and five stages of cascaded inverter circuits 202h–202l receiving the output signal of NAND circuit 202g. A NAND circuit 202p receiving power supply voltage VCC and the output signal of dummy clock input buffer DCIB is provided at the input of NAND circuit 202g. A dummy inverter circuit 202q for fan-out adjustment is provided at the output portion of inverters 202h–202k. NAND circuit 202p is provided to equalize the output loads of four clock drivers CB1–CB3 to which output signal NAI of clock input buffer CIB is applied.

Dummy variable coarse adjust delay circuit DVCTD includes k delay stages DCDE1–DCDEk. Each of delay stages DCDE1–DCDEk includes NAND circuits 207a and 207b each receiving power supply voltage VCC at one input to operate as an inverter, and a dummy NAND circuit 207c adjusting the output load. Dummy coarse adjust delay circuit DVCTD has a delay circuit time identical to that initially set in variable coarse delay adjust circuit VCTD shown in FIG. 63. The number of delay stages k is equal to the number of delay stages initially set in variable coarse delay adjust circuit VCTD. Therefore, when variable coarse delay adjust circuit VCTD is set to include h delay stages initially, variable delay adjust circuit DVCTD will include h delay stages DCDE.

Dummy delay circuit DDA has a delay time identical to that of respective unit delay stages of FDEi and BDEi in forward delay array FDA and backward delay array BDA shown in FIG. 60. Dummy delay circuit DDA includes NAND circuits 207d and 207e receiving power supply voltage VCC to operate as an inverter, and a dummy NAND circuit 207f adjusting the output load.

Dummy fine delay adjust circuit DFTD is set to have a delay time identical to the initial delay time of fine delay adjust circuit FTD of FIG. 64.

Dummy clock driver DCID has a delay time identical to that of clock driver CID shown in FIG. 75, and includes four stages of cascaded inverters 205a–205h, and a dummy inverter 205i adjusting the output loads of these inverters.

By employing this delay monitor circuit DMC, the gate delay in the clock signal propagation path can be compensated for to equalize the phases of external clock signal CLK and internal clock signal CLKI.

Power supply voltage VCC is shown in the structure of FIG. 76. Power supply voltage VCC can be the clock power supply voltage Vccc, or the periphery power supply voltage Vccp of the fourth embodiment. Dummy delay circuit DDA is provided corresponding to delay circuit BDE0 in backward delay array BDA of FIG. 60. Dummy delay adjust circuits DVCTD and DFTDE are provided so as to minimize the phase difference between the external clock signal and the internal clock signal in initialization. The operation of the entire clock reproduction circuit of the seventh embodiment will now be described.

Figure 77:
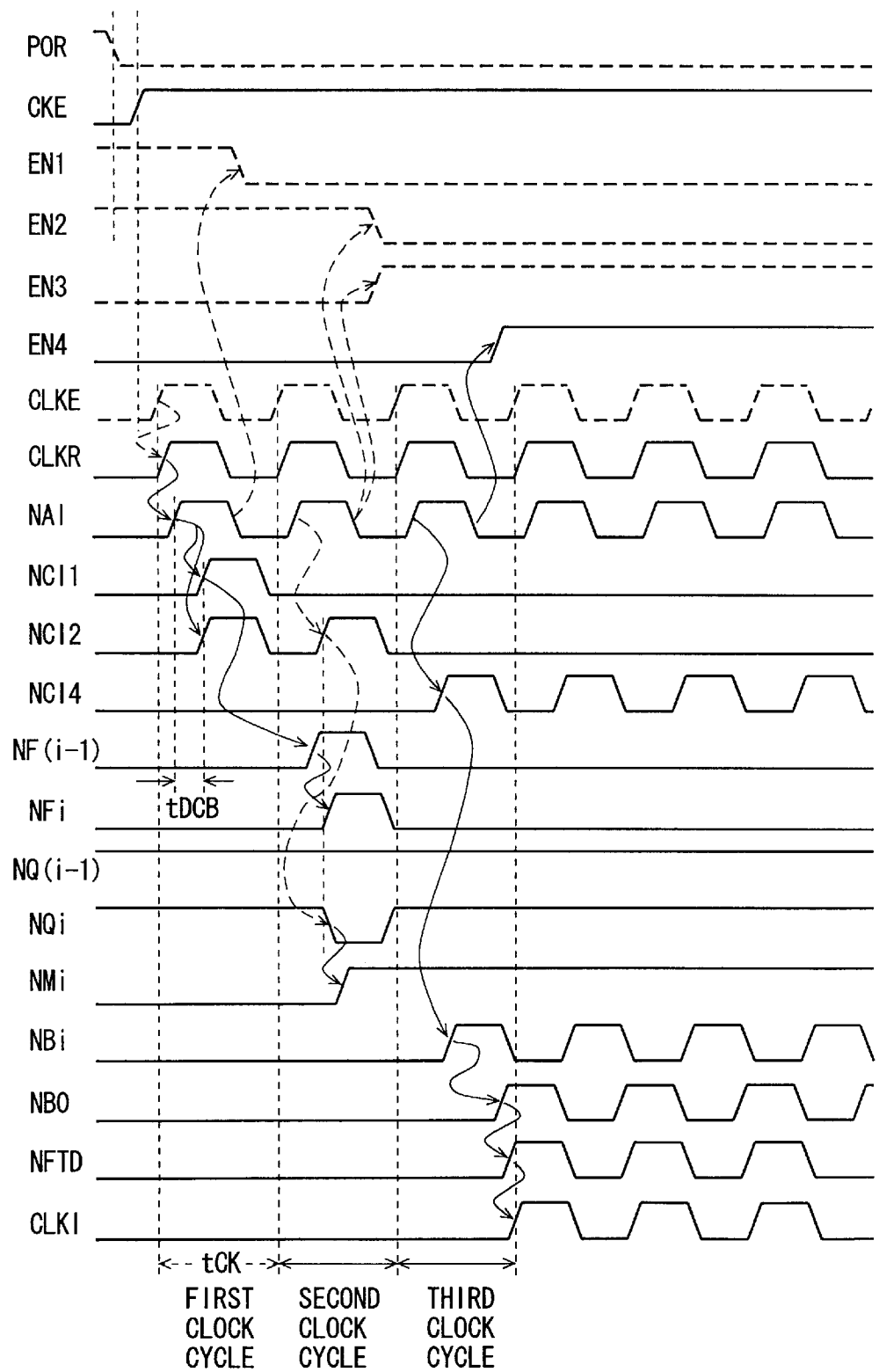
FIG. 77 is a signal waveform diagram representing the operation of the clock reproduction circuit of FIG. 59.

First, a coarse adjustment operation will be described with reference to FIG. 77. This coarse adjustment operation is identical to the operation described with reference to the previous FIG. 61. When clock input signal CKE is driven to an H level and clock input buffer CIBI is rendered active, reference clock signal CLKR is generated according to external clock signal CLKE. At the first clock cycle, the delay time is set at coarse delay adjust circuit CTD. The phase of the clock signal of the first cycle transmitted through forward delay array FDA is compared with the phase of the clock signal at the second clock cycle output from clock buffer CB2 by phase comparators (arbiter circuits) ARB0–ARBm in mirror control circuit MCC. According to the output signals of arbiter circuits ARB0–ARBm, detection is made of the number of unit delay circuits required to delay the clock signal by one cycle period tCK by delay monitor circuit DMC and forward delay array FDA by logic circuits PCL1–PCLm.

At the second clock cycle, the tap point of backward delay array BDA for coarse delay adjust circuit CTD is set. More specifically, receiving the output signals of logic circuits PCL1–PCLm, latch circuits LB 1–LBm maintain at the H level an output signal NMi of mirror control circuit MCC corresponding to the node where the rise of the clock signal of forward delay array FDA matches the rise of the clock signal applied to arbiter circuit RB0–RBm. The remaining nodes are set to an L level by latch circuits LB1–LBm.

At third clock cycle, clock control signal EN3 is at an H level. A clock signal is applied to backward delay array BDA via clock buffer (driver) CB4. The delay time of backward delay array BDA is substantially equal to the delay time of forward delay array FDA and delay monitor circuit DMC. Clock signal NB0 output from backward delay array BDA which is a delayed version of the output signal of clock buffer CB4 advances in phase external clock signal CLKE due to the influence of the delay time of delay monitor circuit DMC. Clock signal NB0 output from backward delay array BDA is propagated through variable coarse delay adjust circuit VCTD and fine delay adjust circuit FTD. The phase of internal clock signal CLKI output from the clock driver is substantially equal to that of external clock signal CLKE. The operation up to the third clock cycle corresponds to a coarse adjustment operation. In response to the fall of clock signal NAI at the third clock cycle, clock control signal EN4 is rendered active, whereby a fine adjust operation is initiated. Generation of clock control signal EN4, though not explicitly indicated, can easily be effected with a structure similar to that shown in FIG. 62 by expanding the count value of counter 160. Coarse adjust complete detection signal DET can be used to generate clock control signals EN1–EN4. The fine adjustment operation from the fourth clock cycle onward will be described with reference to FIG. 78.

Figure 78:
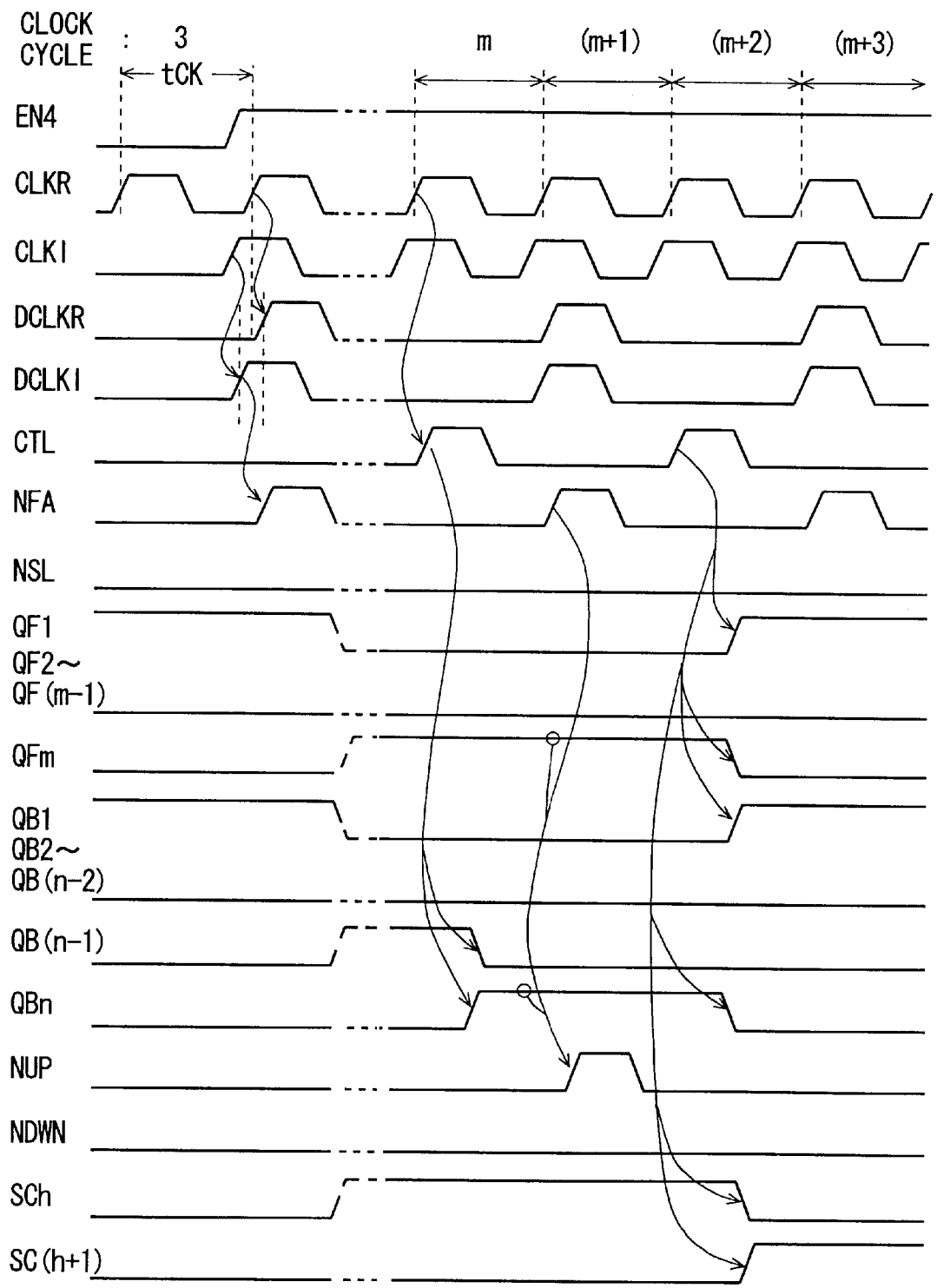
FIG. 78 is a signal waveform diagram representing the operation of the fine adjust circuit unit of FIG. 59.

Clock control signal EN4 is driven to an H level at the third clock cycle, and a fine adjustment operation is initiated at the fourth clock cycle. More specifically, frequency divider DVD shown in FIG. 59 is rendered active. Comparison clock signals DCLKR and DCLKI are generated every clock cycle according to clock signals CLKR and CLKI. Also, shift control signal CTL is generated according to reference clock signal CLKR every alternate cycle of comparison clock signals DCLKR and DCLKI. Signals NFA and NSL are generated from phase comparator PC (refer to FIG. 67) according to the phase comparison between clock signals DCLKR and DCLKI. FIG. 78 shows the case where the phase of signal DCLKI is ahead of the phase of clock signal DCLKR. Under this state, signal NFA is output from phase comparator PC. Fine adjust bi-directional shift register FSR shown in FIG. 69 carries out a shift operation to increase the delay time according to activation of signal NFA. At the m-th cycle in FIG. 78, a high level is shifted from output signal QB (n−1) to output signal QBn by the shifting operation. Here, the number of cycles "m" is irrelevant to the number m of output signal QFm.

When signal NFA is generated again at the (m+1)th clock cycle, signal NUP is pulled up to an H level at the next clock cycle since output signals QFm and QBm of fine adjust shift register FSR are both at an H level, indicating the maximum values. When shift control signal CTL is driven to an H level at the next (m+2)-th clock cycle, a shift operation is carried out. Output signals QF1 and QB1 of fine adjust shift register circuit FSR are driven to an H level, whereby the amount of delay takes the smallest value. Output signal SCh of the coarse adjust bi-directional shift register is pulled down to an L level from an H level. Output signal SC (h+1) is pulled up to an H level. Thus, the shift operation is completed. This operation is repeated thereafter according to signals NFA and NSL.

When signal NFA is rendered active in the event that the maximum values of the fine adjust bi-directional shift register are both at an H level in the phase comparison operation according to the structure of FIG. 78, signal NUP is driven to an H level, whereby the unit of the delay time of one stage is increased. Conversely, when the delay time is to be reduced, signal NDWN is driven to an H level when signals QF1 and QB1 are both at an H level and signal NSL attains an H level. The structure thereof will be described afterwards.

When internal clock signal CLKI is ahead in phase of external clock signal CLKI shown in FIG. 78, phase comparator PC continuously renders signal NFA active. In response to signal NFA, the fine adjust bi-directional shift register shifts the active output signal in the direction of (QF1, QB1), (QF2, QB1) . . . (QFm, QB1), . . . (QFm, QB2) . . . , (QFm, QBn). The delay time of fine delay adjust circuit FTD is incremented according to the operation of fine adjust bi-directional shift register FSR. In response to activation of signal NFA at the (m+1)-th cycle, the active output signal is shifted from (QFm, QBn) to (QF1, QB1) at the (m+2)-th cycle. In this case, the delay time of fine delay adjust circuit FTD becomes the smallest value of tFTD (min). However, coarse adjust bi-directional shift register CSR shifts the output signal of a high level from CSh to signal CS (h+1) according to coarse adjust control signal NUP generated from fine adjust bi-directional shift register FSR according to signal NFA of an active state. Therefore, since clock signal NB0 from coarse delay adjust circuit CTD shown in FIG. 59 is propagated through variable coarse delay adjust circuit VCTD via delay circuit CBE (h+1) as shown in FIG. 63, one more stage is added to the number of stages of unit delay circuits CDE in variable coarse delay adjust circuit VCTD. Accordingly, delay time tD is added. The delay time generated in fine delay adjust circuit FTD in the previous state (delay time tFTD (mx)) is generated using this variable coarse delay adjust circuit VCTD.

When the timing of input clock signal CLKI lags behind external clock signal CLKE, phase comparator TC renders signal NSL active. According to signal NDWN generated according to signals NSL, QB1, QF1 and NSL, the delay time of fine delay adjust circuit FTD and variable coarse delay adjust circuit VCTD can be reduced.

By operating fine delay adjust circuit FTD and coarse delay adjust circuits CTD and VCTD taking advantage of a shift up/shift down operation of the counter, timing error (phase error) exceeding the correctable range of fine delay adjust circuit FTD can be reduced easily.

FIG. 79 shows an example of the transition sequence of the output of the fine adjust bi-directional shift register. In FIG. 79, "L" and "H" indicate that the signal during the relevant clock cycle is maintained at an L level and an H level, respectively. "○" indicates that the signal of the corresponding clock cycle is rendered active for a predetermined time (during the H level period of the clock signal).

When signal NFA is rendered active at the (m−1)-th cycle, signal QB (m−1) is pulled down from an H level to an L level at the next cycle. In response, signal QBm is driven to an H level from an L level. Thus, the shift operation of one stage is completed. Under this state, signals QFm and QBm are both at an H level. A phase comparison operation is not carried out at the m-th cycle. At the (m+1)-th cycle, phase comparison is carried out again, and signal NFA is rendered active. In response to this activation, signals QFm and QBm are pulled down from an H level to an L level, whereas signals QB0 and QF0 are pulled up to an H level at the (m+2)-th cycle. Accordingly, the delay time is minimized.

When signal NFA is rendered active again at the (m+3)-th cycle, a shift operation is carried out at the next (m+4)-th cycle, whereby signal QF1 attains an H level.

When signal NSL is driven to an H level at the (n−1)-th cycle, signal QF0 is driven to an H level from an L level whereas signal QFS1 is driven from an H level to an L level at the next clock cycle n. Signal QB0 maintains an H level.

When signal NSL is rendered active again at the (m+1)-th cycle, a shift operation is carried out at the next (m+2)-th cycle. Signals QFm and QBm attain an H level, whereby the delay time becomes greatest.

When phase comparison is carried out at the next (m+3)-th cycle and signal NSL is rendered active again, signal QB (m−1) attains an H level whereas signal QBm attains an L level. Signal QFm maintains the H level.

The operation of coarse adjustment bi-directional shift register CSR will be described here with reference to FIG. 80. At the (m−1)-th cycle, signal SCh is at an H level. When signal NFA attains an H level at the (m+1)-th cycle as shown in FIG. 79, signal NUP is driven to an H level since signals QFm and QBm are both driven to an H level. Therefore, signal SC (h+1) is pulled up to an H level, whereas signal SCh is pulled down to an L level at the next (m+2)-th cycle. Accordingly, the delay time in the variable coarse delay adjust circuit is increased.

When signal NSL is driven to an active state of an H level at the (n+1)-th cycle, signal NDWN is rendered active since signals QF0 and QB0 both attain an H level. A shift operation is carried out at the next clock cycle of (n+2) according to activation of signal NDWN. Signal SC (h−1) is driven to an H level whereas signal SCh is driven to an L level from an H level.

Figures 80, 81:
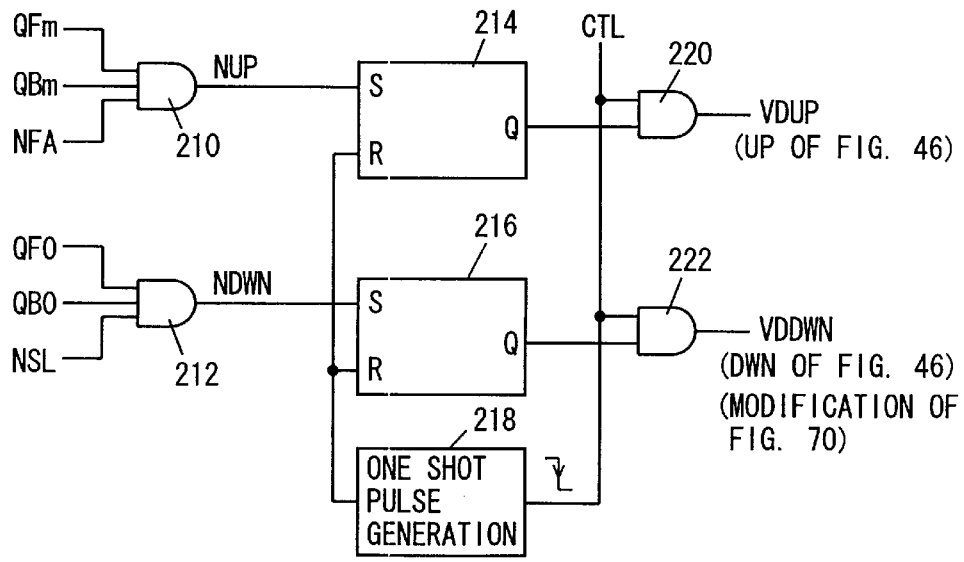
FIG. 80 shows an example of the operation sequence of the coarse adjustment bi-directional shift register of FIG. 69.
FIG. 81 schematically shows a structure of a shift control signal generation portion to realize the bi-directional shift register sequence of FIGS. 70 and 80.
Figure 82:
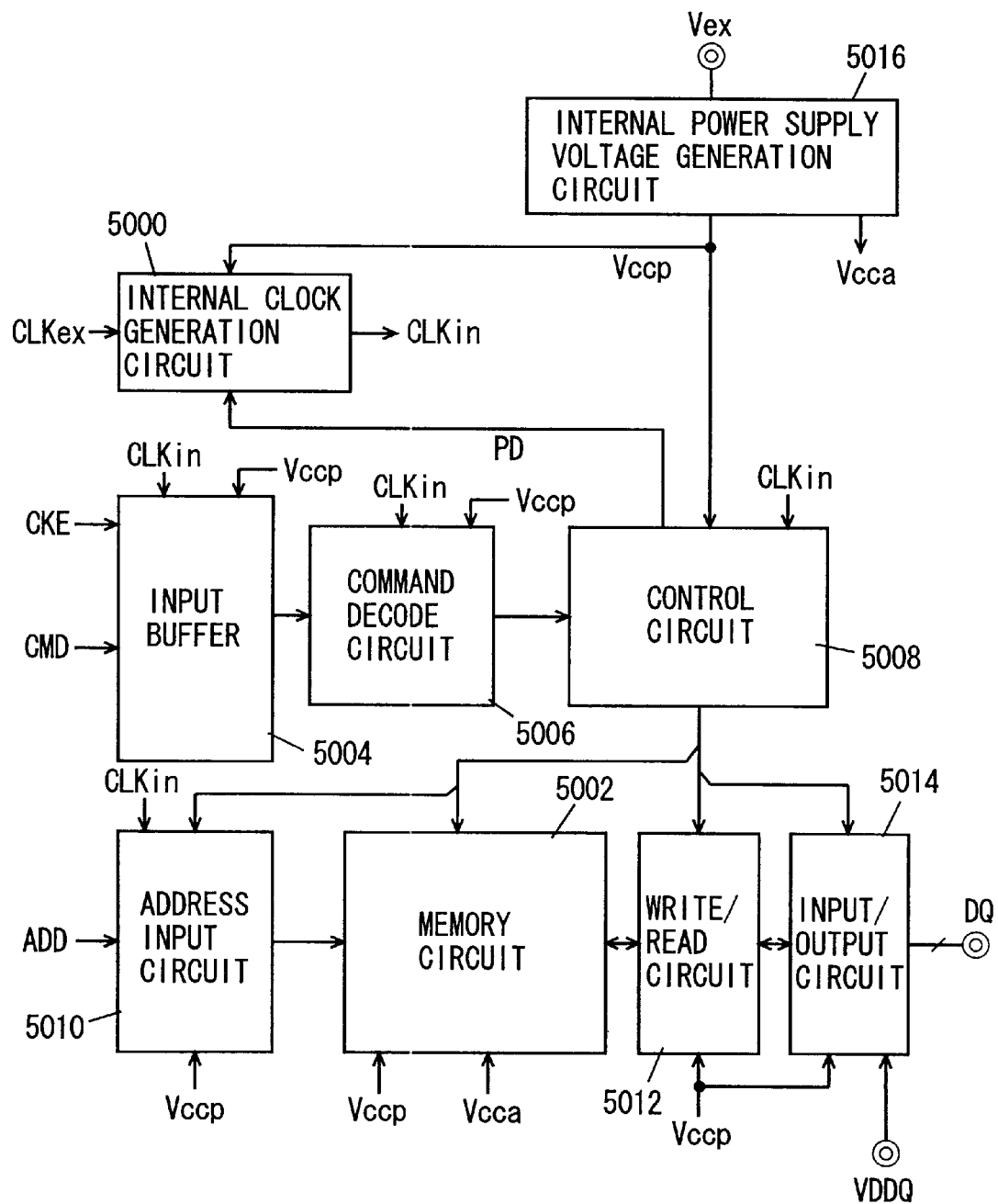
FIG. 82 schematically shows an entire structure of a conventional synchronous semiconductor memory device.
Figure 83:
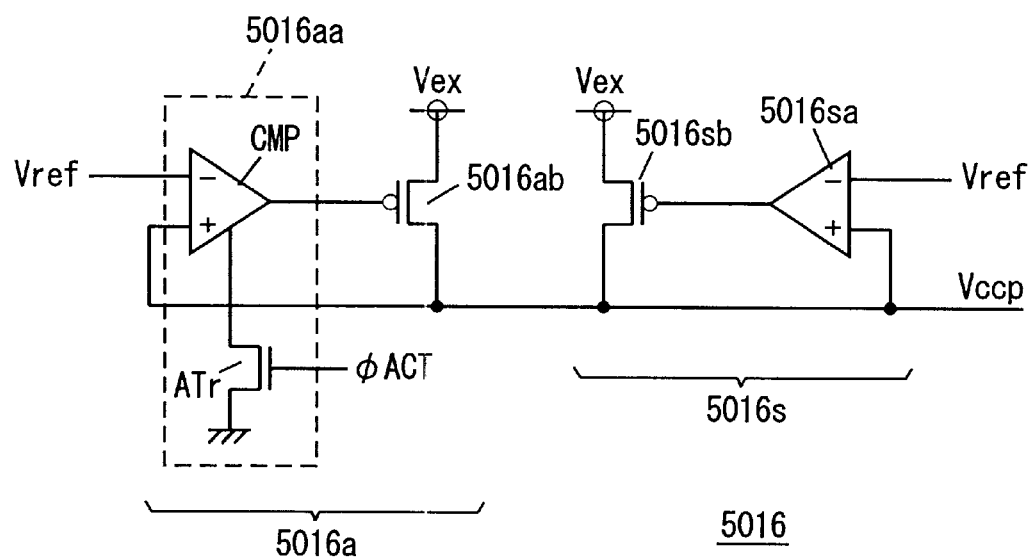
FIG. 83 schematically shows a structure of an internal power supply voltage generation circuit of FIG. 82.

FIG. 81 schematically shows a structure of the control signal generation portion of bi-directional shift register R. The control signal generation portion of FIG. 81 realizes the shift sequence shown in FIGS. 78–80. Referring to FIG. 81, the shift control signal generation portion includes an AND circuit 210 receiving signals QFm, QBm and NFA to generate signal NUP, an AND circuit 212 receiving signals QF0, QB0 and NSL to generate signal NDWN, a set/reset flip flop 214 set in response to a rise (activation) of output signal NUP of AND circuit 210, a set/reset flip flop 216 set in response to activation of output signal NDWN of AND circuit 212, an AND circuit 220 receiving shift control signal CTL and the signal from output Q of set/reset flip flop 214 to generate signal VDUP, an AND circuit 222 receiving shift control signal CTL and the signal from output Q of set/reset flip flop 216 to generate signal VDDWN, and a one shot pulse generation circuit 218 responsive to a fall of shift control signal CTL to generate a one shot pulse signal to reset set/reset flip flops 214 and 216.

Signals VDUP and VDDWN from AND circuits 220 and 222 are used instead of signals UP and DWN shown in FIG. 46. Shift control signals Tϕ1–Tϕ4 for a shift operation are generated for coarse adjust bi-directional shift register CSR. Accordingly, the delay stage of coarse adjust bi-directional shift register CSR can be shifted by one stage when fine adjust bi-directional shift register FSR overflows/underflows.

According to the seventh embodiment of the present invention, the advantages set forth in the following can be achieved.

The timing error between external clock signal CLKE and internal clock signal CLKI exceeding the correctable range of the fine adjust circuit can be corrected by shifting the delay stage of the coarse adjust circuit by one stage.

In the event of operating at the upper limit and lower limit of the operating frequency determined by the delay time of forward delay array FDA and backward delay array BDA in the coarse adjust circuit (frequency determination circuit), timing error can be corrected by adjusting the number of delay stages of the variable coarse adjust delay circuit even when the timing error between the external clock signal and the internal clock signal exceeds the correctable range of the fine adjust circuit due to variation in the operating environment (variation in the power supply voltage or noise generation). Thus, the forward delay array and the backward delay array can be utilized effectively.

Also, the delay time of unit delay circuits FDAE and BDAE in forward and backward delay arrays FDA and BDA can be set to an integer multiple of the delay time of unit delay circuit CDEi of variable coarse delay adjust circuit VCTD. In this case with the circuit complexity (the number of delay circuit stages) of coarse delay adjust circuit CTD reduced, an internal clock having a small timing error with respect to the external clock signal can be generated. More specifically, although the delay time of unit delay circuits FDAE and BDAE in forward and backward delay arrays FDA and BDA must be set equal to each other, the delay time of unit delay circuit CDEi of variable coarse delay adjust circuit VCTD does not have to be equal to the delay time of unit delay circuits FDAEi and BDAEi. The delay time can be set appropriately according to the circuit complexity.

Furthermore, the number of stages of the delay circuits in forward delay array FDA and backward delay array BDA can be reduced since fine adjustment can be carried out by the delay circuit common to both the forward and backward delay arrays. Therefore, the circuit complexity can be reduced.

Other Applications

In the above description, the clock reproduction circuit reproduces an internal clock signal for a synchronous DRAM (SDRAM) operating in synchronization with a clock signal. The present invention is applicable to any circuit device that operate in synchronization with a clock signal. A memory device is not limited to a DRAM, and the present invention can be applied to a synchronous SRAM (static random access memory) that operates in synchronization with a clock signal, or a non-volatile memory.

The present invention is also applicable to a clock buffer receiving a clock signal or a repeater element that waveform-shapes and amplifies a clock signal for transmission since the operating power source can be cut off.

The present invention is also applicable to any portion in a semiconductor device which is desired to have power consumption reduced in a power down mode.

According to the present invention, an internal clock signal phase-locking with an external clock signal can be generated speedily even when the power supply voltage varies/changes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor integrated circuit device comprising:
   a clock generation circuit receiving a base clock signal and generating an internal clock signal in synchronization with the base clock signal;
   a clock power supply circuit coupled to said clock generation circuit, for supplying an operating power supply voltage to said clock generation circuit;
   an internal power supply, separate from said clock power supply circuit, for generating a power supply voltage; and
   internal circuitry for carrying out a function, said internal circuitry including a peripheral circuit, receiving the power supply voltage from said internal power supply circuit as an operating power supply voltages for operating in synchronization with the internal clock signal.

2. The synchronous semiconductor integrated circuit device according to claim 1, further comprising:
   an initialization signal generation circuit for rendering an initialization signal active in response to activation of a clock enable signal activating said clock generation circuit; and
   a delay circuit for delaying said initialization signal,
   wherein said clock power supply circuit includes a circuit rendered active in response to activation of the clock enable signal for generating the operating power supply voltage for said clock generation circuit, and
   said clock generation circuit is initialized in response to the initialization signal and rendered active in response to activation of the clock enable signal and to activation of an output signal from said delay circuit to generate the internal clock signal.

3. The synchronous semiconductor integrated circuit device according to claim 1, wherein said clock generation circuit comprises
   a synchronization circuit for establishing synchronization between the base clock signal and the internal clock signal, and
   a buffer circuit group including a buffer circuit for applying a signal to said synchronization circuit and a buffer circuit for transferring a signal from said synchronization circuit,
   wherein said synchronization circuit receives the power supply voltage from said clock power supply circuit as an operating power supply voltage, and
   said buffer circuit group receives the power supply voltage from said internal power supply circuit as an operating power supply voltage.

4. The synchronous semiconductor integrated circuit device according to claim 1, further comprising an initialization signal generation circuit generating an initialization signal in response to rise of the operating power supply voltage from said clock power supply circuit,
   wherein said clock generation circuit is reset to an initial state in response to the initialization signal.

5. The synchronous semiconductor integrated circuit device according to claim 4 further comprising a delay circuit for delaying the initialization signal,
   wherein said clock generation circuit is rendered active in response to activation of an output signal of said delay circuit and activation of a clock enable signal to generate the internal clock signal.

6. The synchronous semiconductor integrated circuit device according to claim 1, wherein said clock generation circuit comprises:
   a frequency determination circuit receiving the power supply voltage from said clock power supply circuit as an operating power supply voltage to generate a coarse adjust clock signal approximating in at least one of frequency and phase the base clock signal, and
   a fine adjust circuit receiving the power supply voltage from said clock power supply circuit as an operating power supply voltage, and receiving the coarse adjust clock signal from said frequency determination circuit to adjust phase of the coarse adjust clock signal according to comparison between the base clock signal and the internal clock signal, for generating a fine adjust clock signal synchronized with the base clock signal for output as the internal clock signal.

7. The synchronous semiconductor integrated circuit device according to claim 6, wherein said fine adjust circuit is located at a midpoint between a circuit that operates in synchronization with said internal clock signal and said frequency determination circuit, so that a signal propagation delay time between said fine adjust circuit and said internal circuit is substantially equal to a signal propagation delay time between said frequency determination circuit and said fine adjust circuit.

8. The synchronous semiconductor integrated circuit device according to claim 6, further comprising a circuit for making a determination of completion of phase adjustment by phase comparison between the base clock signal and the internal clock signal to render said fine adjust circuit active according to the determination.

9. The synchronous semiconductor integrated circuit device according to claim 1, wherein
   said clock generation circuit is rendered active in response to activation of a clock enable signal to generate the internal clock signal, and
   the clock power supply circuit generates the operating power supply voltage for said clock generation circuit in response to activation of said clock enable signal.

10. The synchronous semiconductor integrated circuit device according to claim 9, further comprising a circuit responsive to inactivation of the clock enable signal for setting a substrate bias of an insulated gate field effect transistor of said clock generation circuit a reversed bias state.

11. The synchronous semiconductor integrated circuit device according to claim 9, wherein said clock generation circuit comprises:
    a phase difference retain circuit for detecting a phase difference between the base clock signal and the internal clock signal to retain the phase difference as a multi-bit binary value,
    a current decoder for generating a current flow according to the multi-bit binary value of said phase difference retain circuit, and
    an oscillator having an operating power supply current determined by the current flow from said current decoder for oscillation to generate a signal corresponding to the internal clock signal, wherein said synchronous integrated circuit device further comprises an auxiliary store circuit for receiving and storing the multi-bit binary value retained in said phase difference retain circuit in response to inactivation of the clock enable signal, and for transferring to said phase difference retain circuit the stored multi-bit binary value in response to activation of the clock enable signal, said auxiliary store circuit receiving the power supply voltage from said internal power supply circuit as an operating power supply voltage.

12. The synchronous semiconductor integrated circuit device according to claim 11, wherein
said auxiliary store circuit includes as a component a first insulated gate field effect transistor having a threshold voltage, and
said clock generation circuit includes as a component a second insulated gate field effect transistor having a threshold voltage smaller in absolute value than the threshold voltage of said first insulated gate field effect transistor.

13. The synchronous semiconductor integrated circuit device according to claim 1, wherein said clock generation circuit comprises:
a clock input buffer buffering an external clock signal, the base clock signal, and generating a reference clock signal,
a first dummy delay buffer for delaying the reference clock signal from said clock input buffer,
a first delay circuit including a plurality of cascaded delay stages, for delaying an output signal of said first dummy delay buffer,
a gate circuit responsive to a sampling signal for passing the reference clock signal to generate a sample clock signal,
a tap circuit for selecting a clock signal output from a particular delay stage of said first delay circuit according to a comparison between the sample clock signal from said gate circuit and a clock signal output from each delay stage of said first delay circuit,
a second delay circuit for delaying an output signal of said tap circuit,
a second dummy delay buffer for receiving and buffering a clock signal output from said second delay circuit,
a third delay circuit for delaying an output signal from said second dummy delay buffer, said third delay circuit including a plurality of cascaded delay stages, a maximum delay time of said third delay circuit corresponding to a delay time of one delay stage of said first delay circuit,
a clock tree receiving an output signal from said third delay circuit to distribute the output signal as the internal clock signal to said internal circuitry,
a phase difference detection circuit for detecting a difference in phase between the internal clock signal output from said clock tree and the reference clock signal,
a fine tap set circuit for setting a delay time of said third delay circuit according to an output signal of said phase difference detection circuit, and
a tap determination circuit for generating a tap adjust signal when the delay time set by said fine tap set circuit provides a transition between the maximum delay time and a minimum delay time of said third delay circuit, wherein said tap circuit comprises a circuit for shifting a selected delay stage in said first delay circuit by one stage in response to the tap adjust signal.

14. The synchronous semiconductor integrated circuit device according to claim 13, wherein the second and third delay circuits and said clock tree are arranged so that a signal propagation delay time from an output portion of said second delay circuit to an input portion of said third delay circuit is equal to a signal propagation delay time from an output portion of said third delay circuit to an output portion of said clock tree.

15. The synchronous semiconductor integrated circuit device according to claim 13, further comprising a third dummy delay buffer having a gate delay time identical to a gate delay time of said first dummy delay buffer, and provided at an output portion of said third delay circuit to buffer an output signal from said third delay circuit for application to said clock tree.

16. The synchronous semiconductor integrated circuit device according to claim 13, wherein said fine tap set circuit comprises a bi-directional shift register including stages identical in number with said delay stages of said third delay circuit, and a shift operation of said bi-directional shift register is controlled by an output signal from said phase difference detection circuit, and a delay stage of said third delay circuit is selected by an output signal of each stage of said bi-directional shift register.

17. The synchronous semiconductor integrated circuit device according to claim 13, further comprising:
a circuit for making a determination of completion of phase adjustment by phase comparison between the reference clock signal and the internal clock signal to render said fine adjust circuit active according to the determination; and
a circuit responsive to activation of a signal indicating the phase adjustment completion determination for maintaining the sampling signal in an inactive state.

18. The synchronous semiconductor integrated circuit device according to claim 13, wherein said first, second, third delay circuits, said tap circuit, said phase difference detection circuit and said tap determination circuit operate receiving the power supply voltage from said clock power supply circuit as an operating power supply voltage, and said clock input buffer, said first and second dummy delay circuits and said clock tree receive the power supply voltage from said internal power supply circuit as an operating power supply voltage.

19. The synchronous semiconductor integrated circuit device according to claim 18, wherein the first and second dummy delay buffers and said clock tree are rendered inactive when a clock enable signal designating generation of the internal clock signal is inactive, and said clock power supply circuit is rendered inactive when the clock enable signal is inactive, to stop generation of said power supply voltage.

20. The synchronous semiconductor integrated circuit device according to claim 13, further comprising a replica buffer having a gate delay time identical to a gate delay time of said first dummy delay buffer, for buffering the internal clock signal from said clock tree for transmission to said phase difference detection circuit,
wherein a signal propagation delay time from an output portion of said clock tree up to an input portion of said phase difference detection circuit via said replica buffer is equal to a signal propagation delay time from an output portion of said clock input buffer up to an input portion of said phase difference detection circuit.

21. The synchronous semiconductor integrated circuit device according to claim 20, wherein said replica buffer receives the power supply voltage from said internal power supply circuit as an operating power supply voltage.

22. The synchronous semiconductor integrated circuit device according to claim 21, wherein said replica buffer, said first and second dummy delay buffers, and said clock tree are rendered inactive in response to inactivation of a clock enable signal designating generation of the internal clock signal, and said clock power supply circuit is rendered inactive in response to inactivation of the clock enable signal.

23. A synchronous semiconductor integrated circuit device comprising:

a clock generation circuit for generating an internal clock signal in synchronization with a base clock signal, said clock generation circuit comprising:

(i) a coarse adjust circuit including a plurality of cascaded first delay elements for delaying the base clock signal, for comparison of output signals of said plurality of first delay elements with a reference clock signal corresponding to the base clock signal to generate a coarse clock signal at a first precision according to the comparison, and (ii) a fine adjust circuit including a plurality of cascaded second delay elements, for comparison of the reference clock signal with the internal clock signal to adjust phase of the coarse adjust clock signal at a second precision, finer than the first precision, according to the comparison, a maximum variable delay time of said plurality of second delay elements corresponding to a delay time of one stage of said first delay elements, said fine adjust circuit including a circuit for shifting phase of the coarse adjust clock signal of said coarse adjust circuit by one stage of said first delay elements when a phase adjust exceeds a processing range of said plurality of second delay elements; and an internal circuit carrying out a predetermined operation in synchronization with the internal clock signal.

24. The synchronous semiconductor integrated circuit device according to claim 23, wherein said coarse adjust circuit comprises:

a first clock input buffer responsive to activation of a clock enable signal for transmitting a first reference clock signal to a train of said plurality of first delay elements, and rendered inactive from a next cycle onward, and a second clock input buffer responsive to activation of the clock enable signal for receiving the first reference clock signal and a second reference clock signal for the phase comparison, and rendered inactive thereafter, wherein said fine adjust circuit comprises a circuit rendered active at a clock cycle of the reference clock signal after an output signal of said coarse adjust circuit is stabilized to receive the reference clock signal and the internal clock signal for phase comparison.

25. The synchronous semiconductor integrated circuit device according to claim 23, wherein said coarse adjust circuit comprises:

a circuit for detecting completion of coarse adjustment of said coarse adjust circuit, and a circuit for stopping the coarse adjustment to generation a clock signal in synchronization with the reference clock signal in the coarse adjustment when completion of coarse adjustment is detected, a fine adjust operation of said fine adjust circuit being rendered active in response to a signal indicating detection of completion of the coarse adjustment.

26. The synchronous semiconductor integrated circuit device according to claim 23, wherein said fine adjust circuit is located at an intermediate position between an output portion of said coarse adjust circuit and said internal circuit.

27. The synchronous semiconductor integrated circuit device according to claim 23, wherein said coarse adjust circuit includes a delay monitor for compensating for a difference in signal propagation delay between the internal clock signal and the base clock signal.

28. The synchronous semiconductor integrated circuit device according to claim 27, wherein said delay monitor comprises a delay stage providing a delay time equal to an initialized delay time of said coarse adjust circuit and said fine adjust circuit.

29. The synchronous semiconductor integrated circuit device according to claim 23, further comprising:

an internal circuit power supply circuit for supplying an operating power supply voltage to said internal circuit; and a clock power supply circuit separate from said internal circuit power supply circuit for supplying an operating power supply voltage to said clock generation circuit.

30. The synchronous semiconductor integrated circuit device according to claim 29, wherein said clock generation circuit is rendered active when a clock enable signal is active, to generate the internal clock signal, and said clock power supply circuit is rendered active, in response to activation of the clock enable signal to generate the operating power supply voltage to said clock generation circuit.

31. The synchronous semiconductor integrated circuit device according to claim 23, wherein said fine adjust circuit comprises:

a fine adjust circuit including said plurality of second delay elements, for receiving the coarse adjust clock signal to generate the internal clock signal, a phase comparison circuit for comparison of phases of the reference clock signal and the internal clock signal, and a delay set circuit for adjusting a delay time of said fine adjust delay circuit according to the comparison of said phase comparison circuit, said delay set circuit including a circuit for shifting by one stage the delay of said first delay elements of said coarse adjust circuit when a phase difference detected by said phase comparison circuit exceeds an adjustable range of said fine adjust delay circuit.

32. The synchronous semiconductor integrated circuit device according to claim 31, wherein said delay set circuit comprises a fine adjust bi-directional shift register responsive to a phase lead/lag designating signal from said phase comparison circuit for shifting an output signal thereof bi-directionally, and a coarse adjust bi-directional shift register responsive to transition of an active output signal of said fine adjust bi-directional shift register between a last stage register and a first stage register in said fine adjust bi-directional shift register for shifting an output signal thereof, wherein a delay time of said fine adjust circuit is set according to an output signal of said fine adjust bi-directional shift register, and a delay time of said coarse adjust delay circuit is adjusted according to an output signal of said coarse adjust bi-directional shift register.

33. The synchronous semiconductor integrated circuit device according to claim 31, wherein said fine adjust delay circuit comprises an inverter having an operating current adjusted stepwise according to an output signal of said delay set circuit.

34. The synchronous semiconductor integrated circuit device according to claim 31, wherein said fine adjust delay circuit comprises a first inverter having an operating current varied stepwise over m stages, and a second inverter coupled in series to said first inverter, and having an operating current varied stepwise over m stages.

35. The synchronous semiconductor integrated circuit device according to claim 31, wherein a phase comparison between the internal clock signal and the reference clock signal and a delay time setting by said delay set circuit are carried out at alternate cycles of the reference clock signal.

36. The synchronous semiconductor integrated circuit device according to claim 31, wherein said phase comparison circuit comprises:

a first delay circuit for delaying the reference clock signal, second and third delay circuits, each of said second and third delay circuits for delaying the internal clock signal, a first flip-flop receiving output signals of said first and second delay circuits, a second flip-flop receiving output signals of the first and third delay circuits, and latch circuits for latching respective output signals of said first and second flip-flops, wherein each of said first, second, and third delay circuits includes a delay stage having a delay time equal to the delay time of one stage of said first delay element of said coarse adjust circuit.

37. The synchronous semiconductor integrated circuit device according to claim 36, wherein each of said latch circuits includes a first gate, a first latch delay element receiving an output signal of said first gate, a second gate, and a second latch delay element receiving an output signal of said second gate, said first gate receiving an output signal of said second latch delay element and a first output signal of a corresponding one of said flip flops, said second gate receiving an output signal of said first latch delay element and a second output signal of said corresponding one of said flip flops.

* * * * *

UNITED STATES PATENT AND TRADEMARK OFFICE
CERTIFICATE OF CORRECTION

PATENT NO. : 6,166,990
DATED : December 26, 2000
INVENTOR(S) : Ooishi et al.

It is certified that error appears in the above-identified patent and that said Letters Patent is hereby corrected as shown below:

Column 69,
Line 10, after "supply" insert -- circuit --.

Column 70,
Line 17, change "a" to -- an internal --;
Line 37, chagne "said" to -- the --;
Line 58, after "nous" insert -- semiconductor --.

Column 73,
Line 9, after "coarse" insert -- adjust --;
Lines 19-20, delete "including a circuit for";
Line 50, change "generation" to -- generate --.

Column 74,
Lines 20-21, delete "to said clock generation circuit";
Line 25, after "adjust" insert -- delay --;
Line 55, delete "delay".

Signed and Sealed this

Twenty-sixth Day of March, 2002

Attest:

Attesting Officer

JAMES E. ROGAN
Director of the United States Patent and Trademark Office